US012690282B2

(12) United States Patent
Lee et al.

(10) Patent No.: US 12,690,282 B2
(45) Date of Patent: Jul. 21, 2026

(54) IMAGE SENSOR AND ELECTRONIC APPARATUS INCLUDING THE IMAGE SENSOR

(71) Applicant: SAMSUNG ELECTRONICS CO., LTD., Suwon-si (KR)

(72) Inventors: Junho Lee, Suwon-si (KR); Sookyoung Roh, Suwon-si (KR); Sangeun Mun, Suwon-si (KR); Seokho Yun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 458 days.

(21) Appl. No.: 18/210,946

(22) Filed: Jun. 16, 2023

(65) Prior Publication Data

US 2023/0420480 A1      Dec. 28, 2023

(30) Foreign Application Priority Data

Jun. 28, 2022      (KR) ......................... 10-2022-0079277

(51) Int. Cl.
H10F 39/18              (2025.01)
H10F 30/223            (2025.01)
(Continued)

(52) U.S. Cl.
CPC ......... H10F 39/182 (2025.01); H10F 30/223 (2025.01); H10F 39/806 (2025.01); H10F 77/147 (2025.01)

(58) Field of Classification Search
CPC .... H10F 39/182; H10F 30/223; H10F 39/806; H10F 77/147; H10F 39/8063;
(Continued)

(56) References Cited

U.S. PATENT DOCUMENTS 7,202,896 B2      4/2007  Wako et al.
8,076,745 B2    12/2011  Nishiwaki
(Continued)

FOREIGN PATENT DOCUMENTS

CN            109585342 A      4/2019
EP              4152397 A1      3/2023
(Continued)

OTHER PUBLICATIONS

Office Action issued on Oct. 17, 2023 by the Korean Patent Office in corresponding KR Patent Application No. 10-2022-0079277.
(Continued)

*Primary Examiner* — Yasser A Abdelaziez
(74) *Attorney, Agent, or Firm* — Sughrue Mion, PLLC

(57) ABSTRACT

An image sensor may include a pixel array including a plurality of two-dimensionally arranged pixels. Each pixel may include a first meta-photodiode absorbing light of a first wavelength band; a second meta-photodiode absorbing light in a second wavelength band; and a third meta-photodiode absorbing light of a third wavelength band, wherein the first meta-photodiode, the second meta-photodiode, and the third meta-photodiode may be arranged in an area having a size less than a diffraction limit. The arrangement form of the first meta-photodiode, the second meta-photodiode, and the third meta-photodiode arranged in the plurality of pixels in a central portion of the pixel array may be the same as the arrangement form of the first meta-photodiode, the second meta-photodiode, and the third meta-photodiode arranged in the plurality of pixels in a periphery of the pixel array.

19 Claims, 49 Drawing Sheets

(51) Int. Cl.
　　　*H10F 39/00*　　　(2025.01)
　　　*H10F 77/14*　　　(2025.01)
(58) Field of Classification Search
　　　CPC .... H10F 39/80; H10F 39/8027; H10F 39/802;
　　　　　　　　　　　　　　　　　　　　　H10F 39/18
　　　See application file for complete search history.

(56)　　　　　　　References Cited

U.S. PATENT DOCUMENTS

| | | | |
|---|---|---|---|
| 9,673,236 | B2 | 6/2017 | Jin et al. |
| 9,860,491 | B2 | 1/2018 | Park et al. |
| 10,418,510 | B1 | 9/2019 | Oyer et al. |
| 10,483,414 | B2 | 11/2019 | Han et al. |
| 10,976,472 | B2 * | 4/2021 | Lee ..................... C23C 14/0617 |
| 2012/0153124 | A1 | 6/2012 | Yu et al. |
| 2015/0214261 | A1 * | 7/2015 | Park ...................... H10F 39/182 |
| | | | 977/932 |
| 2016/0240580 | A1 | 8/2016 | Xianyu et al. |
| 2018/0292585 | A1 * | 10/2018 | Yun ........................ G02B 5/201 |
| 2020/0350481 | A1 | 11/2020 | Jeon et al. |
| 2021/0057607 | A1 | 2/2021 | Lin et al. |
| 2021/0066370 | A1 | 3/2021 | Cho et al. |
| 2021/0124179 | A1 | 4/2021 | Yun et al. |
| 2021/0126030 | A1 | 4/2021 | Yun et al. |
| 2021/0126035 | A1 * | 4/2021 | Roh ........................ G02B 1/002 |
| 2021/0126142 | A1 * | 4/2021 | Lee ...................... H10F 77/147 |

| | | | |
|---|---|---|---|
| 2022/0137424 | A1 | 5/2022 | Lee et al. |
| 2022/0150453 | A1 | 5/2022 | Lee et al. |
| 2022/0223751 | A1 | 7/2022 | Lee et al. |
| 2023/0020980 | A1 | 1/2023 | Mun et al. |
| 2023/0084394 | A1 | 3/2023 | Lee et al. |
| 2023/0246044 | A1 | 8/2023 | Yun et al. |
| 2023/0378210 | A1 | 11/2023 | Miyata et al. |

FOREIGN PATENT DOCUMENTS

| | | |
|---|---|---|
| KR | 10-2016-0099386 A | 8/2016 |
| KR | 10-1772968 B1 | 8/2017 |
| KR | 10-2021-0048953 A | 5/2021 |
| KR | 10-2022-0063575 A | 5/2022 |
| KR | 10-2023-0012366 A | 1/2023 |
| KR | 10-2023-0040182 A | 3/2023 |
| KR | 10-2023-0116555 A | 8/2023 |
| WO | 2022/079766 A1 | 4/2022 |

OTHER PUBLICATIONS

European Extended Search Report issued Oct. 30, 2023 issued by the European Patent Office for EP Patent Application No. 23180532. 6.
Communication issued on Dec. 1, 2025 by the European Patent Office in European Patent Application No. 23180532.6.

\* cited by examiner

| | Example Embodiment 1 | | | | | | Example Embodiment 2 | | | |
|---|---|---|---|---|---|---|---|---|---|---|
| D.R (nm) | 120 | 120 | 120 | 120 | 120 | 120 | 136 | 136 | 136 | 136 |
| D.G (nm) | 90 | 90 | 90 | 90 | 90 | 90 | 122 | 122 | 122 | 122 |
| D.B (nm) | 70 | 70 | 70 | 70 | 70 | 70 | 104 | 104 | 104 | 104 |
| Spacing (nm) | 150 | 150 | 180 | 180 | 220 | 220 | 150 | 150 | 220 | 220 |
| CRA | 0 | 30 | 0 | 30 | 0 | 30 | 0 | 30 | 0 | 30 |
| R Sum | | 1.12 | | 0.93 | | 0.98 | | 1.00 | | 1.09 |
| G Sum | | 0.89 | | 0.85 | | 0.78 | | 1.01 | | 0.98 |
| B Sum | | 1.04 | | 1.15 | | 1.28 | | 1.11 | | 0.92 |

[Security]                                    1800

1900

2000

2100

2120

2110        2130        2140

IMAGE SENSOR AND ELECTRONIC APPARATUS INCLUDING THE IMAGE SENSOR

CROSS-REFERENCE TO RELATED APPLICATION

This application is based on and claims priority under 35 U.S.C. § 119 to Korean Patent Application No. 10-2022-0079277, filed on Jun. 28, 2022, in the Korean Intellectual Property Office, the disclosure of which is incorporated by reference herein in its entirety.

BACKGROUND

1. Field

The disclosure relates to image sensors and electronic apparatuses including the image sensors.

2. Description of the Related Art

An image sensor generally senses a color of incident light using a color filter. However, because the color filter absorbs light of a color other than light of a corresponding color, the efficiency of light utilization may be reduced. For example, when an RGB color filter is used, because the RGB color filter transmits only ⅓ of incident light and absorbs the remaining ⅔ of the incident light, the light utilization efficiency is only about 33%. As such, most of the light loss of an image sensor may be caused by the color filter. Accordingly, a method of separating a color into each pixel of an image sensor without using a color filter has been attempted.

On the other hand, as the demand for higher resolutions increases, pixel sizes are gradually getting smaller, which may limit a color separation function. In addition, in a color separation method, energy entering a unit pixel is divided and absorbed by R, G, and B effective areas, thus, each sub-pixel is in charge of one color, and due to under-sampling that is basically present in a signal processing process, resolution degradation may occur. Accordingly, a method of implementing a full color pixel suitable for realizing a high resolution is being sought.

SUMMARY

Provided are image sensors having full color pixels and an electronic apparatuses including the image sensors.

Also, provided are image sensors having substantially uniform absorption spectra at a central portion and a periphery having different chief ray angles of incident light, and electronic apparatuses including the image sensors.

Additional aspects will be set forth in part in the description which follows and, in part, will be apparent from the description, or may be learned by practice of the presented embodiments of the disclosure.

According to an aspect of the disclosure, there is provided an image sensor including: a pixel array including a plurality of two-dimensionally arranged pixels, wherein each of the plurality of pixels comprises: a first meta-photodiode configured to selectively absorb light of a first wavelength band; a second meta-photodiode configured to selectively absorb light of a second wavelength band different from the first wavelength band; and a third meta-photodiode configured to selectively absorb light of a third wavelength band different from the first wavelength band and second wavelength band, wherein, the first meta-photodiode, the second meta-photodiode, and the third meta-photodiode are arranged in an area having a size equal to or less than a diffraction limit, wherein the first meta-photodiode, the second meta-photodiode, and the third meta-photodiode of one or more first pixels in a central portion of the pixel array, among the plurality of pixels, are arranged in a same form as the first meta-photodiode, the second meta-photodiode, and the third meta-photodiode of one or more second pixels in a periphery of the pixel array, among the plurality of pixels.

In the central portion and the periphery of the pixel array, the first meta-photodiodes arranged in the plurality of pixels may have a same first structure, the second meta-photodiodes may have a same second structure, and the third meta-photodiodes may have a same third structure.

In each of the plurality of pixels, the following condition may be satisfied: W/2+40 nm>S, where S is a spacing between two meta-photodiodes adjacent in a first direction among the first meta-photodiode, the second meta-photodiode, and the third meta-photodiode and W is a sum of widths of the two adjacent meta-photodiodes.

In each of the plurality of pixels, a spacing between two meta-photodiodes adjacent in the first direction among the first meta-photodiode, the second meta-photodiode, and the third meta-photodiode may be about 150 nm or less, and is at least ½ of a sum of widths of the two adjacent meta-photodiodes.

In each of the plurality of pixels, a spacing between two meta-photodiodes adjacent in the first direction among the first meta-photodiode, the second meta-photodiode, and the third meta-photodiode may be ⅓ or less of the diffraction limit.

The central portion of the pixel array is a first area in which incident light may be vertically incident, and the periphery of the pixel array surrounds the central portion and is a second area in which incident light may be obliquely incident.

The pixel array may further include: an optical plate arranged to face light incident surfaces of the plurality of pixels and configured to change a traveling direction of incident light to be perpendicular to the light incident surfaces of the plurality of pixels.

The optical plate may include a digital micro-lens array or a digital deflector.

Each of the first meta-photodiode, the second meta-photodiode, and the third meta-photodiode may have a rod-shape may include: a first conductivity-type semiconductor layer, an intrinsic semiconductor layer stacked on the first conductivity-type semiconductor layer, and a second conductivity-type semiconductor layer stacked on the intrinsic semiconductor layer, and wherein the first meta-photodiode, the second meta-photodiode, and the third meta-photodiode respectively may have a first width, a second width, and a third width different from each other in a direction perpendicular to a stacking direction.

The first width, the second width, and the third width may be about 50 nm to about 200 nm.

The first wavelength band may be greater than the second wavelength band, and the second wavelength band may be greater than the third wavelength band, and wherein the first width may be greater than the second width, and the second width is greater than the third width.

Heights of the first meta-photodiode, the second meta-photodiode, and the third meta-photodiode in the stacking direction may be about 500 nm or more The heights of the first meta-photodiode, the second meta-photodiode, and the third meta-photodiode in the stacking direction are same as each other.

Each of the plurality of pixels may have a width of about 250 nm to about 450 nm.

Each of the plurality of pixels may include one of the first meta-photodiode, one of the second meta-photodiode, and two of the third meta-photodiode, and wherein the first meta-photodiode and the second meta-photodiode are provided in a first diagonal direction, and the two third meta-photodiodes are provided in a second diagonal direction crossing the first diagonal direction.

A sum of the number of the first meta-photodiodes, the second meta-photodiodes, and the third meta-photodiodes arranged in each of the plurality of pixels is nine, and the nine meta-photodiodes are arranged in the form of a 3×3 array.

Each of the plurality of pixels may include one of the first meta-photodiodes, a plurality of the second meta-photodiodes, and a plurality of the third meta-photodiodes, and wherein the first meta-photodiode is located at the center of each of the plurality of pixels.

According to another aspect of the disclosure, there is provided an image sensor including: a pixel array including a plurality of two-dimensionally arranged pixels, wherein each of the plurality of pixels includes: a first meta-photodiode configured to selectively absorb light of a first wavelength band; a second meta-photodiode configured to selectively absorb light in a second wavelength band different from the first wavelength band; and a third meta-photodiode configured to selectively absorb light of a third wavelength band different from the first wavelength band and second wavelength band, wherein the first meta-photodiode, the second meta-photodiode, and the third meta-photodiode are arranged in an area having a size less than a diffraction limit, and wherein a spacing between two meta-photodiodes adjacent in a first direction among the first meta-photodiode, the second meta-photodiode, and the third meta-photodiode is about 150 nm or less, and the spacing is at least ½ of a sum of widths of the two adjacent meta-photodiodes.

In an entire area of the pixel array, the first meta-photodiode, the second meta-photodiode, and the third meta-photodiode arranged in each of the plurality of pixels have a same arrangement form.

According to another aspect of the disclosure, there is provided an electronic apparatus including: a lens assembly configured to form an optical image of an object; an image sensor configured to convert the optical image formed by the lens assembly into an electrical signal; and a processor configured to process a signal generated by the image sensor, wherein the image sensor includes a pixel array including a plurality of two-dimensionally arranged pixels, and each of the plurality of pixels includes: a first meta-photodiode configured to selectively absorb light of a first wavelength band; a second meta-photodiode configured to selectively absorb light of a second wavelength band different from the first wavelength band; and a third meta-photodiode configured to selectively absorb light of a third wavelength band different from the first wavelength band and second wavelength band, wherein, the first meta-photodiode, the second meta-photodiode, and the third meta-photodiode are arranged in an area having a size less than a diffraction limit, and wherein the first meta-photodiode, the second meta-photodiode, and the third meta-photodiode of one or more first pixels in a central portion of the pixel array, among the plurality of pixels, are arranged in a same form as the first meta-photodiode, the second meta-photodiode, and the third meta-photodiode of one or more of second pixels in a periphery of the pixel array, among the plurality of pixels.

According to another aspect of the disclosure, there is provided a pixel array including: one or more first pixels provided in a center region of the pixel array; and one or more second pixels provided in a peripheral region of the pixel array, wherein each of the one or more first pixels and the one or more second pixels including: a first meta-photodiode configured to selectively absorb light of a first wavelength band; a second meta-photodiode configured to selectively absorb light of a second wavelength band different from the first wavelength band; and a third meta-photodiode configured to selectively absorb light of a third wavelength band different from the first wavelength band and second wavelength band, wherein, the one or more first pixels and the one or more second pixels have a width equal to or less than a diffraction limit, and wherein the first meta-photodiode, the second meta-photodiode, and the third meta-photodiode of the one or more first pixels are arranged in a same form as the first meta-photodiode, the second meta-photodiode, and the third meta-photodiode of the one or more of second pixels.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 2 is a plan view showing a pixel arrangement of a pixel array of the image sensor of FIG. 1;

FIG. 7 is a table showing a comparison of color separation results according to a size of meta-photodiodes and a spacing between the meta-photodiodes with respect to different chief ray angles;

FIGS. 8A to 8C, 9A to 9C, 10A to 100, 11A to 110 and 12A to 12C are graphs showing changes in absorption spectra of blue light, green light, and red light according to a size of meta-photodiodes and a spacing between meta-photodiodes compared at different chief ray angles;

FIG. 17 shows a pixel arrangement of an image sensor according to a comparative example;

DETAILED DESCRIPTION

Figure 1:
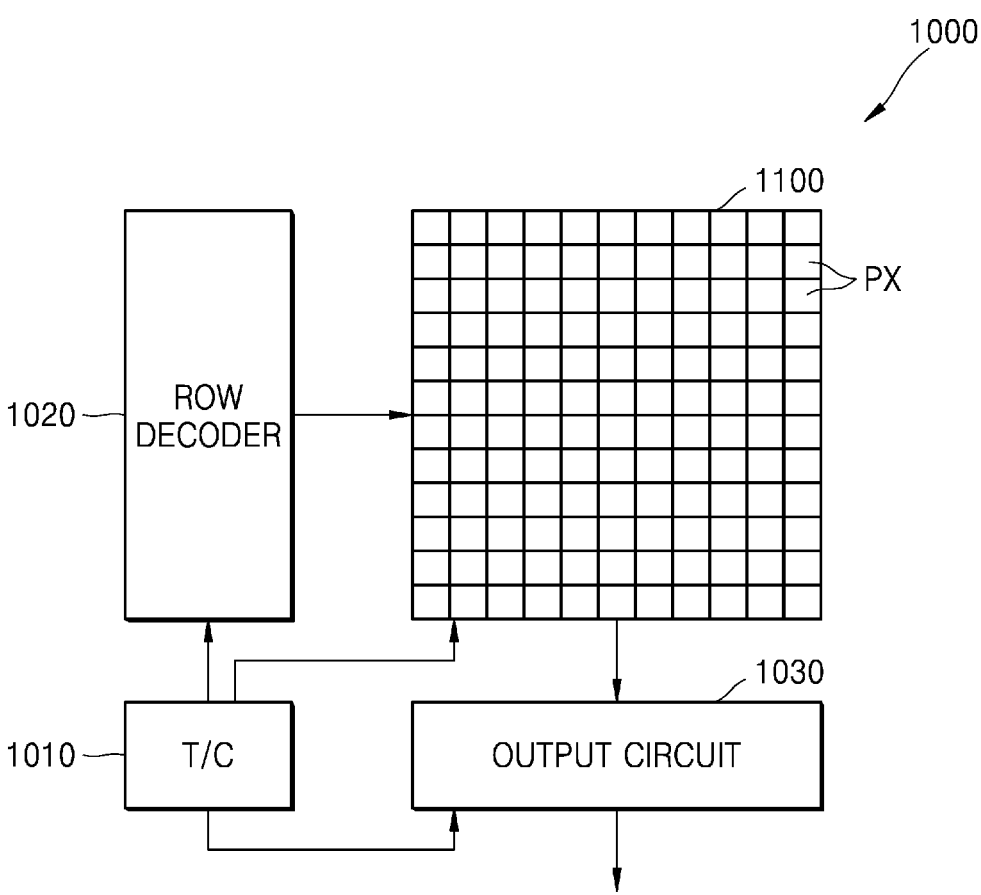
FIG. 1 is a block diagram of an image sensor according to an example embodiment.

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, image sensors and electronic apparatuses including the image sensors will described in detail with reference to the accompanying drawings. The example embodiments of the disclosure are capable of various modifications and may be embodied in many different forms. In the following drawings, like reference numerals refer to like elements, and the size of each component in the drawings may be exaggerated for clarity and convenience of description.

Hereinafter, when a position of an element is described using an expression "above" or "on", the position of the element may include not only the element being "immediately on/under/left/right in a contact manner" but also being "on/under/left/right in a non-contact manner".

Although the terms "first", "second", "third", etc., may be used herein to describe various elements, these terms are only used to distinguish one element from another. These terms do not limit the difference in the material or structure of the components.

The singular forms include the plural forms unless the context clearly indicates otherwise. When a part "com-prises" or "includes" an element in the specification, unless otherwise defined, it is not excluding other elements but may further include other elements.

Also, in the specification, the term "units" or " . . . modules" denote units or modules that process at least one function or operation, and may be realized by hardware, software, or a combination of hardware and software. For example, according to an example, "units" or " . . . modules" may be implemented by a processor, one or more electronic components and/or circuits.

The term "above" and similar directional terms may be applied to both singular and plural.

With respect to operations that constitute a method, the operations may be performed in any appropriate sequence unless the sequence of operations is clearly described or unless the context clearly indicates otherwise. Also, all example terms (for example, etc.) are simply used to explain in detail the technical scope of the disclosure, and thus, the scope of the disclosure is not limited by the examples or the example terms as long as it is not defined by the claims.

Figure 2:
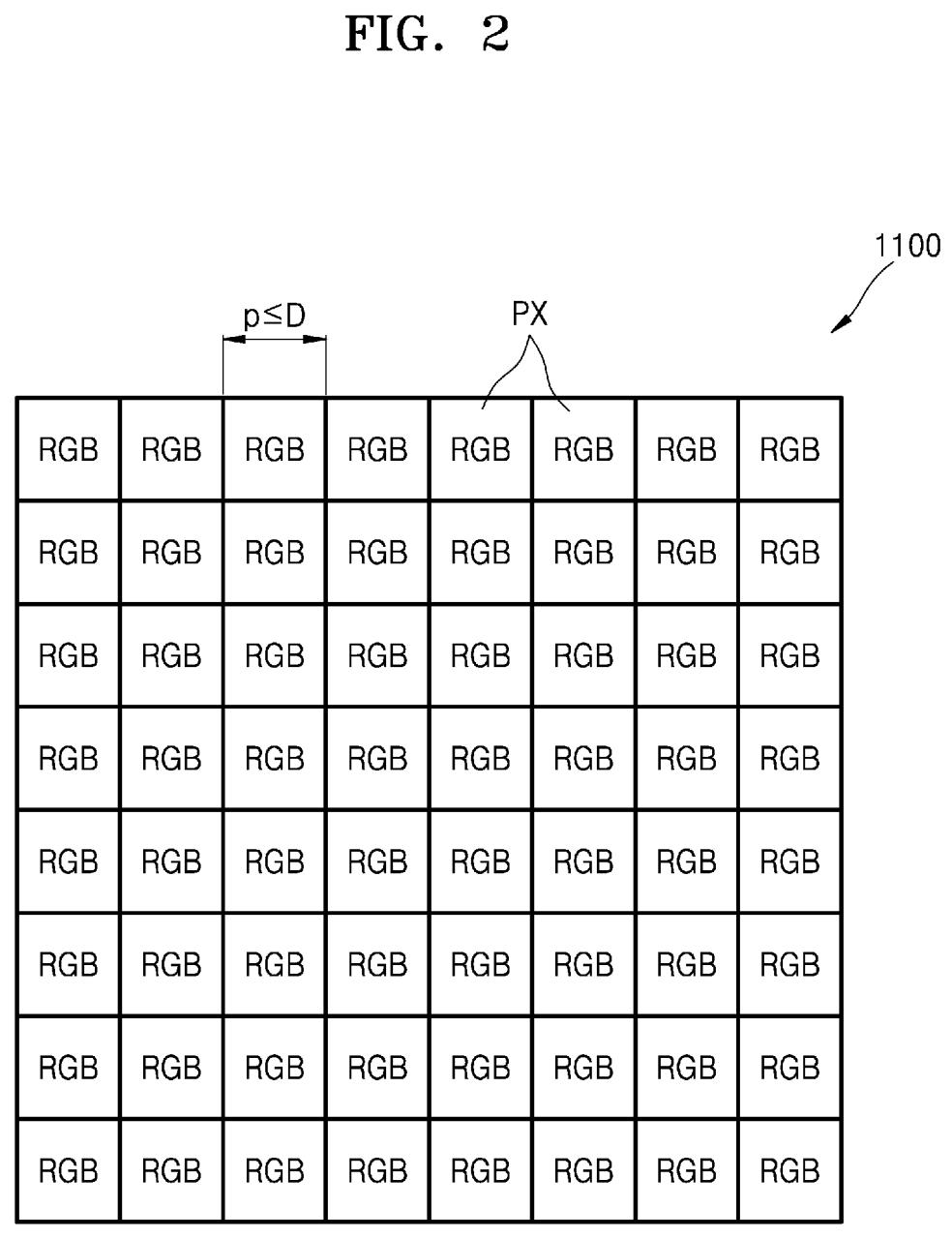

FIG. 1 is a block diagram of an image sensor 1000 according to an example embodiment, and FIG. 2 is a plan view showing a pixel arrangement of a pixel array 1100 of the image sensor 1000 of FIG. 1.

Referring to FIGS. 1 and 2, the image sensor 1000 may include the pixel array 1100, a timing controller (T/C) 1010, a row decoder 1020, and an output circuit 1030. The pixel array 1100 includes two-dimensionally arranged pixels PXs along a plurality of rows and columns. Each of the pixels PX may include a plurality of p-i-n meta-photodiodes. The plurality of p-i-n meta-photodiodes will be described in detail below with reference to FIG. 4.

The row decoder 1020 selects one row of the pixel array 1100 in response to a row address signal output from the timing controller 1010. The output circuit 1030 outputs a photo-sensing signal in column units from a plurality of pixels arranged along the selected row. To this end, the output circuit 1030 may include a column decoder and an analog-to-digital converter (ADC). For example, the output circuit 1030 may include a plurality of ADCs respectively provided for columns between the column decoder and the pixel array 1100, or one ADC provided at an output terminal of the column decoder. The timing controller 1010, the row decoder 1020, and the output circuit 1030 may be implemented as a single chip or as separate chips. A processor for processing an image signal output through the output circuit 1030 may be implemented as a single chip together with the timing controller 1010, the row decoder 1020, and the output circuit 1030.'

The plurality of pixels PX constituting the pixel array 1100 may be full-color pixels, each of which may sense an arbitrary color. That is, light incident on the pixel PX may be divided for each wavelength band, for example, amounts of a red light component, a green light component, and a blue light component may be differentiated and sensed. Accordingly, the loss of light of a specific color according to a color of a sub-pixel, which occurs in an image sensor having a color filter of the related art, does not occur in the image sensor 1000 according to the example embodiment. In other words, each color component of light incident on the pixel PX may be detected almost regardless of a position of a region within the pixel PX. In this regard, the pixel PX of the image sensor 1000 according to an example embodiment may be referred to as a full-color pixel or an RGB pixel in a sense of distinguishing from a red pixel, a green pixel, a blue pixel, etc., which recognize only specific colors.

As illustrated in FIG. 2, the pixels PX may be two-dimensionally arranged, and a width p of the pixel PX may have a size equal to or less than a diffraction limit D. Here, the width may denote a width in one direction defining a two-dimensional array, and the widths in both directions may be equal to or less than the diffraction limit D.

The diffraction limit D may denote a minimum size to which an object may be separated and imaged, and is expressed by the following equation:

$$D=\lambda/(2NA)=\lambda*F.$$

Here, $\lambda$ is a wavelength of incident light, and NA and F are numerical aperture and F-number of an imaging optical system (or lens assembly), respectively.

NA is defined as a sine value of a marginal ray angle in an imaging space, which may denote that the larger the NA, the larger the angular distribution of focused light. F-number is defined by a relation of 1/(2NA). According to a trend towards high resolution and miniaturization of imaging systems, the marginal ray angle tends to increase, and accordingly, modular lenses with a small F-number are being developed. When an ideal F-number that may be reduced is about 1.0, the diffraction limit D becomes $\lambda$.

Under this condition, based on the central wavelength of blue light, the diffraction limit D may be expressed as, for example, about 450 nm. That is, each pixel PX constituting the pixel array 1100 may have a size of about 450 nm×450 nm or less. However, this dimension is an example, and a specific size may vary according to the imaging optical system provided together. As such, according to another example embodiment, the diffraction limit D may be different from 450 nm.

A minimum width of the pixel PX may be set according to the size and number of meta-photodiodes provided in the pixel PX, which are described later. The width of the pixel PX may be, for example, about 250 nm or more, or about 300 nm or more, but is not limited thereto.

Figure 3:
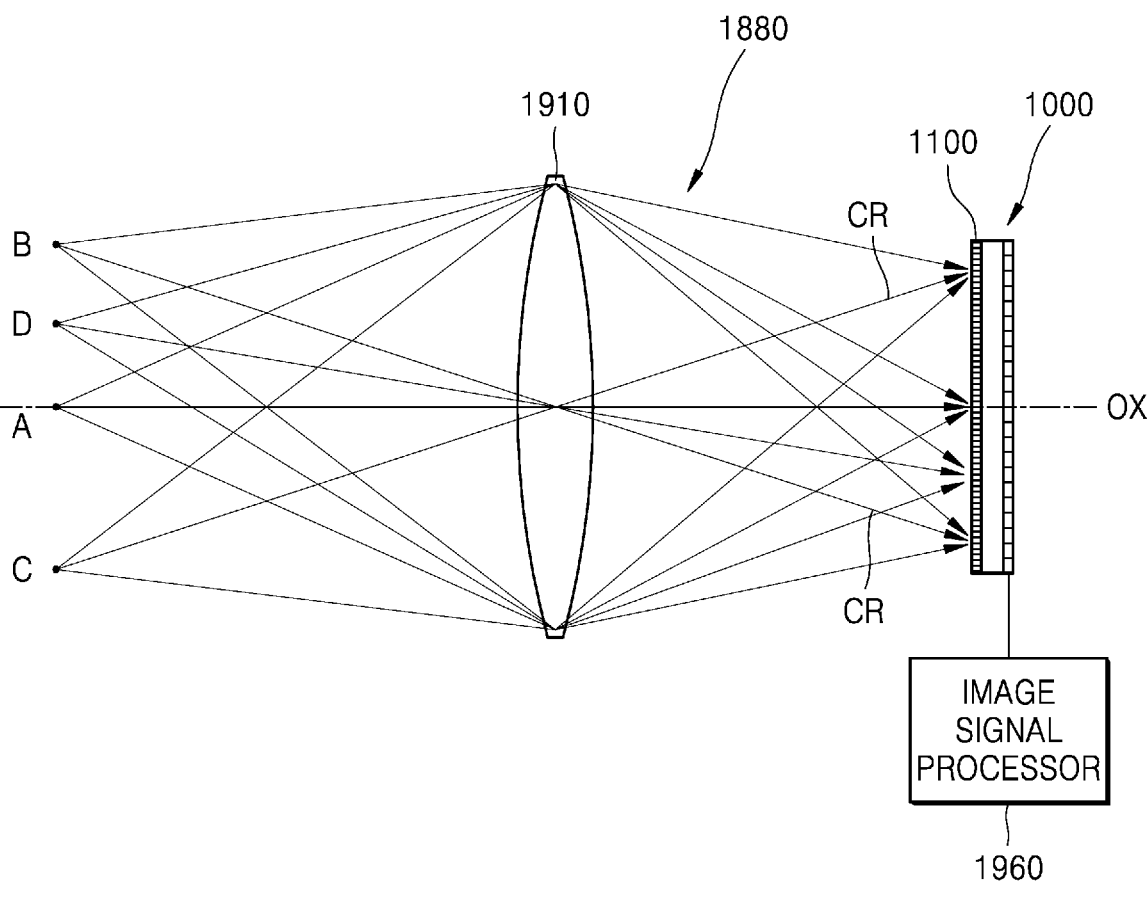
FIG. 3 is a conceptual diagram schematically illustrating a camera module including the image sensor of FIG. 1.

The image sensor 1000 described above may be applied to various optical apparatuses such as a camera module. For example, FIG. 3 is a conceptual diagram schematically illustrating a camera module 1880 including the image sensor 1000 of FIG. 1. According to an example embodiment, the camera module may include one or more hardware components assembled to capture an image.

Referring to FIG. 3, the camera module 1880 may include a lens assembly 1910 configured to form an optical image by focusing light reflected from an object, and the image sensor 1000 configured to convert the optical image formed by the lens assembly 1910 into an electrical image signal, and an image signal processor 1960 configured to process an electrical signal output from the image sensor 1000 into an image signal. The camera module 1880 may also include an infrared blocking filter provided between the image sensor 1000 and the lens assembly 1910, a display panel for displaying an image formed by the image signal processor 1960, and a memory for storing image data formed by the image signal processor 1960. The camera module 1880 may be mounted in, for example, a mobile electronic device such as a mobile phone, a notebook computer, a tablet PC, etc.

The lens assembly 1910 serves to focus an image of an object outside the camera module 1880 on the image sensor 1000, more precisely, on the pixel array 1100 of the image sensor 1000. In FIG. 3, a single lens is shown for convenience, but an actual lens assembly 1910 may include a plurality of lenses. When the pixel array 1100 is accurately positioned on a focal plane of the lens assembly 1910, light starting from a point on an object is re-converged to a point on the pixel array 1100 through the lens assembly 1910. For example, light starting from any one point A on an optical axis OX passes through the lens assembly 1910, and then, converges to the center of the pixel array 1100 on the optical axis OX. Light starting from any one point B, C, or D that is deviated from the optical axis OX crosses the optical axis OX by the lens assembly 1910 and is collected at a point in a periphery of the pixel array 1100. For example, in FIG. 3, light starting from a point B above the optical axis OX crosses the optical axis OX and is collected at a lower edge of the pixel array 1100, and light starting from a point C that is lower than the optical axis OX crosses the optical axis OX and is collected at an upper edge of the pixel array 1100. In addition, light starting from the point D located between the optical axis OX and the point B is collected at the periphery between the center and the lower edge of the pixel array 1100.

Accordingly, the light starting from the different points A, B, C, and D enters the pixel array 1100 at different angles from each other depending on a distance between the points A, B, C, and D and the optical axis OX. An incident angle of light incident on the pixel array 1100 is defined as a chief ray angle (CRA). A chief ray refers to a ray incident on the pixel array 1100 from a point of an object through the center of the lens assembly 1910, and the chief ray angle refers to an angle the chief ray makes with the optical axis OX. Light starting from the point A on the optical axis OX has a chief ray angle of 0 degrees and is incident perpendicularly to the central portion of the pixel array 1100. The chief ray angle increases as the starting point moves away from the optical axis OX.

From the viewpoint of the image sensor 1000, the chief ray angle of the incident light at the central portion of the pixel array 1100 is 0 degrees, and the incident light is obliquely incident at the periphery surrounding the central portion of the pixel array 1100. Also, the chief ray angle of the incident light increases toward the edge of the pixel array 1100. For example, the chief ray angle of light incident on the edge of the pixel array 1100 starting from points B and C is the largest, and the chief ray angle of light starting from point A and incident on the central portion of the pixel array 1100 is 0 degree. In addition, the chief ray angle of the light starting from the point D and incident on the periphery between the center and the edge of the pixel array 1100 is less than the chief ray angle of the light starting from the points B and C and greater than 0 degree.

Accordingly, the chief ray angle of incident light incident on the pixels varies according to positions of the pixels in the pixel array 1100. According to an example embodiment, a spacing between meta-photodiodes, which will be described later, may be determined so that absorption spectra of pixels located at the central portion of the pixel array 1100 and pixels located at the periphery of the pixel array 1100 are uniform.

Figure 4:
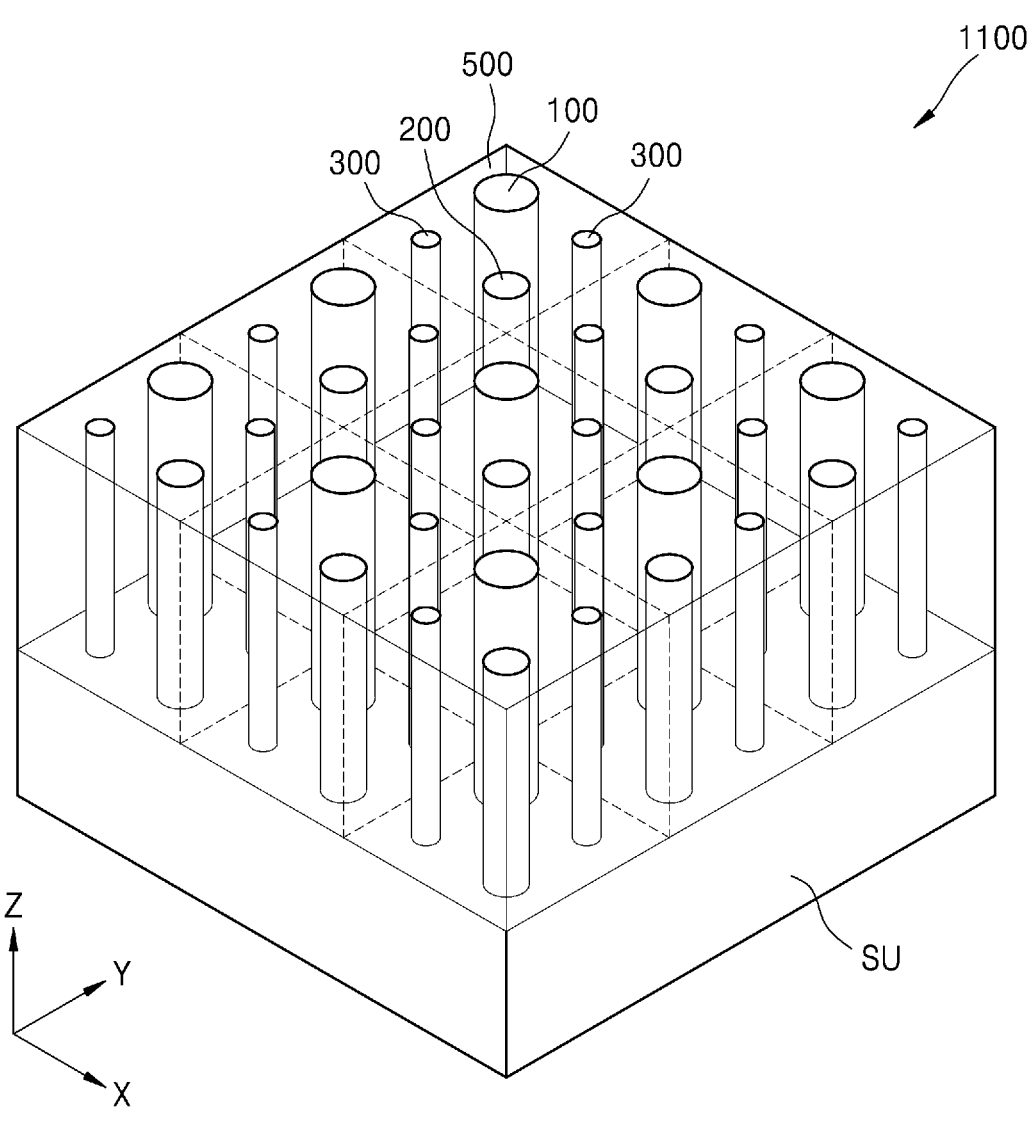
FIG. 4 is a perspective view illustrating a structure of a pixel array of the image sensor of FIG. 1.
Figure 5:
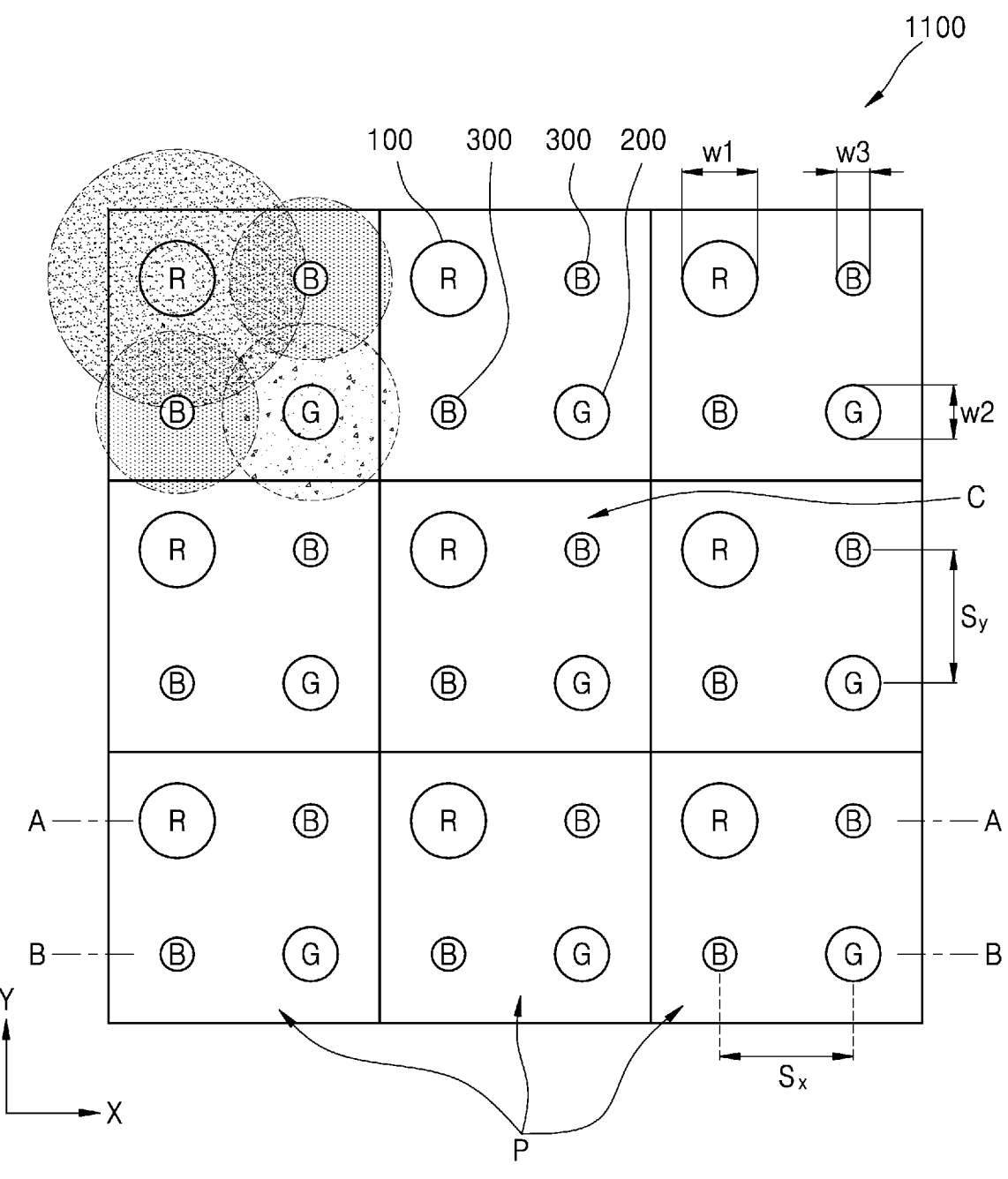
FIG. 5 is a plan view of the structure of the pixel array of FIG. 4.
Figure 6A:
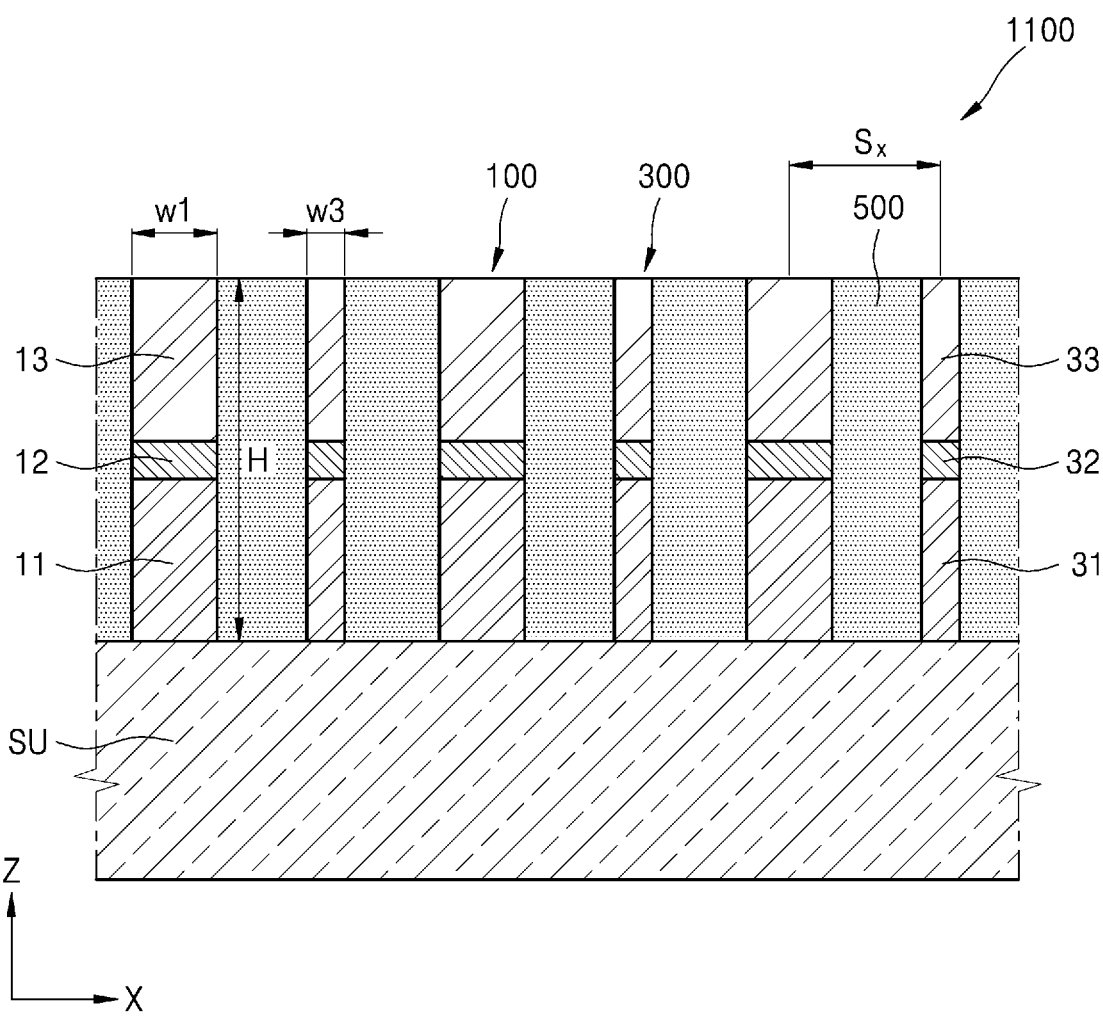
FIGS. 6A and 6B are cross-sectional views taken along lines A-A and B-B of FIG. 5, respectively.
Figure 6B:
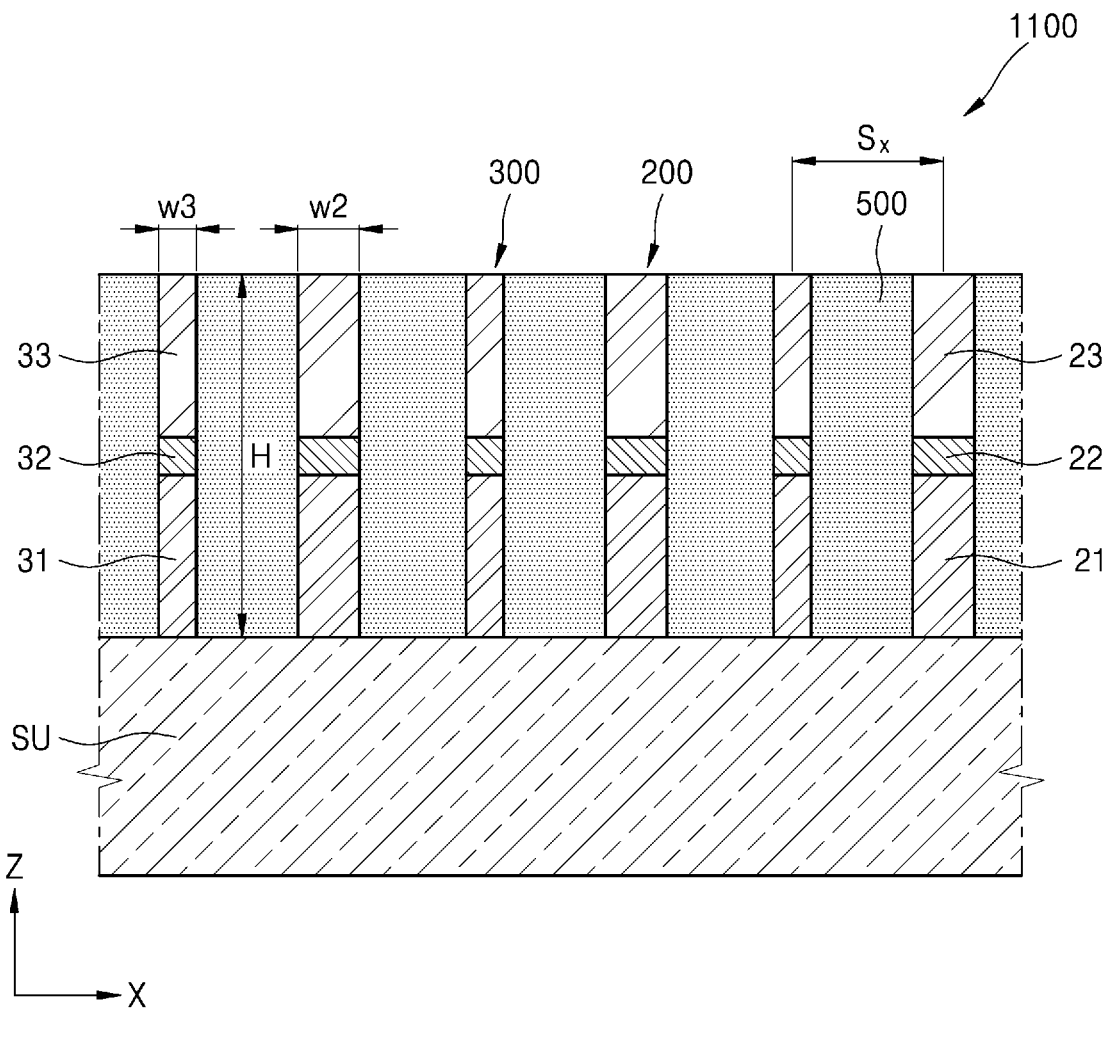

FIG. 4 is a detailed perspective view illustrating a structure of a pixel array 1100 of the image sensor 1000 of FIG. 1. FIG. 5 is a plan view of the structure of the pixel array 1100 of FIG. 4, and FIGS. 6A and 6B are cross-sectional views taken along lines A-A and B-B of FIG. 5, respectively.

Referring to FIG. 4, each of the plurality of pixels PX included in the pixel array 1100 may include a first meta-photodiode 100 configured to selectively absorb light of a first wavelength band (e.g., a red wavelength band), a second meta-photodiode 200 configured to selectively absorb light of a second wavelength band (e.g., green wavelength band) different from the first wavelength band, and a third meta-photodiode 300 configured to selectively absorb light of a third wavelength band (e.g., blue wavelength band) different from the first wavelength band and the second wavelength band. According to an example embodiment, the pixel array 1100 of the image sensor 1000 may further include a dielectric layer 500 filled between the first meta-photodiode 100, the second meta-photodiode 200, and the third meta-photodiode 300.

Also, the pixel array 1100 of the image sensor 1000 may further include a circuit board SU. The circuit board SU supports a plurality of first meta-photodiodes 100, a plurality of second meta-photodiodes 200, and a plurality of third meta-photodiodes 300, and may include a circuit element for processing a signal in each pixel PX. For example, the circuit board SU may include electrodes and wiring structures for the first meta-photodiode 100, the second meta-photodiode 200, and the third meta-photodiode 300 provided in the pixel PX. In addition, various circuit elements required for the image sensor 1000 may be integrated and provided on the circuit board SU. For example, the circuit board SU may further include a logic layer including various analog circuits and digital circuits, and may further include a memory layer in which data is stored. The logic layer and the memory layer may be configured as different layers or the same layer. Some of the circuit elements illustrated in FIG. 1 may be provided on the circuit board SU.

The first meta-photodiode 100, the second meta-photodiode 200, and the third meta-photodiode 300 each may be a rod-shaped vertical-type photodiode having a dimension less than a wavelength of incident light, and may selectively absorb light of a specific wavelength band by guided-mode resonance. Absorption spectra of the first meta-photodiode 100, the second meta-photodiode 200, and the third meta-photodiode 300 may be determined by widths, heights, cross-sectional shapes, and arrangement forms of the first meta-photodiode 100, the second meta-photodiode 200, and the third meta-photodiode 300, and may be determined by a spacing between two adjacent meta-photodiodes among the first meta-photodiode 100, the second meta-photodiode 200, and the third meta-photodiode 300.

Referring to FIG. 5, each of the first meta-photodiode 100, the second meta-photodiode 200, and the third meta-photodiode 300 may have a first width w1, a second width w2, and a third width w3 different from each other in a direction (X direction or Y direction) perpendicular to a height direction (Z direction) so that first meta-photodiode 100, the second meta-photodiode 200, and the third meta-photodiode 300 selectively absorb light of different wavelength bands. That is, according to an example embodiment, the first meta-photodiode 100 may have the first width w1, the second meta-photodiode 200 may have the second width w2 and the third meta-photodiode 300 may have the third width w3, where the first width w1, the second width w2, and the third width w3 are different from each other in a direction (X direction or Y direction) perpendicular to a height direction (Z direction). The first width w1, the second width w2, and the third width w3 may have, for example, a range of about 50 nm or more and about 200 nm or less. The first width w1, the second width w2, and the third width w3 may be selected so that light of a wavelength satisfying requirements of each guided-mode resonance among light incident on the pixel PX is guided inside the corresponding meta-photodiode. For example, the first width w1 may be in a range of about 100 nm to about 200 nm, the second width w2 may be in a range of about 80 nm to about 150 nm, and the third width w3 may be in a range of about 50 nm to about 120 nm.

The first meta-photodiode 100, the second meta-photodiode 200, and the third meta-photodiode 300 may absorb red light, green light, and blue light among incident light, respectively. Accordingly, a meta-photodiode having a greater width among the first meta-photodiode 100, the second meta-photodiode 200, and the third meta-photodiode 300 may absorb light of a longer wavelength band. For example, the first width w1 may be greater than the second width w2, and the second width w2 may be greater than the third width w3. In FIG. 5, circles shown around the first meta-photodiode 100, the second meta-photodiode 200, and the third meta-photodiode 300 conceptually illustrate that red light, green light, and blue light, respectively, are guided into the first meta-photodiode 100, the second meta-photodiode 200, and the third meta-photodiode 300, but are not limited thereto. Most of red light incident to an arbitrary position in the pixel PX region may be absorbed by the first meta-photodiode 100, most of green light may be absorbed by the second meta-photodiode 200, and most of blue light may be absorbed by the third meta-photodiode 300.

In addition, one pixel PX may include one first meta-photodiode 100 that absorbs red light, one second meta-photodiode 200 that absorbs green light, and two third meta-photodiodes 300 that absorbs blue light. For example, one first meta-photodiode 100, one second meta-photodiode 200, and two third meta-photodiodes 300 may be arranged so that a line connecting the centers of the four meta-photodiodes 100, 200, and 300 is a square. The first meta-photodiode 100 and the second meta-photodiode 200 may be provided in a first diagonal direction of a square, and the two third meta-photodiodes 300 are provided in a second diagonal direction crossing the first diagonal direction. However, the arrangement is an example. For example, meta-photodiodes may be arranged so that a line connecting the centers of four meta-photodiodes in one pixel PX is a rectangle, or five or more meta-photodiodes may also be arranged.

In FIGS. 4 and 5, the first meta-photodiode 100, the second meta-photodiode 200, and the third meta-photodiode 300 are illustrated in a cylindrical shape, but are not limited thereto. For example, the first meta-photodiode 100, the second meta-photodiode 200, and the third meta-photodiode 300 may have an elliptical rod-shape or a polygonal rod-shape such as, a square column or a hexagonal column. In other words, cross-sectional shapes of the first meta-photodiode 100, the second meta-photodiode 200, and the third meta-photodiode 300 in a direction (X direction or Y direction) perpendicular to the height direction (Z direction) may have a circular, oval, or polygonal shape. When the cross-sectional shapes of the first meta-photodiode 100, the second meta-photodiode 200, and the third meta-photodiode 300 are circular shape, the first width w1, the second width w2, and the third width w3 may be denoted by a first diameter, a second diameter, and a third diameter, respectively.

Referring to FIGS. 6A and 6B, a height H of the first meta-photodiode 100, the second meta-photodiode 200, and the third meta-photodiode 300 may be about 500 nm or more, about 1 µm or more, or about 2 µm or more. An appropriate upper limit of the height H of the first meta-photodiode 100, the second meta-photodiode 200, and the third meta-photodiode 300 may be set in consideration of quantum efficiency for each wavelength and process difficulty, and may be, for example, 10 µm or less, or 5 µm or less. Light of a shorter wavelength having high energy may be absorbed closer to an upper surface of a meta-photodiode, and light with a longer wavelength may be absorbed at a deeper position of the meta-photodiode. Accordingly, the height H of the first meta-photodiode 100, the second meta-photodiode 200, and the third meta-photodiode 300 may be determined in consideration of a position where light incident into the first meta-photodiode 100, the second meta-photodiode 200, and the third meta-photodiode 300 is absorbed, that is, a depth position from a surface thereof.

As shown in FIGS. 6A and 6B, the first meta-photodiode 100, the second meta-photodiode 200, and the third meta-photodiode 300 may have the same height. When the first meta-photodiode 100, the second meta-photodiode 200, and the third meta-photodiode 300 have the same height, the manufacturing process may be easy. In this case, a height at which light absorption is sufficiently achieved may be selected in accordance with reference to light of a long wavelength band. However, the disclosure is not limited thereto, and the first meta-photodiode 100, the second meta-photodiode 200, and the third meta-photodiode 300 may have different heights from each other. For example, a meta-photodiode having a greater height among the first meta-photodiode 100, the second meta-photodiode 200, and the third meta-photodiode 300 may absorb light of a longer wavelength band. In other words, if a height of the first meta-photodiode 100 is h1, a height of the second meta-photodiode 200 is h2, and a height of the third meta-photodiode 300 is h3, a condition of h1>h2>h3 may be satisfied.

Each of the first meta-photodiode 100, the second meta-photodiode 200, and the third meta-photodiode 300 is a rod-shaped p-i-n photodiode. For example, the first meta-photodiode 100 may include a first conductivity-type semiconductor layer 11, an intrinsic semiconductor layer 12 stacked on the first conductivity-type semiconductor layer 11 in a third direction (Z direction), and a second conductivity-type semiconductor layer 13 stacked on the intrinsic semiconductor layer 12 in the third direction (Z direction), the second meta-photodiode 200 may include a first conductivity-type semiconductor layer 21, an intrinsic semiconductor layer 22 stacked on the first conductivity-type semiconductor layer 21 in the third direction (Z direction), and a second conductivity-type semiconductor layer 23 stacked on the intrinsic semiconductor layer 22 in the third direction (Z direction), and the third meta-photodiode 300 may include a first conductivity-type semiconductor layer 31, an intrinsic semiconductor layer 32 stacked on the first conductivity-type semiconductor layer 31 in the third direction (Z direction), and a second conductivity-type semiconductor layer 33 stacked on the intrinsic semiconductor layer 32 in the third direction (Z direction). Here, a direction in which the first conductivity-type semiconductor layers 11, 21, and 31, the intrinsic semiconductor layers 21, 22, and 32, and the second conductivity-type semiconductor layers 13, 23, and 33 are stacked may be the same direction as the height direction of the first meta-photodiode 100, the second meta-photodiode 200, and the third meta-photodiode 300. The first conductivity-type semiconductor layers 11, 21, and 31 may include a semiconductor material doped with a first conductivity type, the second conductivity-type semiconductor layers 13, 23, and 33 may include a semiconductor material doped with a second conductivity-type that is electrically opposite to the first conductivity type, and the intrinsic semiconductor layers 12, 22, and 32 may include an undoped semiconductor material.

The first meta-photodiode 100, the second meta-photodiode 200, and the third meta-photodiode 300 may be formed based on a silicon semiconductor. For example, the first conductivity-type semiconductor layers 11, 21, and 31 may include p-Si, the intrinsic semiconductor layers 12, 22, and 32 may include i-Si, and the second conductivity-type semiconductor layer 13, 23, and 33 may include n-Si. Alternatively, the first conductivity-type semiconductor layers 11, 21, and 31 may include n-Si, and the second conductivity-type semiconductor layers 13, 23, and 33 may include p-Si. However, the semiconductor material is not necessarily limited to silicon Si. For example, according to another example embodiment, the semiconductor material of the first meta-photodiode 100, the second meta-photodiode 200, and the third meta-photodiode 300 may include germanium Ge, a Group III-V compound semiconductor, or a Group II-VI compound semiconductor.

According to an example embodiment, the dielectric layer 500 filled between the first meta-photodiode 100, the second meta-photodiode 200, and the third meta-photodiode 300 may include a dielectric material that is transparent to light of a wavelength band to be detected by the first meta-photodiode 100, the second meta-photodiode 200, and the third meta-photodiode 300. In addition, the dielectric material of the dielectric layer 500 may have a refractive index less than that of the first meta-photodiode 100, the second meta-photodiode 200, and the third meta-photodiode 300. The refractive index of the dielectric material of the dielectric layer 500 for light having a wavelength of about 630 nm may be, for example, 1 or more or 2 or less. For example, the dielectric layer 500 may include air, $SiO_2$, $Si_3N_4$, or $Al_2O_3$.

As described above, the first meta-photodiode 100, the second meta-photodiode 200, and the third meta-photodiode 300 having a width or diameter less than a wavelength of incident light may be arranged in a pixel PX having a size less than or equal to a diffraction limit of an imaging optical system, for example, the lens assembly 1910. In other words, in one pixel PX, the first meta-photodiode 100, the second meta-photodiode 200, and the third meta-photodiode 300 may be arranged in an area having a size less than or equal to a diffraction limit of the imaging optical system, for example, the lens assembly 1910. Then, each pixel PX may sense red light, green light, and blue light included in incident light without using a color filter. In this regard, it may be seen that the first meta-photodiode 100, the second meta-photodiode 200, and the third meta-photodiode 300 arranged in one pixel PX all perform the role of a lens, the role of a color filter, and the role of a photodiode by acting together.

Meanwhile, the change in absorption spectra of the first meta-photodiode 100, the second meta-photodiode 200, and the third meta-photodiode 300 according to a chief ray angle of incident light may be affected by a spacing between the first meta-photodiode 100, the second meta-photodiode 200, and the third meta-photodiode 300. Referring to FIG. 5, the spacing between the two adjacent meta-photodiodes among the first meta-photodiode 100, the second meta-photodiode 200, and the third meta-photodiode 300 may be defined as a distance between the centers of the two adjacent meta-photodiodes. For example, a first spacing Sx in a first direction (X direction) may be defined as a distance in the first direction between the center of the second meta-photodiode 200 and the center of the third meta-photodiode 300, or may be defined as a distance in the first direction between the center of the first meta-photodiode 100 and the center of the third meta-photodiode 300. In addition, a second spacing Sy in a second direction (Y direction) is a distance in the second direction between the center of the second meta-photodiode 200 and the center of the third meta-photodiode 300, or may be defined as a distance in the second direction between the center of the first meta-photodiode 100 and the center of the third meta-photodiode 300. When four meta-photodiodes are arranged in a square shape in one pixel PX, the first spacing Sx and the second spacing Sy may be the same. Here, the first direction (X direction) or the second direction (Y direction) may be a direction parallel to a direction of a side of each pixel PX, respectively.

According to the example embodiment, the first spacing Sx and the second spacing Sy may be selected so that the absorption spectra of the first meta-photodiode 100, the second meta-photodiode 200, and the third meta-photodiode 300 remain substantially constant regardless of the chief ray angle of incident light. Then, the absorption spectra of pixels located at the central portion of the pixel array 1100 and pixels located at the periphery of the pixel array 1100 may be uniform.

FIG. 7 is a table showing a comparison of color separation results according to a width of meta-photodiodes and a spacing between meta-photodiodes with respect to different chief ray angles.

Referring to FIG. 7, in Example Embodiment 1, the first meta-photodiode 100, the second meta-photodiode 200, and the third meta-photodiode 300 have a cylindrical shape and are arranged as shown in FIG. 5. The first meta-photodiode 100 has a diameter of 120 nm, the second meta-photodiode 200 has a diameter of 90 nm, and the third meta-photodiode 300 has a diameter of 70 nm. When a spacing between two adjacent meta-photodiodes is 220 nm, 180 nm, and 150 nm, at a chief ray angle of 0° and a chief ray angle of 30°, the absorption characteristics of the first meta-photodiode 100, the second meta-photodiode 200, and the third meta-photodiode 300 with respect to red light, green light, and blue light were compared. In addition, R Sum, G Sum, and B Sum represent absorption amounts for red light, green light, and blue light at a chief ray angle of 30° when the absorption amount for red light, green light, and blue light at a chief ray angle of 0° is 1.

As may be seen from FIG. 7, as a spacing between two adjacent meta-photodiodes decreases, the absorption characteristics of the first meta-photodiode 100, the second meta-photodiode 200, and the third meta-photodiode 300 with respect to incident light incident at a chief ray angle of 0° and incident light incident at a chief ray angle of 30° become close to each other. When a spacing between two adjacent meta-photodiodes is 150 nm, the absorption characteristics of the first meta-photodiode 100, the second meta-photodiode 200, and the third meta-photodiode 300 with respect to incident light incident at a chief ray angle of 0° and incident light incident at a chief ray angle of 30° are most similar to each other.

Also, in Example Embodiment 2, the first meta-photodiode 100, the second meta-photodiode 200, and the third meta-photodiode 300 have a cylindrical shape, and are arranged as shown in FIG. 5. The first meta-photodiode 100 has a diameter of 136 nm, the second meta-photodiode 200 has a diameter of 122 nm, and the third meta-photodiode 300 has a diameter of 104 nm. In Embodiment 2, referring to R Sum, G Sum, and B Sum, as a spacing between two adjacent meta-photodiodes decreases, absorption characteristics of the first meta-photodiode 100, the second meta-photodiode 200, and the third meta-photodiode 300 with respect to incident light incident at a chief ray angle of 0° and incident light incident at a chief ray angle of 30° are close to each other. In addition, when the spacing between two adjacent meta-photodiodes is 150 nm, the absorption characteristics of the first meta-photodiode 100, the second meta-photodiode 200, and the third meta-photodiode 300 with respect to incident light incident at a chief ray angle of 0° and incident light incident at a chief ray angle of 30° are most similar to each other.

FIGS. 8A to 8C, 9A to 9C, 10A to 100, 11A to 110 and 12A to 12C are graphs showing changes in absorption spectra of blue light, green light, and red light according to sizes of meta-photodiodes and a spacing between meta-photodiodes compared at different chief ray angles.

Figure 8A:
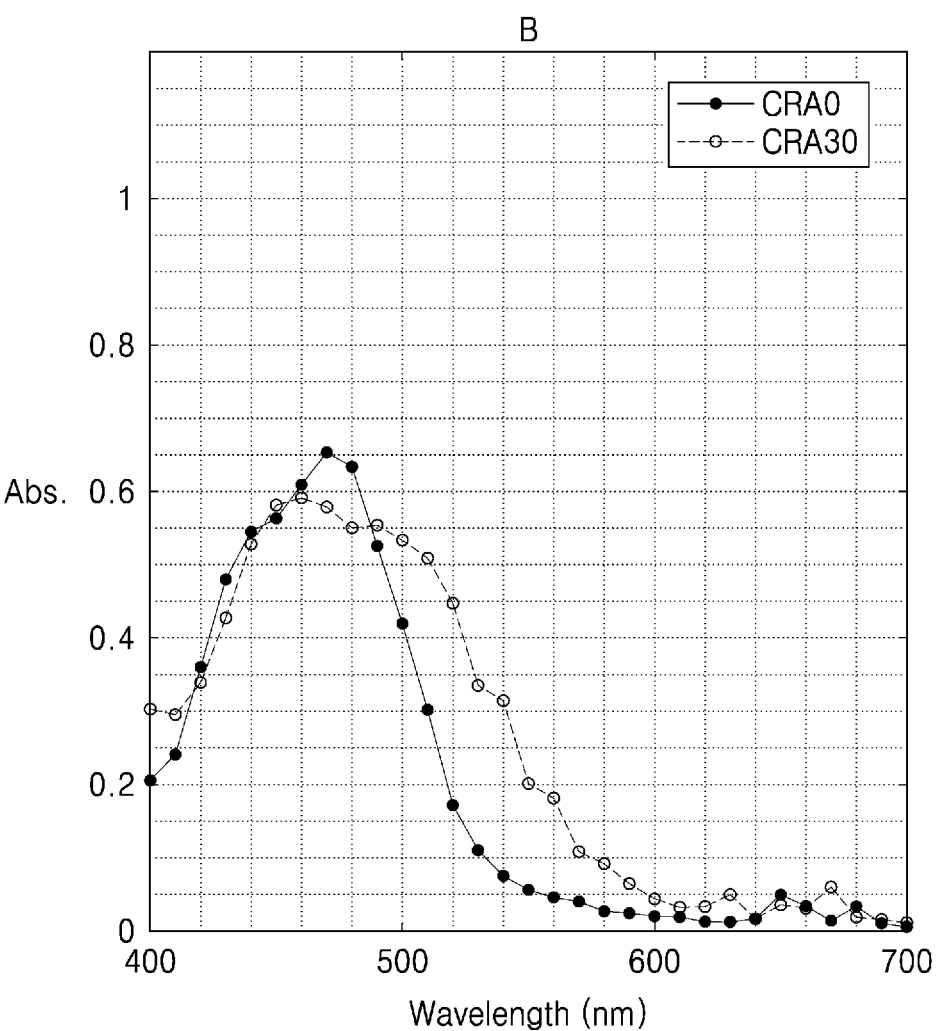
Figure 8B:
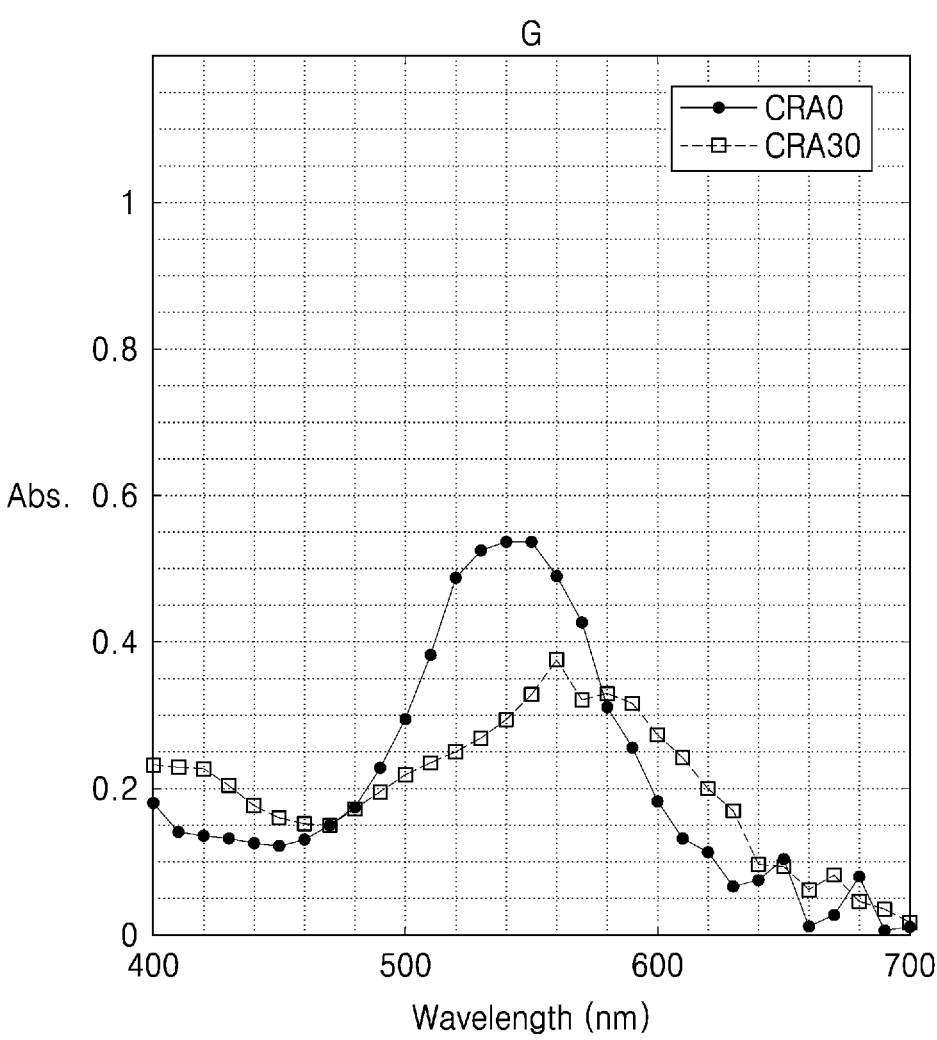
Figure 8C:
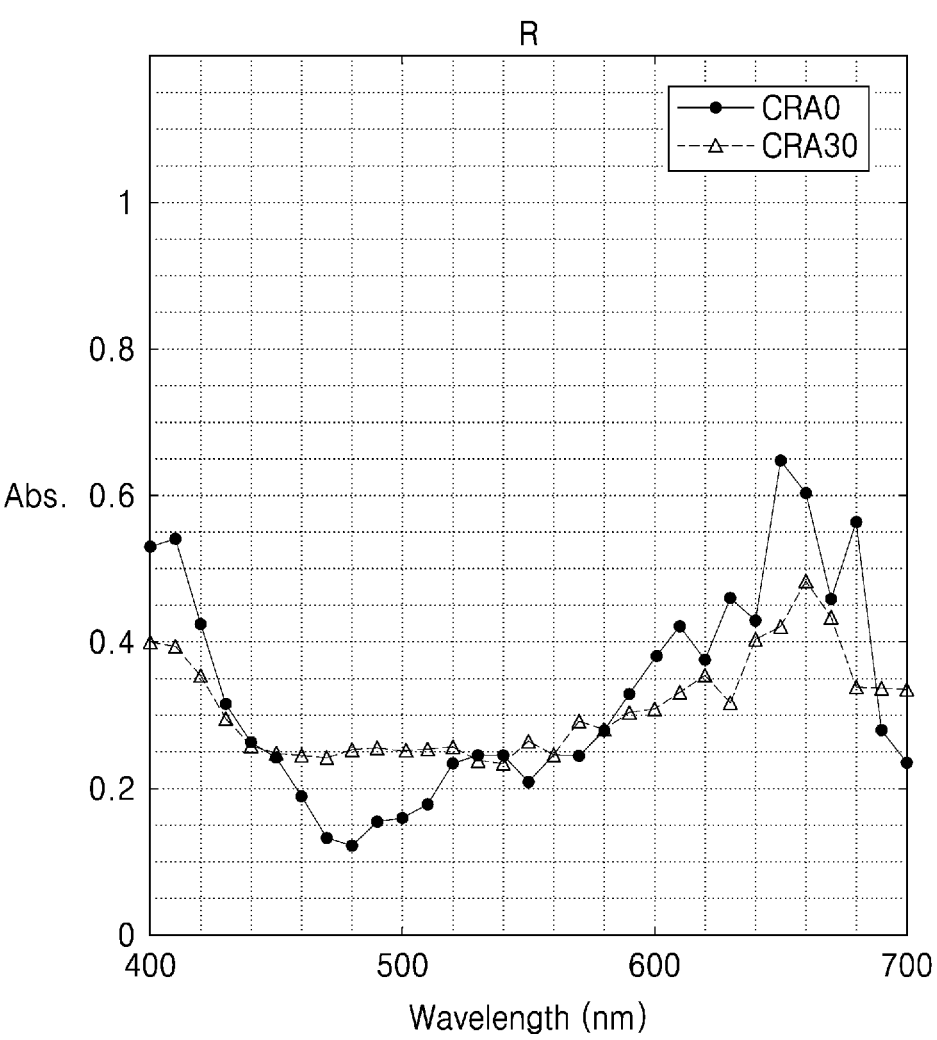
Figure 9A:
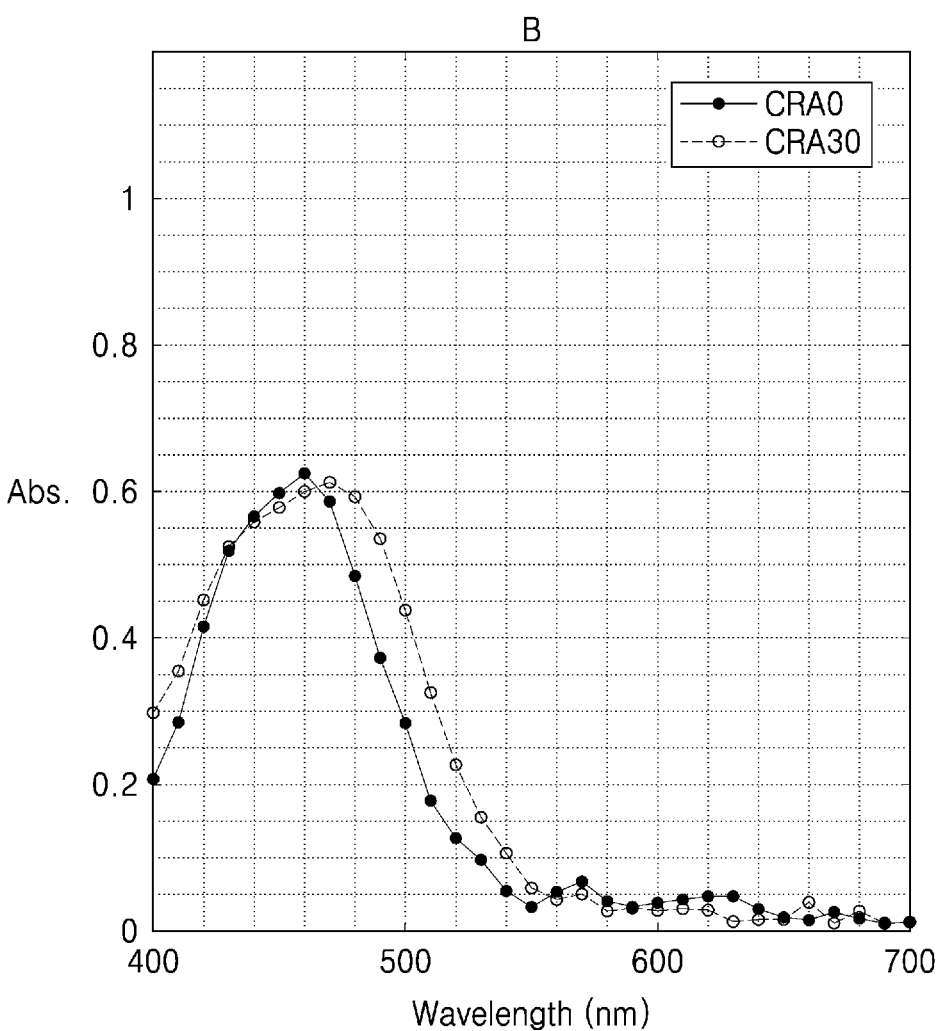
Figure 9B:
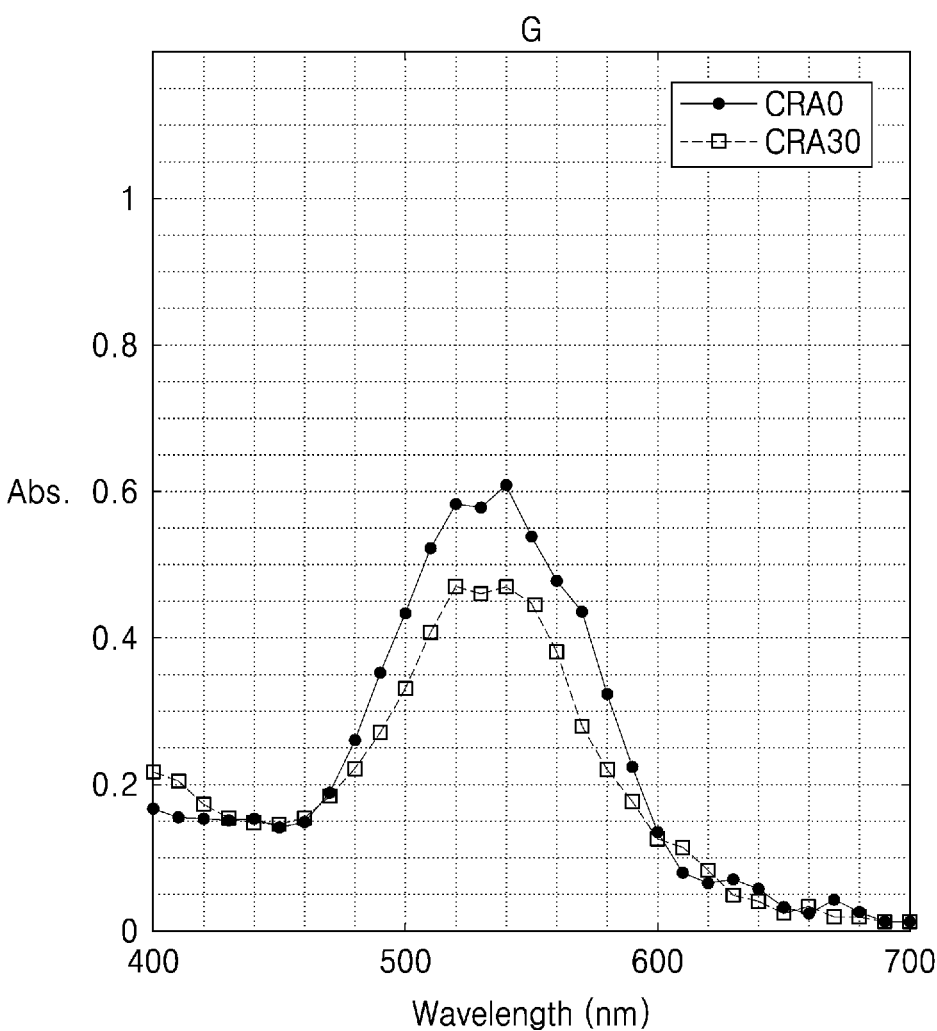
Figure 9C:
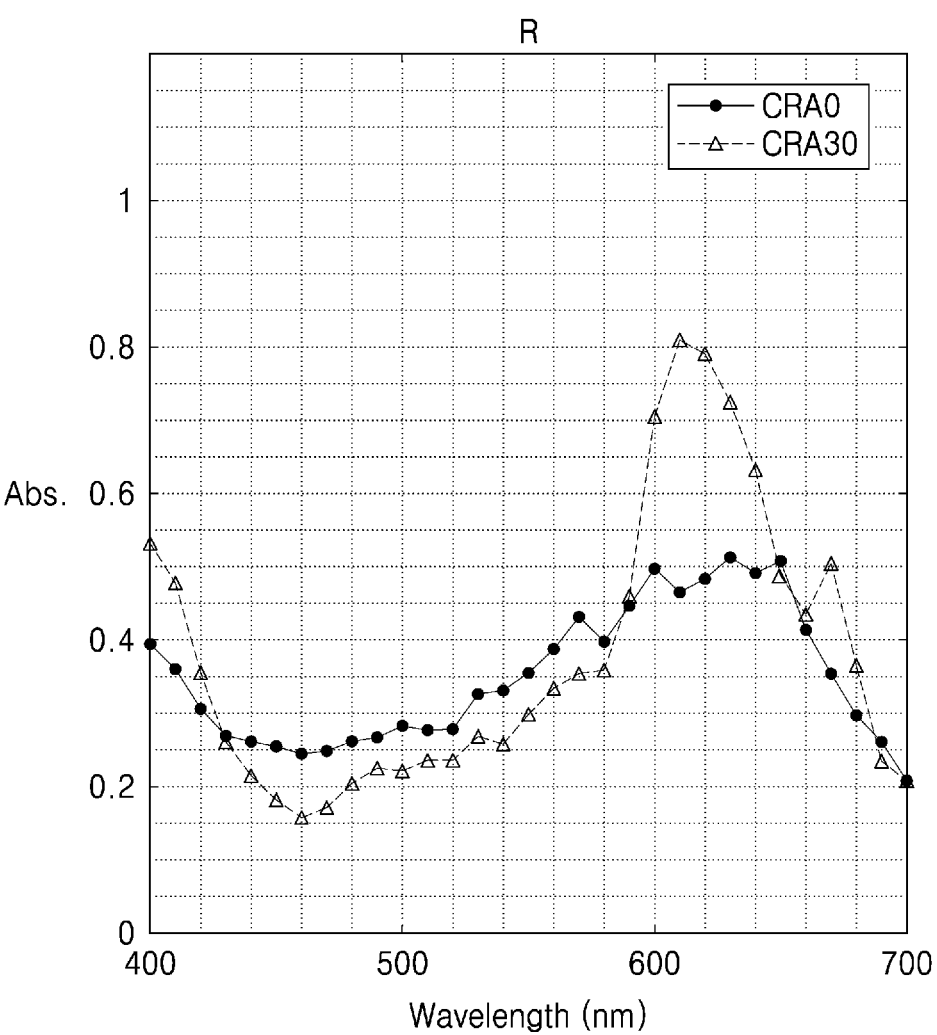
Figure 10A:
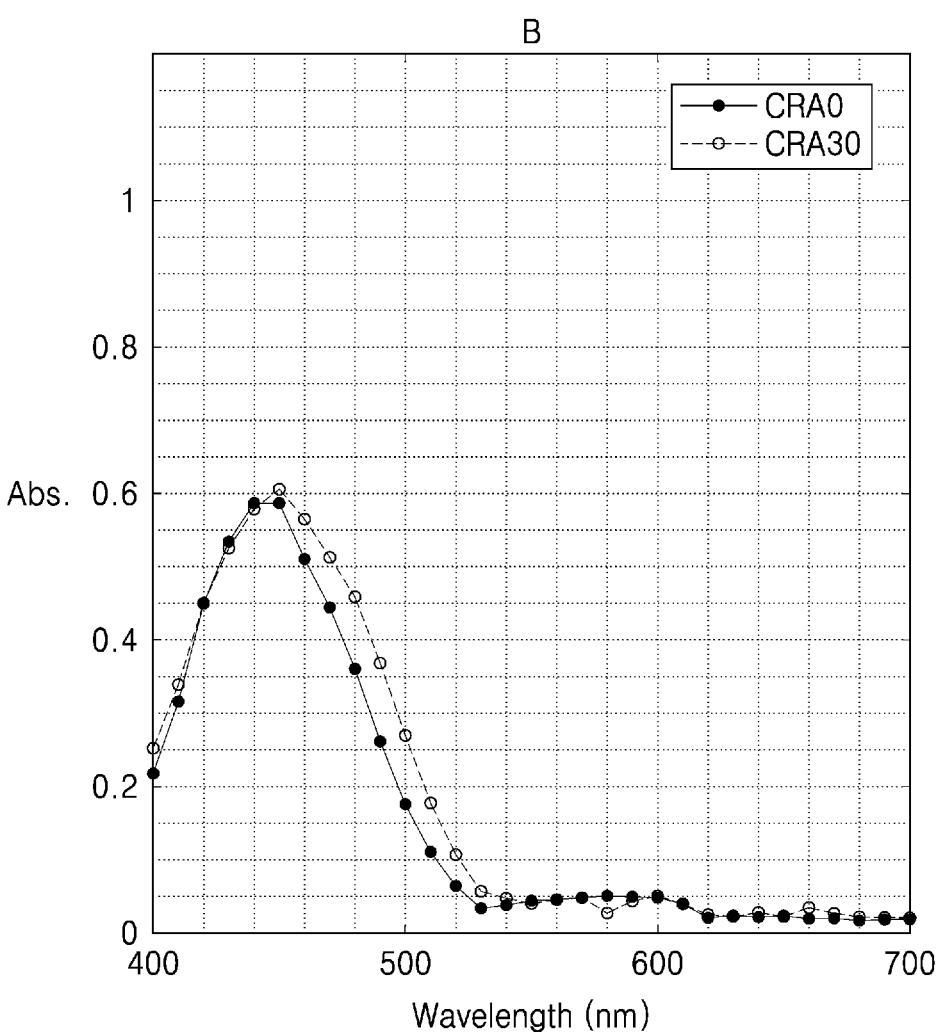
Figure 10B:
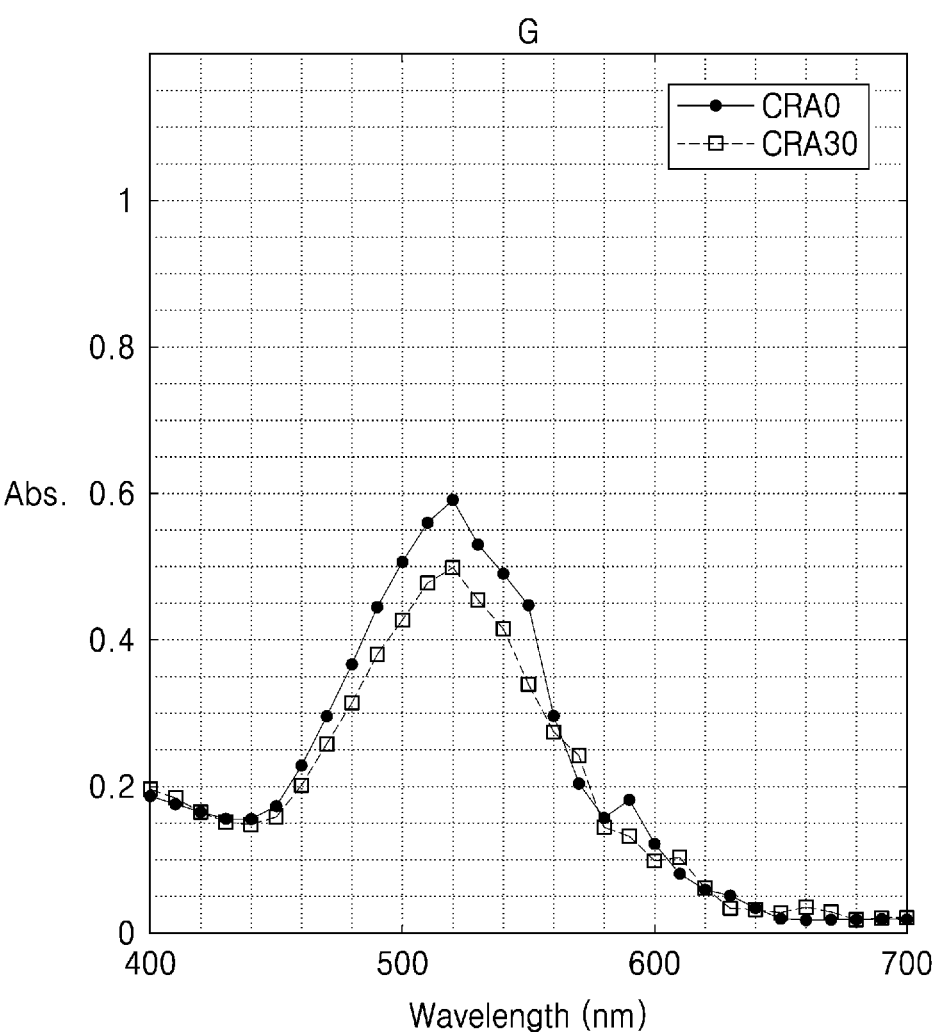
Figure 10C:
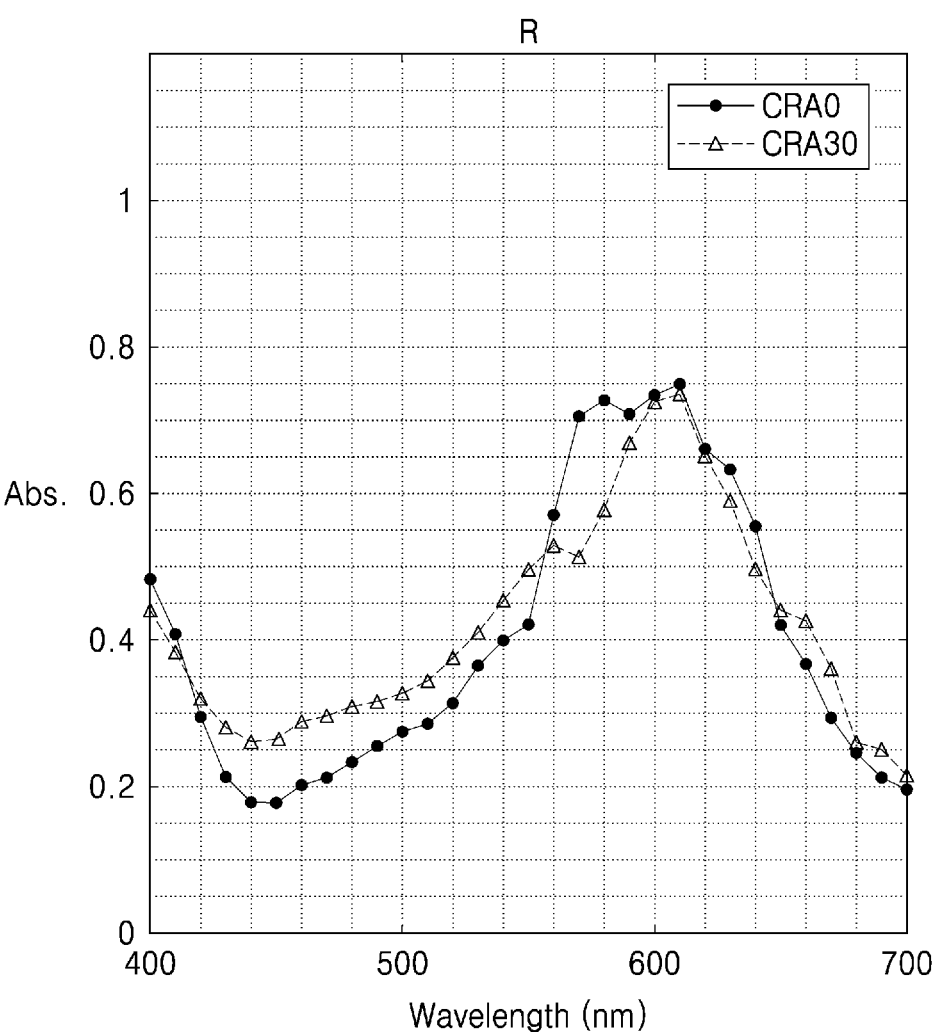

FIGS. 8A to 8C are graphs showing comparisons of absorption spectra of the third meta-photodiode 300, the second meta-photodiode 200, and the first meta-photodiode 100 with respect to incident light incident at a chief ray angle of 0° and incident light incident at a chief ray angle of 30° when a spacing between two adjacent meta-photodiodes in Embodiment 1 is 220 nm. FIGS. 9A to 9C are graphs for a case when the spacing between two adjacent meta-photodiodes in Embodiment 1 is 180 nm. Also, FIGS. 10A to 100 are graphs for a case when the spacing between two adjacent meta-photodiodes in Embodiment 1 is 150 nm. Referring to FIGS. 7, 8A to 8C, 9A to 9C, 10A to 100, it may be seen that, compared to the case when the spacing between the meta-photodiodes is 180 nm, in the case when the spacing between the meta-photodiodes is 150 nm, a signal difference between the incident light incident at a chief ray angle of 0° and the incident light incident at a chief ray angle of 30° is small. In addition, when the spacing between the meta-photodiodes is 150 nm, positions of absorption spectrum peaks of the third meta-photodiode 300, the second meta-photodiode 200, and the first meta-photodiode 100 with respect to incident light incident at a chief ray angle of 0° and incident light incident at a chief ray angle of 30° are almost identical.

Figure 11A:
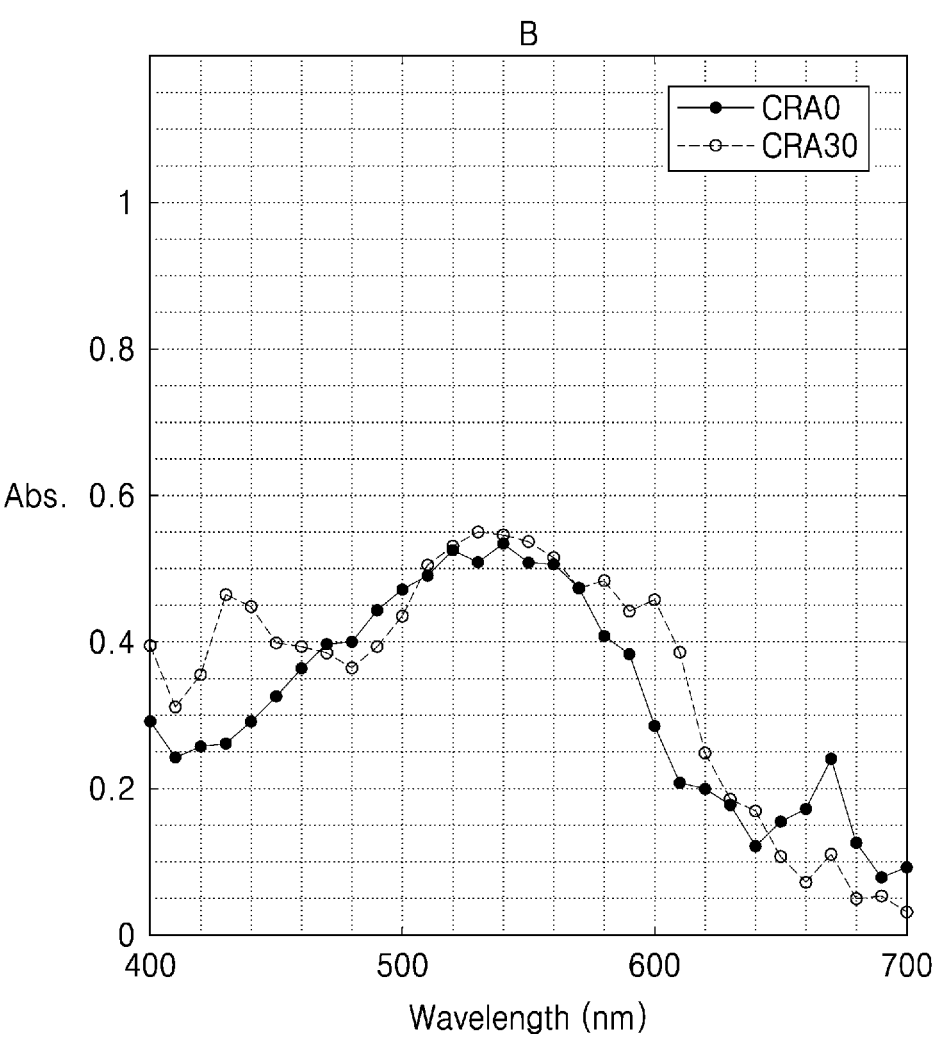
Figure 11B:
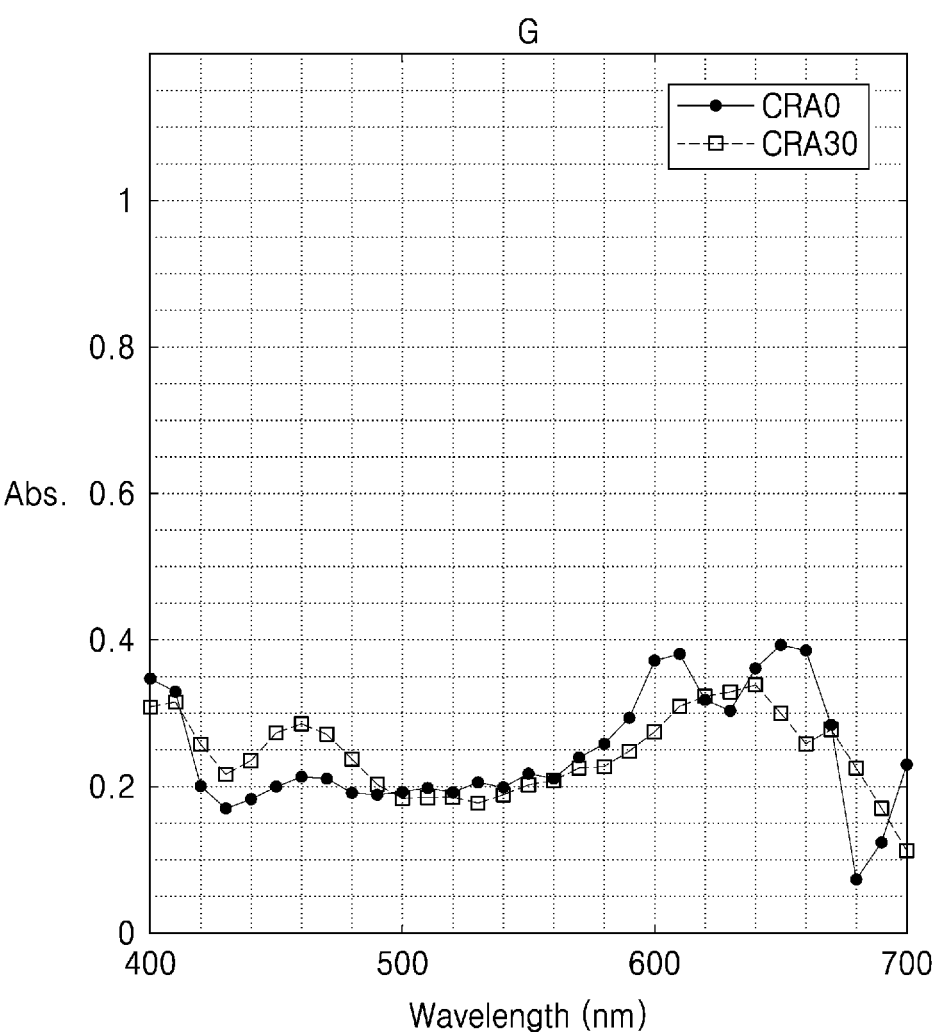
Figure 11C:
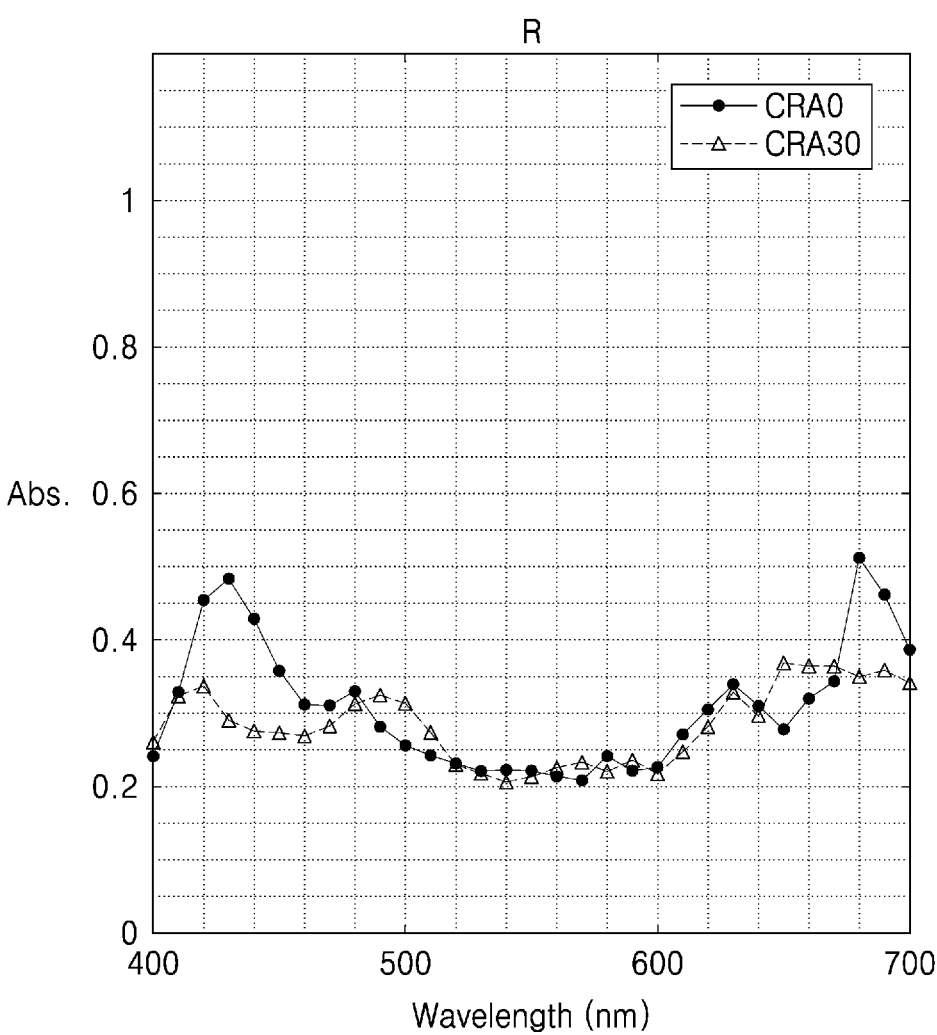
Figure 12A:
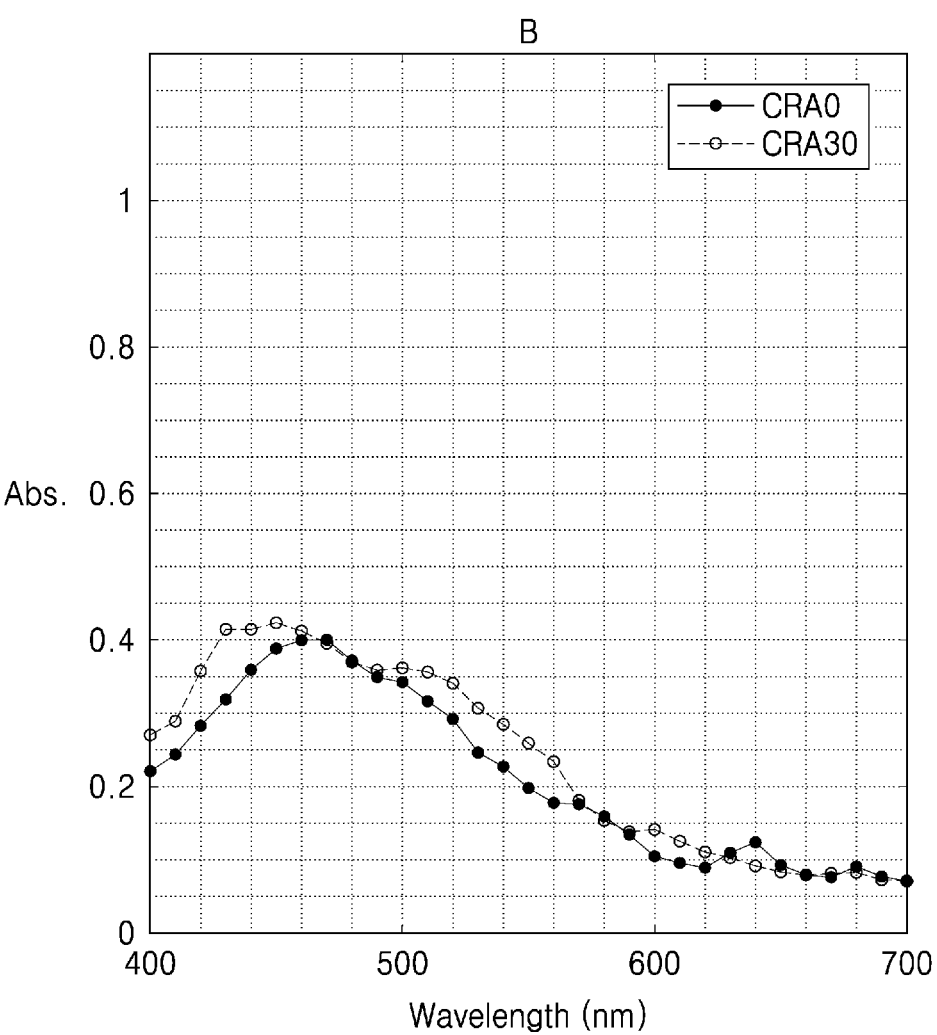
Figure 12B:
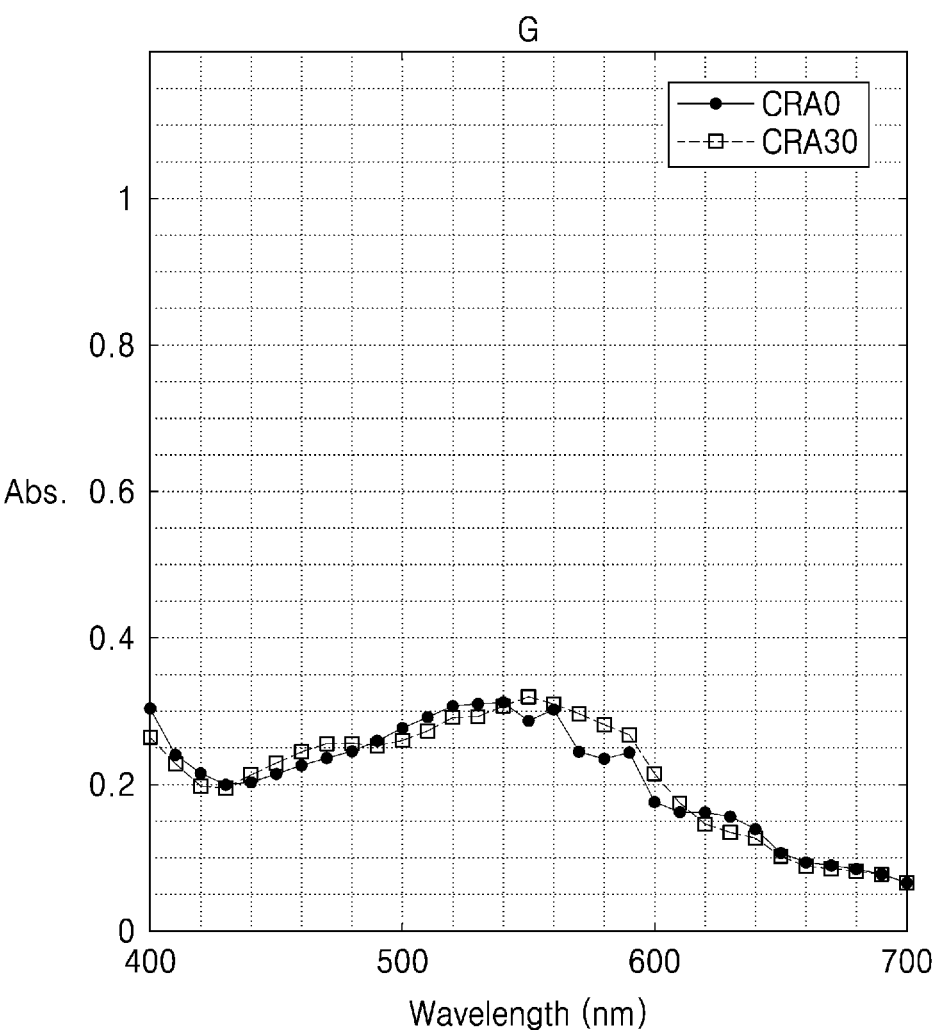
Figure 12C:
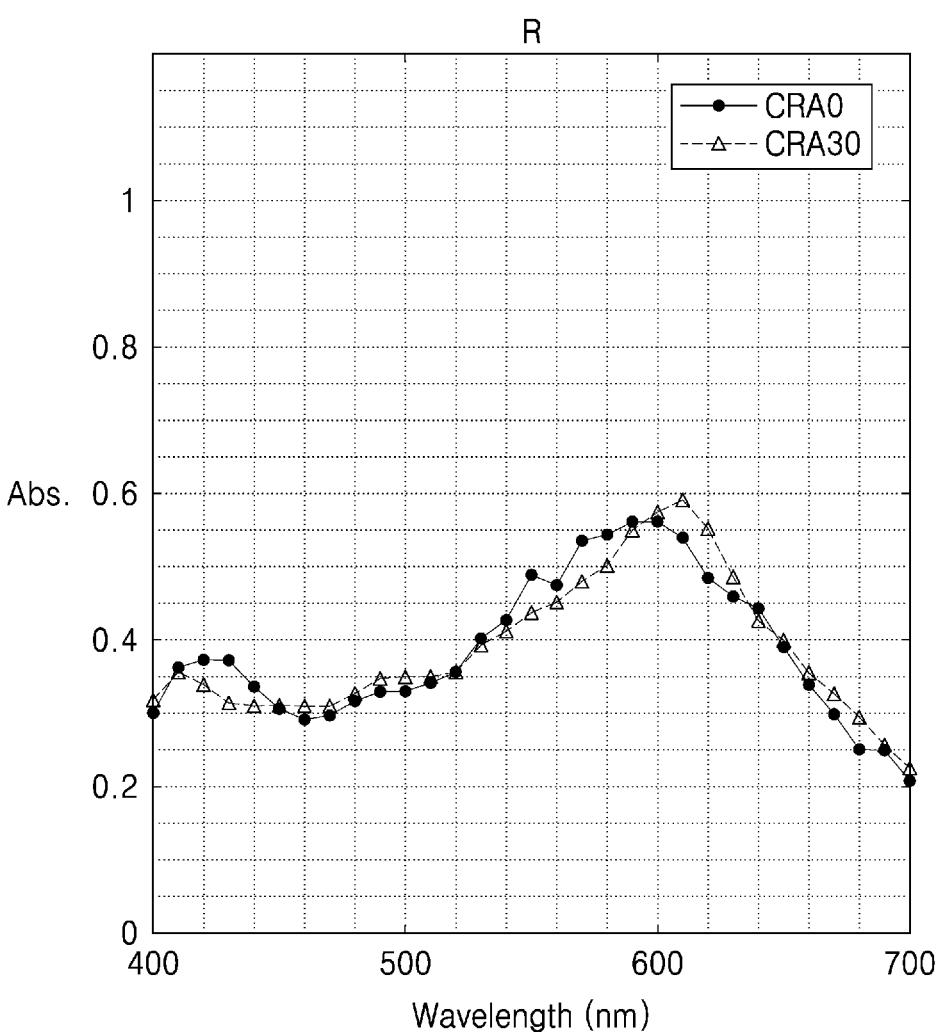

FIGS. 11A to 11C are graphs showing comparisons of absorption spectra of the third meta-photodiode 300, the second meta-photodiode 200, and the first meta-photodiode 100 with respect to incident light incident at a chief ray angle of and incident light incident at a chief ray angle of 30° when a spacing between two adjacent meta-photodiodes in Embodiment 2 is 220 nm. FIGS. 12A to 12C are graphs for a case when the spacing between two adjacent meta-photodiodes in Embodiment 2 is 150 nm. Referring to FIGS. 11A to 12C, when the spacing between two adjacent meta-photodiodes is 150 nm, it may be seen that the absorption spectra of the third meta-photodiode 300, the second meta-photodiode 200, and the first meta-photodiode 100 with respect to incident light incident at a chief ray angle of 0° and incident light incident at a chief ray angle of 30° are almost identical.

Accordingly, if the spacing between two adjacent meta-photodiodes is sufficiently small, regardless of a width or diameter of the first meta-photodiode 100, the second meta-photodiode 200, and the third meta-photodiode 300, absorption spectra of the first meta-photodiode 100, the second meta-photodiode 200, and the third meta-photodiode 300 with respect to incident light incident at chief ray angles different from each other may be relatively uniformly maintained. For example, in one pixel PX, a spacing Sx between two meta-photodiodes adjacent in the first direction (X direction) among the first meta-photodiode 100, the second meta-photodiode 200, and the third meta-photodiode 300 may be 150 nm or less, and may be equal to or greater than ½ of the sum of the widths or diameters of two adjacent meta-photodiodes. In addition, in one pixel PX, a spacing Sy between two meta-photodiodes adjacent in the second direction (Y direction) may also be 150 nm or less, and may be equal to or greater than ½ of the sum of the widths or diameters of two adjacent meta-photodiodes. However, the disclosure is not limited to one pixel PX, and as such, according to another example embodiment, in each of the plurality of pixels in the pixel array 1100, a spacing Sx between two meta-photodiodes adjacent in the first direction (X direction) among the first meta-photodiode 100, the second meta-photodiode 200, and the third meta-photodiode 300 may be 150 nm or less, and may be equal to or greater than ½ of the sum of the widths or diameters of two adjacent meta-photodiodes. In addition, in each of the plurality of pixels in the pixel array 1100, a spacing Sy between two meta-photodiodes adjacent in the second direction (Y direction) may also be 150 nm or less, and may be equal to or greater than ½ of the sum of the widths or diameters of two adjacent meta-photodiodes.

Alternatively, in one pixel PX, the spacing Sx between two meta-photodiodes adjacent in the first direction (X direction) among the first meta-photodiode 100, the second meta-photodiode 200, and the third meta-photodiode 300 may be equal to or less than ⅓ of a diffraction limit determined by optical properties of an imaging optical system, for example, the lens assembly 1910. Similarly, the spacing Sy between two meta-photodiodes adjacent in the second direction (Y direction) may be equal to or less than ⅓ of a diffraction limit determined by optical properties of an imaging optical system, for example, the lens assembly 1910.

Alternatively, in one pixel PX, when the sum of widths or diameters in the first direction (X direction) of two meta-photodiodes adjacent in the first direction (X direction) among the first meta-photodiode 100, the second meta-photodiode 200, and the third meta-photodiode 300 is Wx, the spacing Sx between two meta-photodiodes adjacent in the first direction (X direction) may satisfy Wx/2+40 nm>Sx. In addition, when the sum of widths or diameters in the second direction (Y direction) of two meta-photodiodes adjacent in the second direction (Y direction) is Wy, the spacing Sy between two meta-photodiodes adjacent in the second direction (Y direction) may satisfy Wy/2+40 nm>Sy.

In one pixel PX, when the spacing between two adjacent meta-photodiodes satisfies the condition described above, the influence of a chief ray angle of incident light on the absorption spectra of the first meta-photodiode 100, the second meta-photodiode 200, and the third meta-photodiode 300 may be greatly reduced. Accordingly, when designing the pixel array 1100, there is no need to differently select sizes, heights, widths, spacings, etc. of the first meta-photodiode 100, the second meta-photodiode 200, and the third meta-photodiode 300 according to the position of a pixel PX on the pixel array 1100 in consideration of the chief ray angle of incident light.

In other words, referring to FIG. 5, the arrangement form of the first meta-photodiode 100, the second meta-photodiode 200, and the third meta-photodiode 300 arranged in the plurality of pixels PX at the central portion (C) of the pixel array 1100 may be the same as the arrangement form of the first meta-photodiode 100, the second meta-photodiode 200, and the third meta-photodiode 300 arranged in the plurality of pixels PX in the periphery (P) of the pixel array 1100. Here, the same arrangement form may denote that the structures, sizes, relative positions, and the like of the meta-photodiodes are the same. For example, in the central portion and the periphery of the pixel array 1100, the widths or diameters, heights, structures, and materials of the first meta-photodiodes 100 may be the same as each other, the widths or diameters, heights, structures, and materials of the second meta-photodiodes 200 may be the same as each other, and the widths or diameters, heights, structures, and materials of the third meta-photodiodes 300 may be the same as each other. In addition, in the plurality of pixels PX at the central portion and the periphery of the pixel array 1100, the spacing between the first meta-photodiode 100, the second meta-photodiode 200, and the third meta-photodiode 300 and relative positions may be the same as each other.

As described with reference to FIG. 3, the central portion of the pixel array 1100 is a region where incident light is incident almost perpendicularly, and the periphery of the pixel array 1100 surrounds the central portion and is a region where incident light is obliquely incident. In conclusion, in an entire region of the pixel array 1100 according to the example embodiment, the first meta-photodiodes 100 arranged in the plurality of pixels PX have the same structure, the second meta-photodiodes 200 arranged in the plurality of pixels PX have the same structure, and the third meta-photodiodes 300 arranged in the plurality of pixels PX have the same structure, and, the first meta-photodiode 100, the second meta-photodiode 200, and the third meta-photodiode 300 may have the same arrangement as each other in the plurality of pixels PX.

Figure 13:
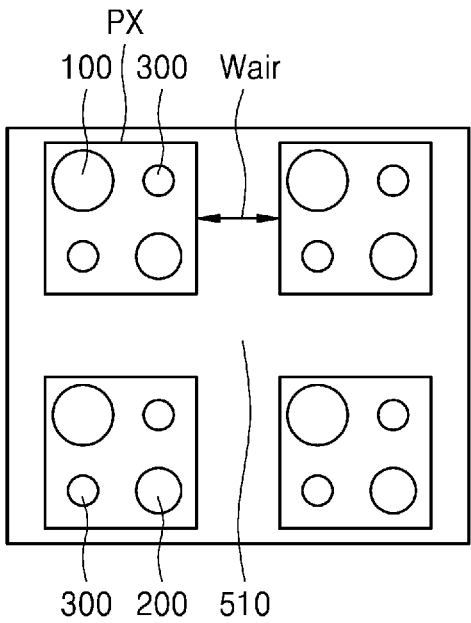
FIG. 13 is a plan view illustrating a structure of a pixel array of an image sensor according to another example embodiment.

FIG. 13 is a plan view illustrating a structure of a pixel array 1100 of an image sensor 1000 according to another example embodiment. Referring to FIG. 13, the pixel array 1100 of the image sensor 1000 may further include isolation film 510 provided between adjacent pixels PX to reduce interference between the pixels PX. The isolation film 510 may include a low refractive index material having a refractive index of 1 or more or 2 or less. For example, the isolation film 510 may include air, $SiO_2$, $Si_3N_4$, or $Al_2O_3$.

FIGS. 14A to 14C, 15A to 15C and 16A to 16C are graphs showing comparisons of changes in absorption spectra of blue light, green light, and red light according to a width of an isolation film between pixels with respect to different chief ray angles. In FIGS. 14A to 14C, 15A to 15C and 16A to 16C, when a diameter of the first meta-photodiode 100 is 120 nm, a diameter of the second meta-photodiode 200 is 90 nm, and a diameter of the third meta-photodiode 300 is 70 nm and a spacing between two adjacent meta-photodiodes in the pixel PX is 150 nm, at a chief ray angle of 0° and a chief ray angle of 30°, absorption characteristics of the first meta-photodiode 100, the second meta-photodiode 200, and the third meta-photodiode 300, with respect to red light, green light, and blue light were compared.

Figure 14A:
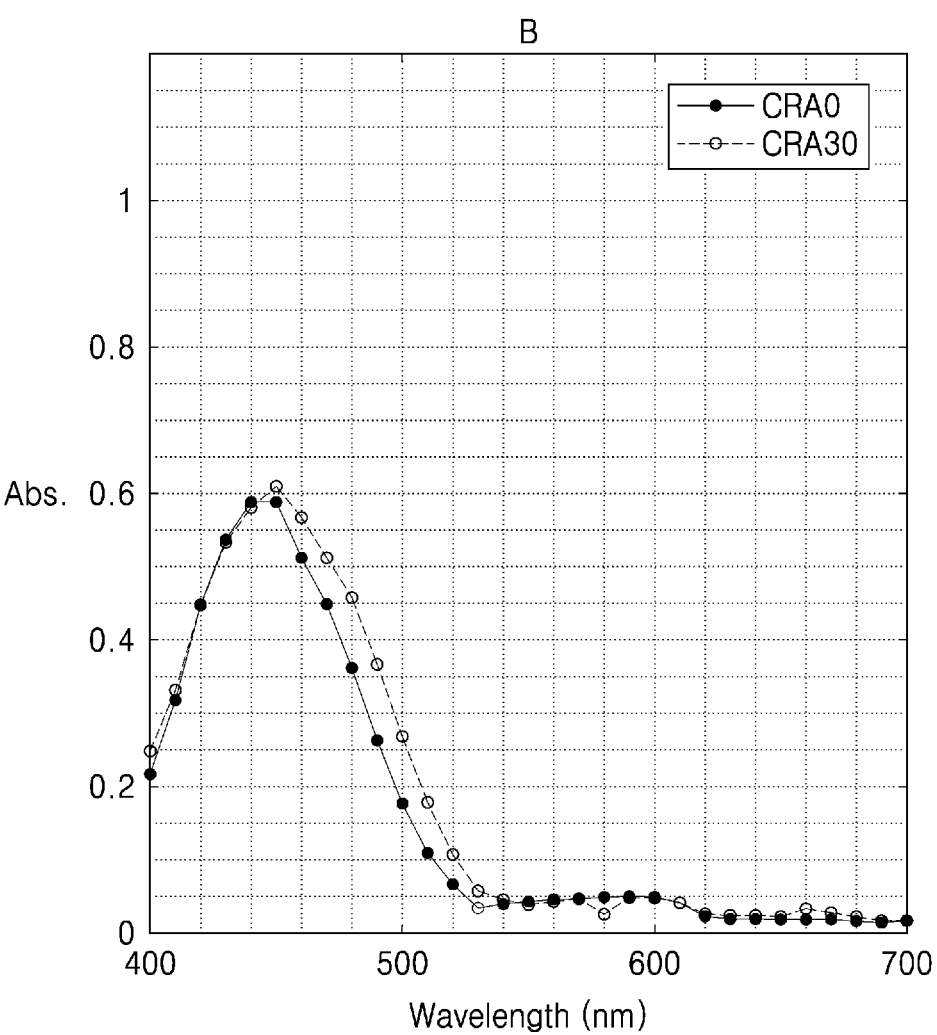
FIGS. 14A to 14C, 15A to 15C and 16A to 16C are graphs showing comparisons of changes in absorption spectra of blue light, green light, and red light according to a width of an isolation film between pixels with respect to different chief ray angles.
Figure 14B:
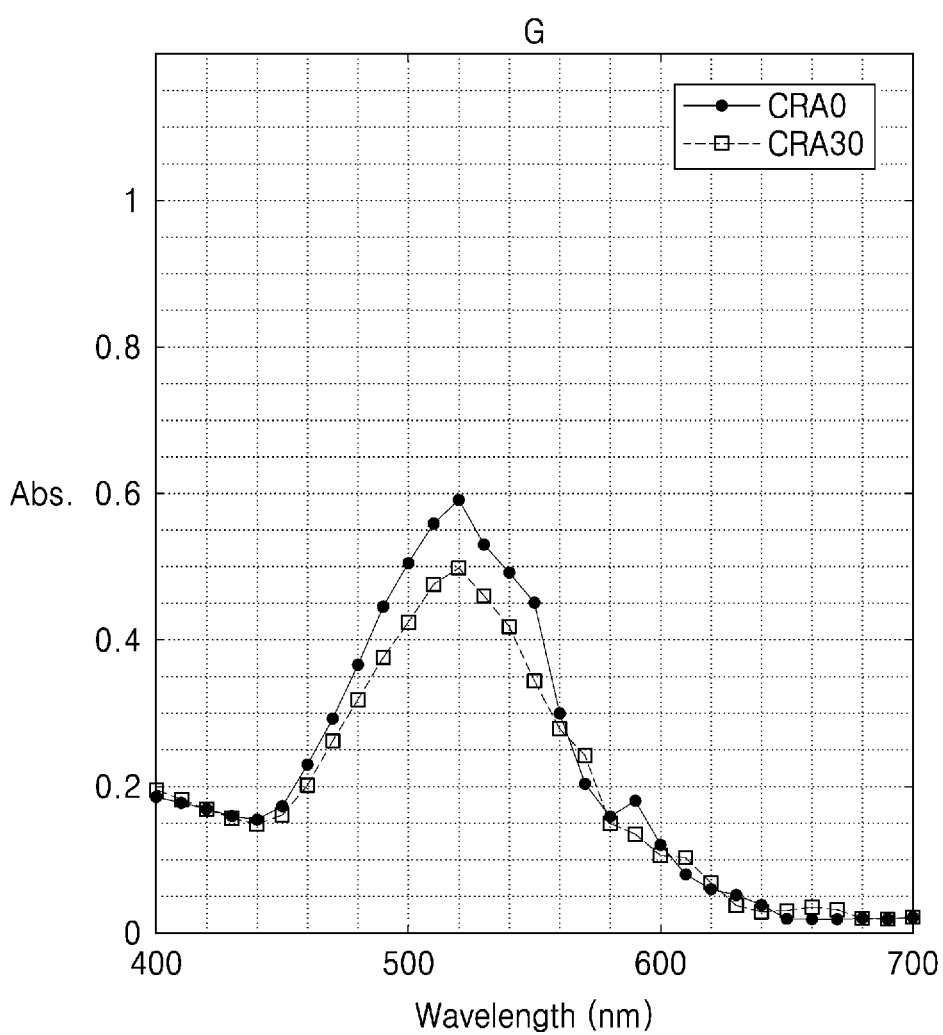
Figure 14C:
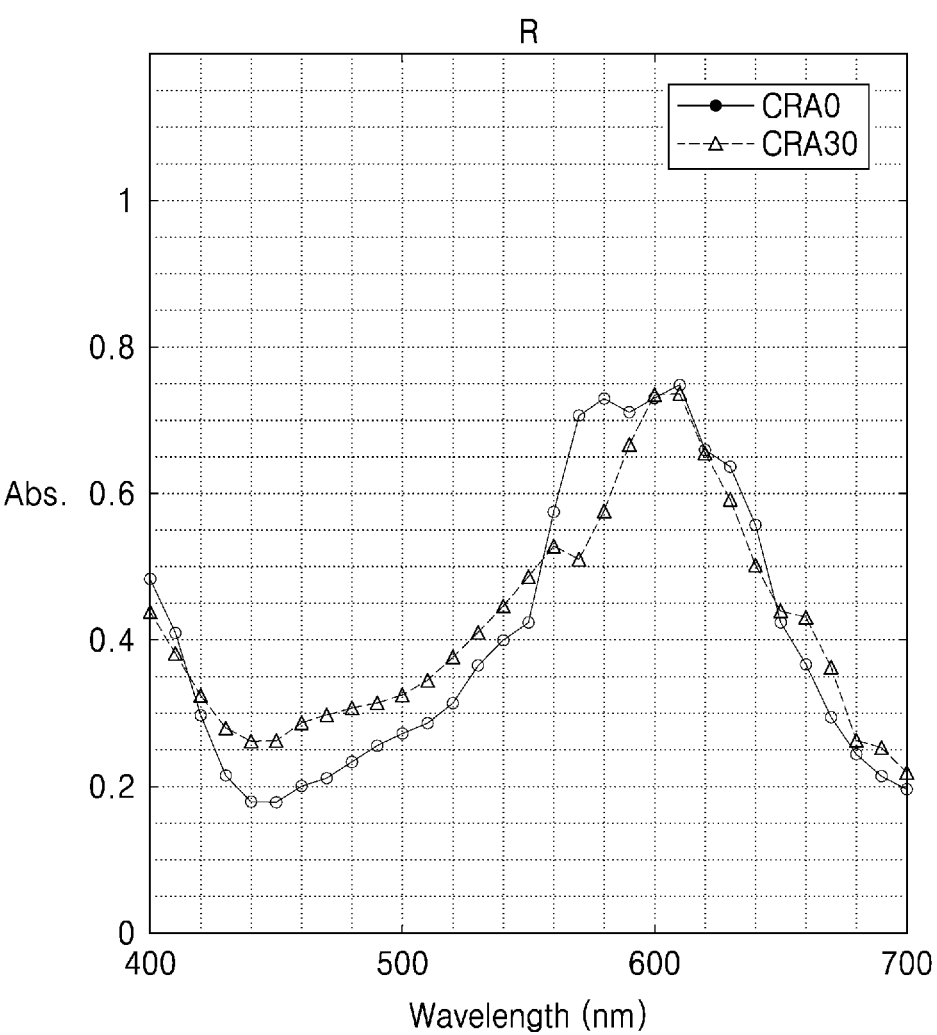
Figure 15A:
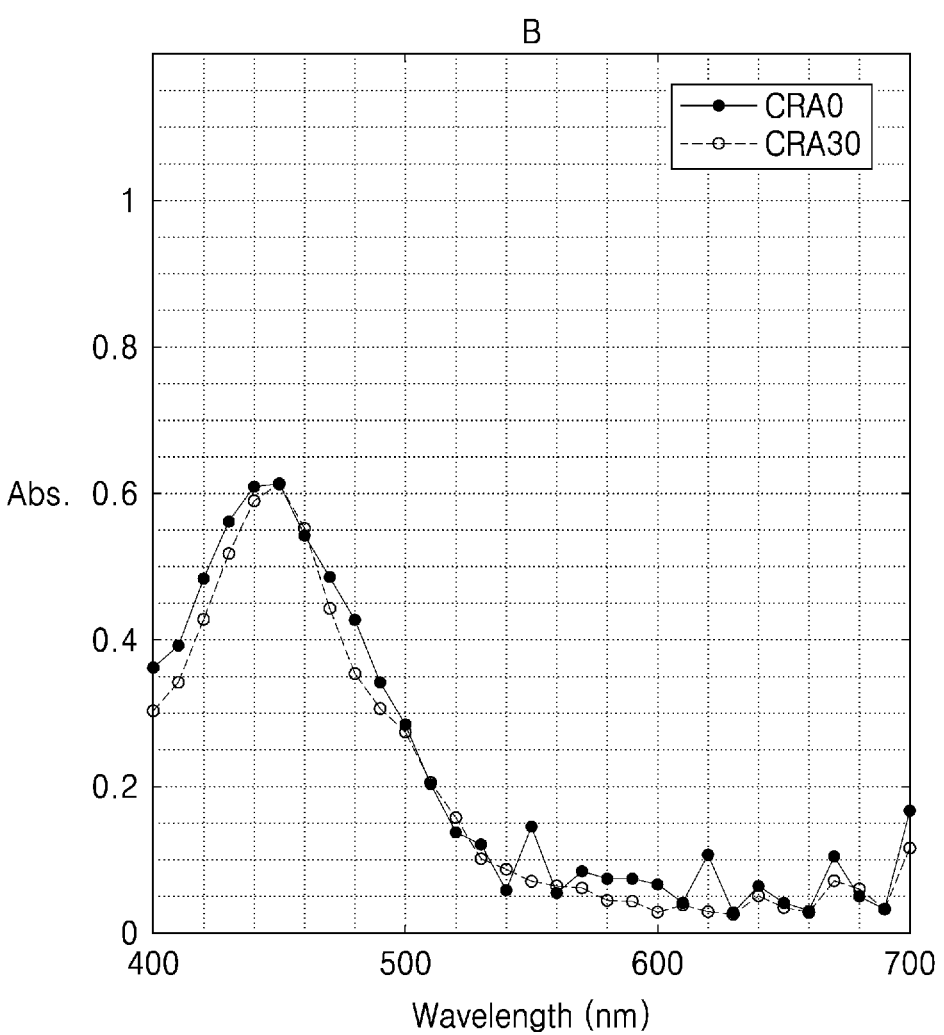
Figure 15B:
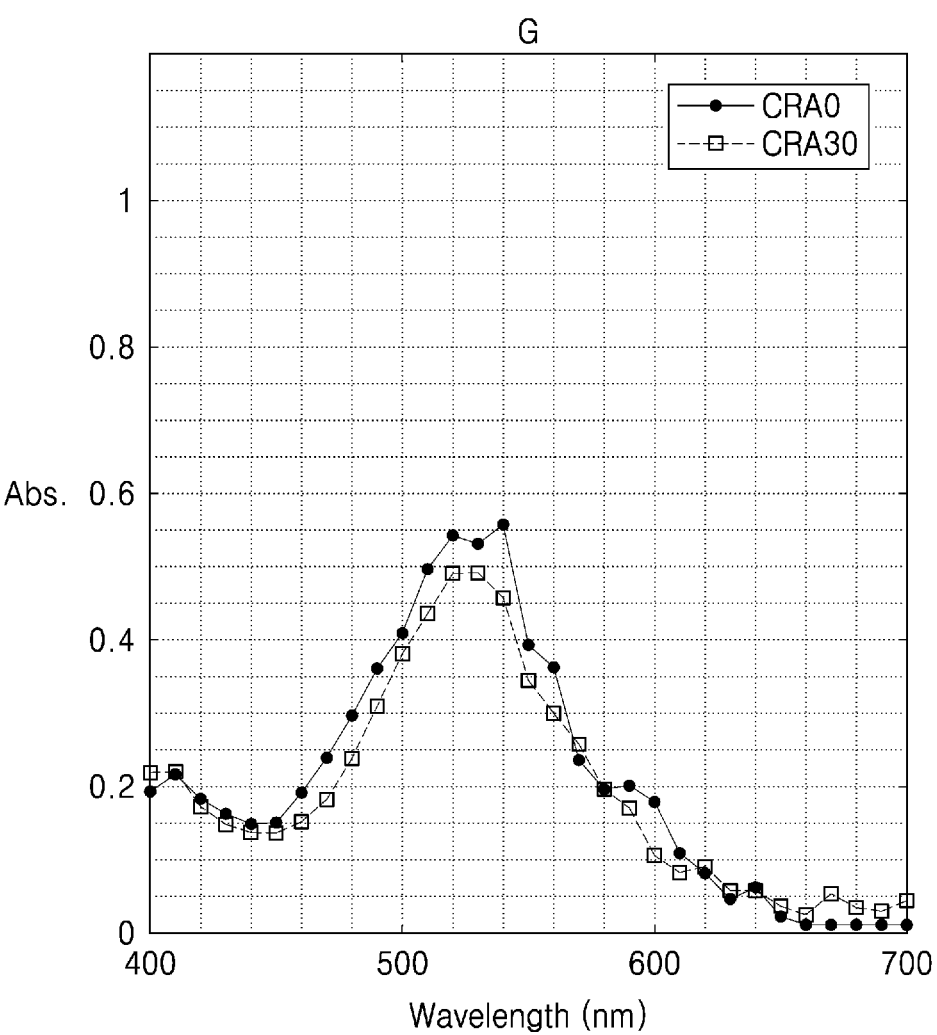
Figure 15C:
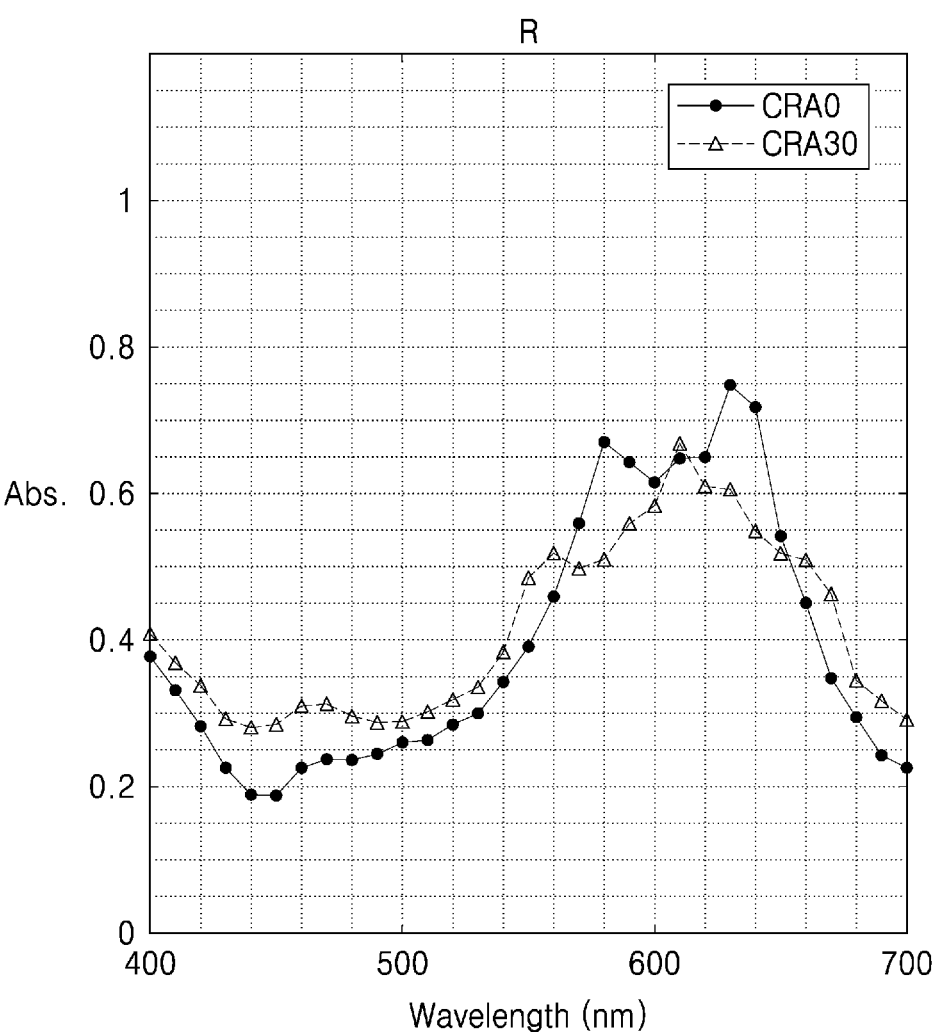
Figure 16A:
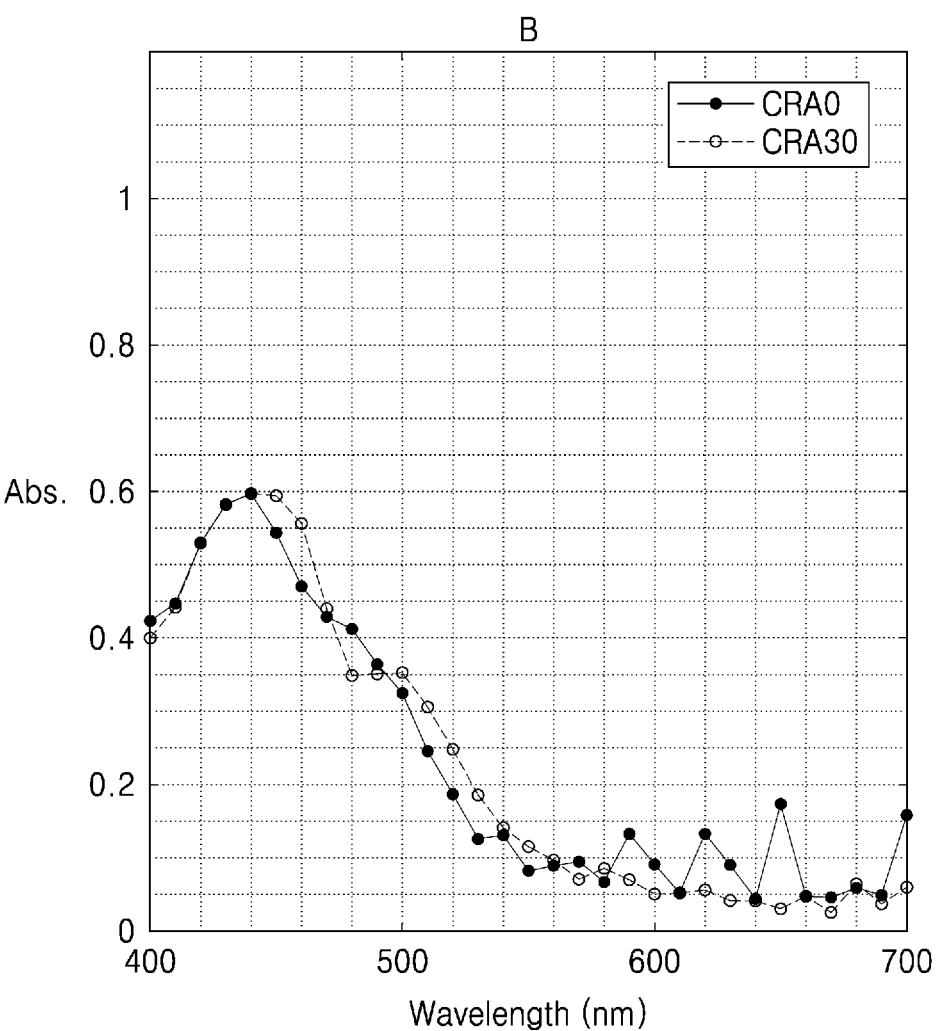
Figure 16B:
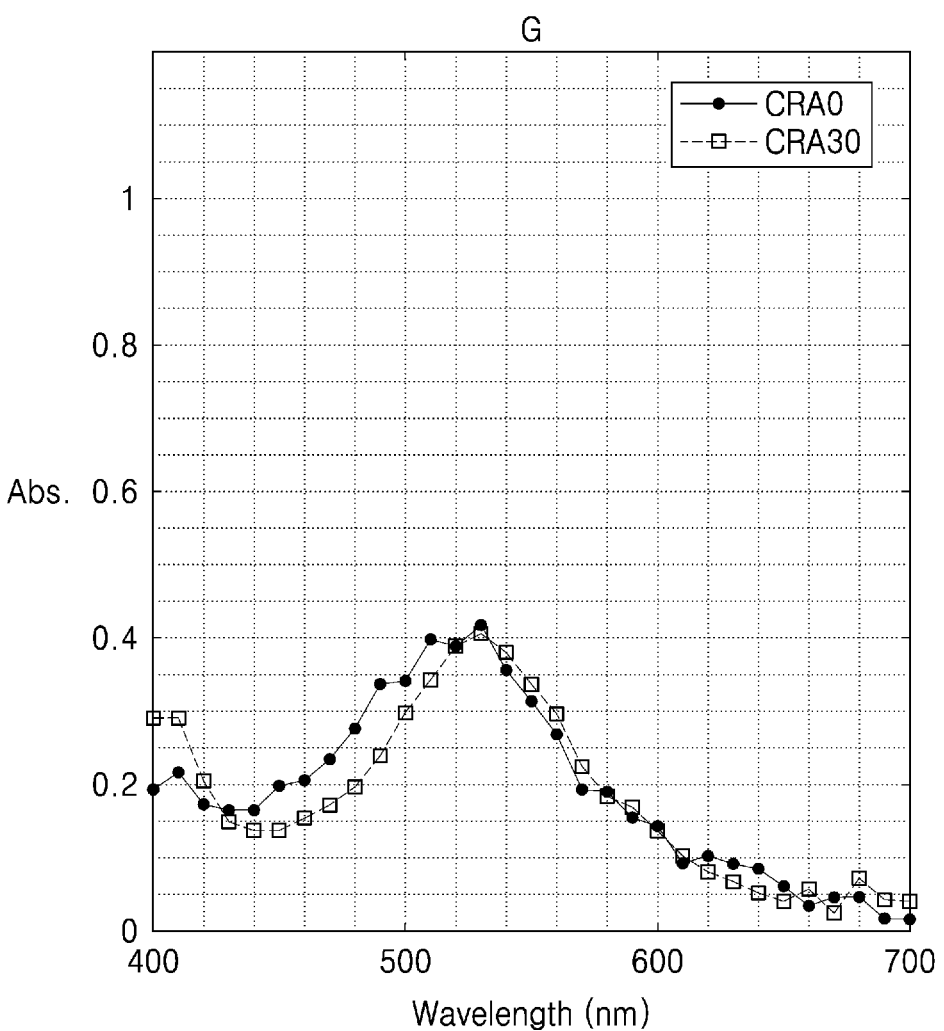
Figure 16C:
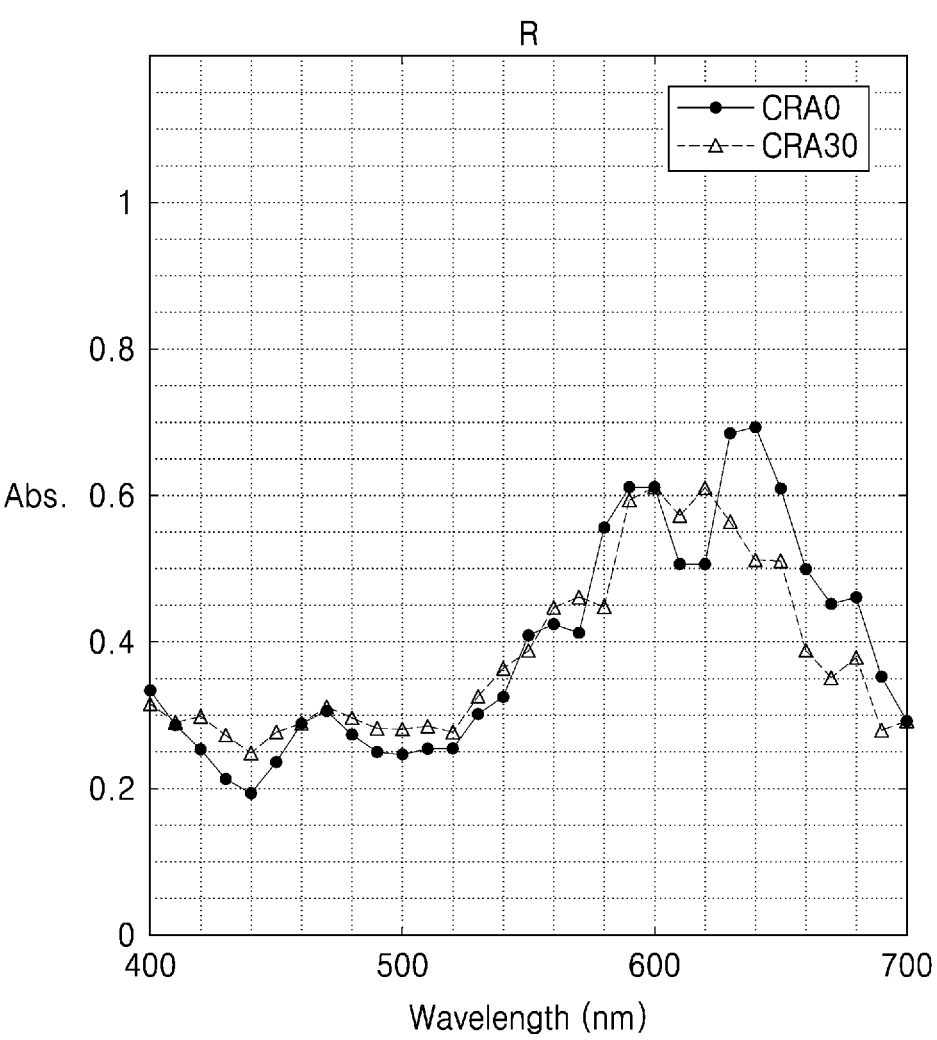

First, FIGS. 14A to 14C show comparisons of the absorption spectra of the third meta-photodiode 300, the second meta-photodiode 200, and the first meta-photodiode 100 with respect to incident light incident at a chief ray angle of 0° and incident light incident at a chief ray angle of 30° when the isolation film 510 is not present or when a width of the isolation film 510 is 0 nm. FIGS. 15A to 15C are graphs for a case when the isolation film 510 is air and the width Wair of the isolation film 510 is 50 nm, and FIGS. 16A to 16C are graphs for a case when the isolation film 510 is air and the width Wair of the isolation film 510 is 150 nm. Referring to FIGS. 14A to 14C, 15A to 15C and 16A to 16C, when the first meta-photodiode 100, the second meta-photodiode 200, and the third meta-photodiode 300 are arranged in an area having a size less than a diffraction limit in one pixel PX and a spacing between adjacent meta-photodiodes is 150 nm or less, it may be seen that even if a low refractive index isolation film 510 is provided between the pixels PX, the change in absorption spectrum according to the chief ray angle is small.

Figure 17:
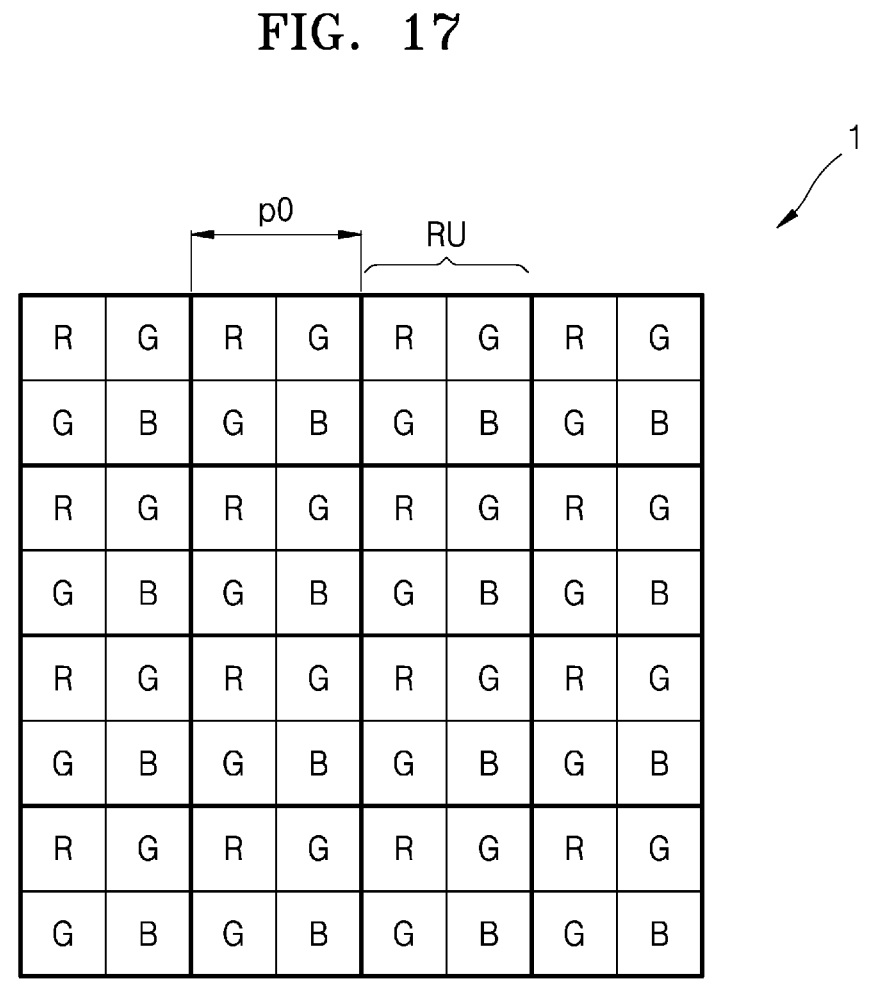
Figure 18:
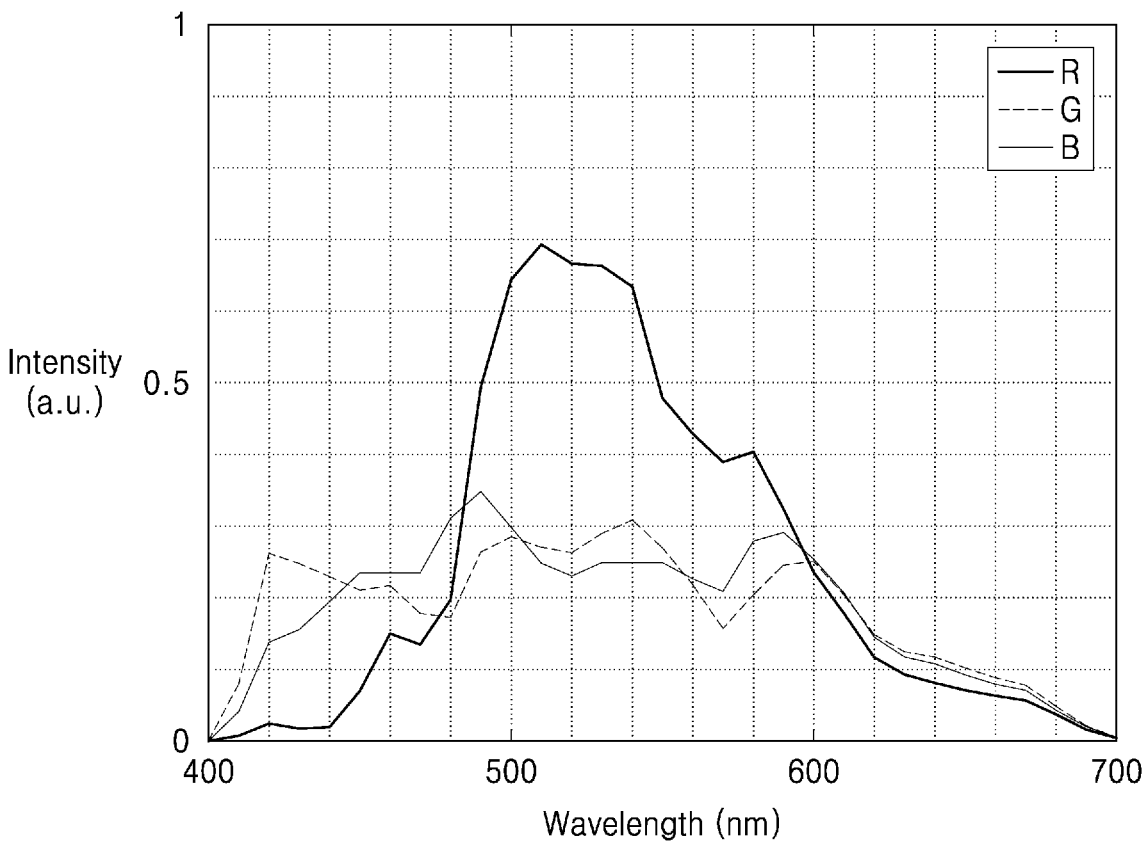
FIG. 18 is a graph showing efficiencies for each color of an image sensor according to a comparative example.

FIG. 17 is a pixel arrangement of an image sensor according to a comparative example, and FIG. 18 is a graph showing efficiencies for each color of the image sensor according to the comparative example.

The image sensor according to the comparative example has a pixel arrangement based on a Bayer pattern. Repeating units RU include two green sub-pixels, one red sub-pixel, and one blue sub-pixel, respectively. A width p0 of the repeating units RU is 0.6 μm, and a color separation structure for separating light of a corresponding color to be incident on each sub-pixel is provided.

Referring to FIG. 18, the sensing efficiency of green light and blue light is low compared to the sensing efficiency of red light, and a bandwidth of the green light and blue light is also greater than that of the red light. Accordingly, the repeating unit RU according to the comparative example has a greater pitch than the pixel PX according to the example embodiment, but the efficiency of separating and sensing color is evaluated to be lower. Furthermore, in the pixel arrangement according to the comparative example, because the repeating unit RU takes charge of colors of incident light by dividing into four sub-regions, resolution degradation may occur even in a signal processing process. For example, R and B signals are obtained at two sub-pixel spacings, G signals are obtained at $\sqrt{2}*$ sub-pixel spacings, and R/G/B signal information in the sub-pixel at a position where the signal is not obtained is obtained by inference with surrounding information. Accordingly, resolution degradation may occur by under-sampling, and artifacts such as aliasing may occur in an image restoration process.

On the other hand, in the image sensor 1000 according to the example embodiment, because each of the pixels PX of a very small pitch may separate and detect color components, signal processing such as sampling is not required, the possibility of generating additional artifacts is low, and thus, high-resolution images may be obtained.

Figure 19:
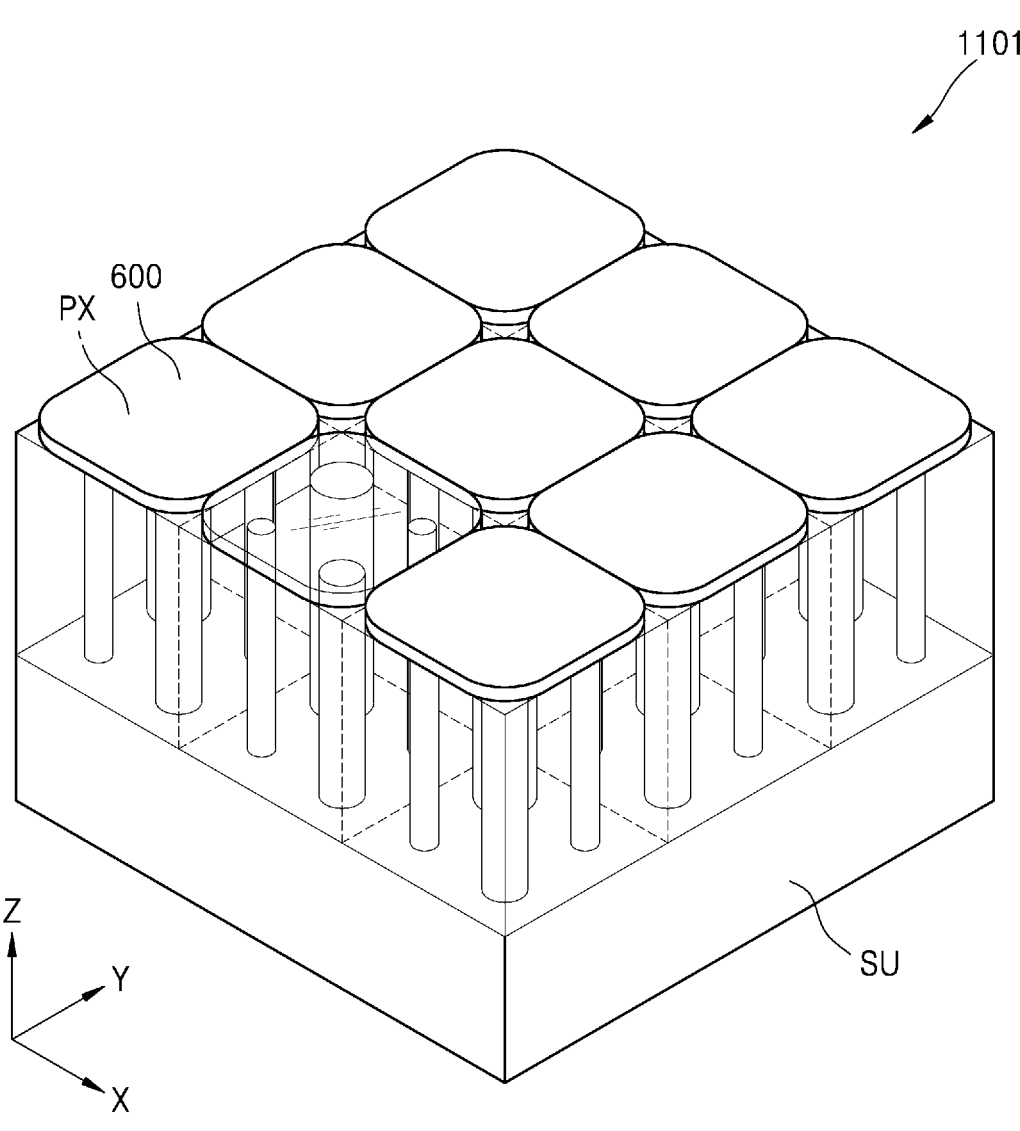
FIG. 19 is a perspective view illustrating a schematic structure of an image sensor according to another example embodiment.

FIG. 19 is a perspective view illustrating a schematic structure of a pixel array 1101 of an image sensor according to another example embodiment. Referring to FIG. 19, the pixel array 1101 is different from the pixel array 1100 described above in that the pixel array 1101 further includes a plurality of lenses 600 facing the plurality of pixels PX one-to-one. By the lenses 600, energy exchange between adjacent pixels may be blocked, and thus, light efficiency may be increased.

In the above descriptions, it is illustrated that one pixel PX includes one first meta-photodiode 100 that absorbs red light, one second meta-photodiode 200 that absorbs green light, and two third meta-photodiodes 300 that absorb blue light, but the disclosure is not limited thereto, and various types and numbers of meta-photodiodes may be utilized in the image sensor according to other example embodiments.

FIGS. 20 to 23 are plan views illustrating arrangements of various types of meta-photodiodes provided in one pixel PX in each of the image sensors according to other example embodiments.

Figure 20:
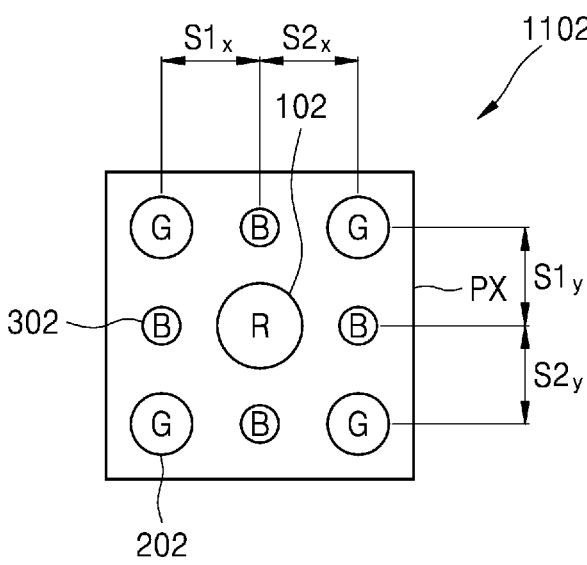
FIGS. 20 to 23 are plan views illustrating an arrangement of various types of meta-photodiodes provided in one pixel in each of image sensors according to other example embodiments.

Referring to FIG. 20, each pixel PX in a pixel array 1102 may include one first meta-photodiode 102 that selectively absorbs red light, a plurality of second meta-photodiodes 202 that selectively absorbs green light, and a plurality of third meta-photodiodes 302 that selectively absorbs blue light. The first meta-photodiode 102 may be provided at the center of the pixel PX, and four second meta-photodiodes 202 and four third meta-photodiodes 302 may be arranged to surround the first meta-photodiode 102 in a rectangular shape. For example, four second meta-photodiodes 202 may be provided at vertices of the rectangle, and four third meta-photodiodes 302 may be provided at the centers of the sides of the rectangle. Unlike the pixel array 1102 shown in FIG. 20, positions of the second meta-photodiode 202 and the third meta-photodiode 302 may be changed with each other.

Even in each pixel PX in the pixel array 1102 shown in FIG. 20, a spacing between two adjacent meta-photodiodes may satisfy the condition described above. For example, spacing S1$x$ between a first second meta-photodiode 202 and a first third meta-photodiode 302 adjacent in the first direction, spacing S2$x$ between a second second meta-photodiode 202 and the first third meta-photodiode 302 adjacent in the first direction, spacing S1$y$ between the second second meta-photodiode 202 and a second third meta-photodiode 302 adjacent in the second direction and spacing S2$y$ between the a third second meta-photodiode 202 and the second third meta-photodiode 302 adjacent in the second direction may be 150 nm or less, or ⅓ or less of a diffraction limit determined by optical properties of an imaging optical system. Alternatively, in one pixel PX, when a spacing between the second meta-photodiode 202 and the third meta-photodiode 302 is S, and a sum of the widths of the second meta-photodiode 202 and the third meta-photodiode 302 is W, Equation, W/2+40 nm>S, may be satisfied.

Figure 21:
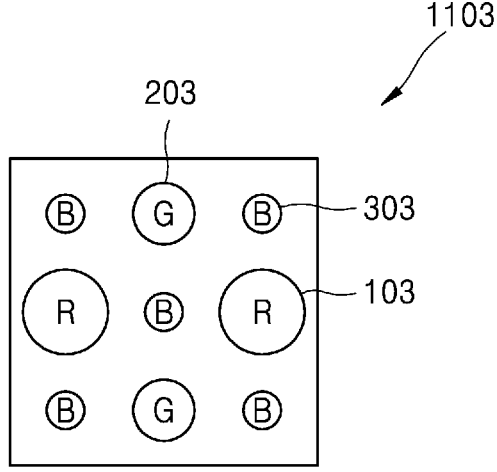

Referring to FIG. 21, each pixel PX in the pixel array 1103 may include two first meta-photodiodes 103 that selectively absorb red light, two second meta-photodiodes 203 that selectively absorb green light, and five third meta-photodiodes 303 that selectively absorb blue light. The two first meta-photodiodes 103 may be provided at the center of two opposite sides of a rectangle, the two second meta-photodiodes 203 may be provided at the centers of the other two opposite sides of the rectangle, and one of the third meta-photodiodes 303 may be provided at the center of the rectangle, and the remaining four third meta-photodiodes 303 may be provided at vertices of the rectangle. Even in this case, the spacing between two adjacent meta-photodiodes among the first meta-photodiode 103, the second meta-photodiode 203, and the third meta-photodiode 303 may satisfy the conditions described above.

In FIGS. 20 and 21, the sum of the numbers of the first meta-photodiodes 102 and 103, the second meta-photodiodes 202 and 203, and the third meta-photodiodes 302 and 303 is nine, and the nine meta-photodiodes may be arranged in the form of a 3×3 array. In addition, the nine meta-photodiodes are arranged in rectangle, for example, a square unit lattice form. However, the example embodiment is not necessarily limited thereto.

Figure 22:
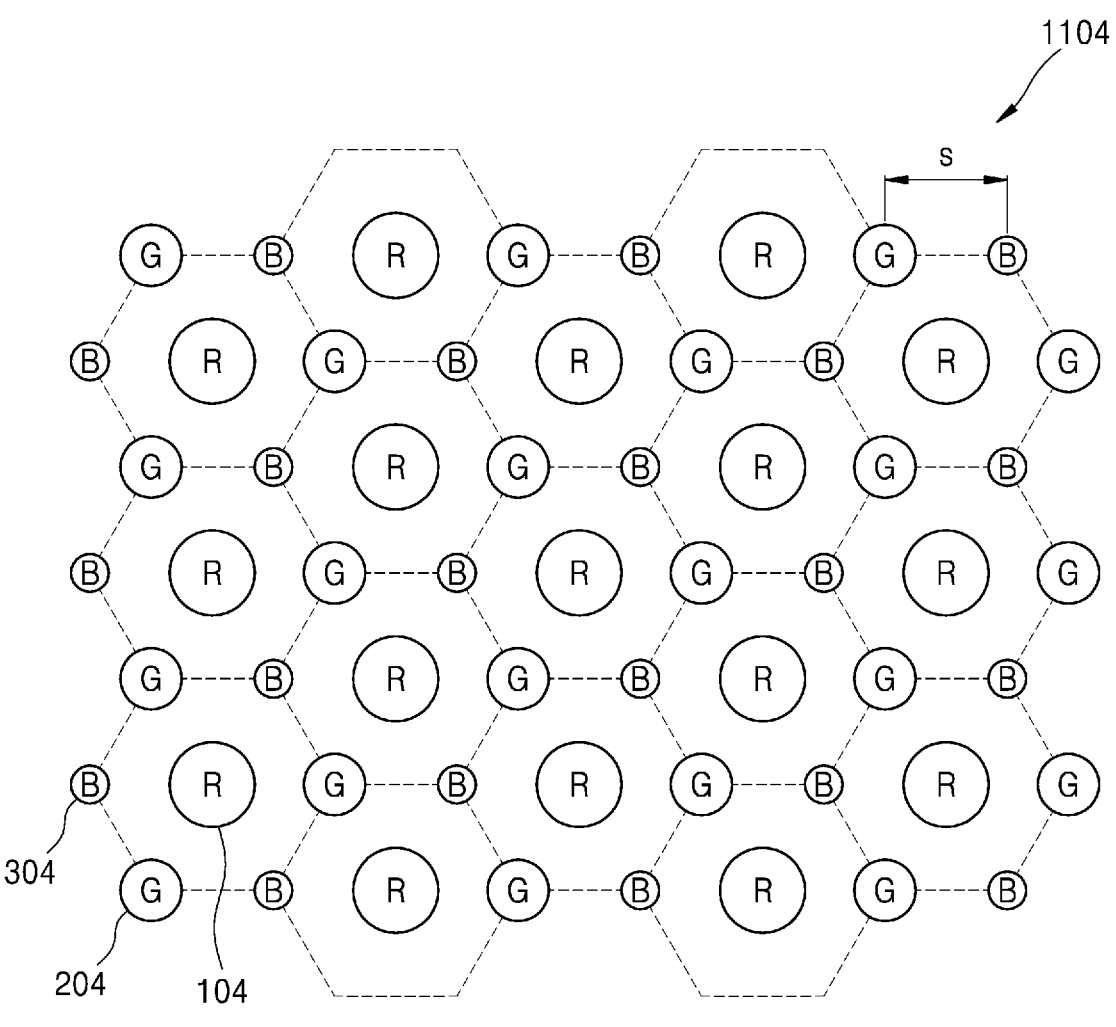

Referring to FIG. 22, in a pixel array 1104, the pixels PX may be arranged in a hexagonal lattice shape. One pixel PX may include one first meta-photodiode 104 that selectively absorbs red light, three second meta-photodiodes 204 that selectively absorb green light, and three third meta-photodiodes 304 that selectively absorb blue light. The first meta-photodiode 104 may be provided at the center of a hexagon, and the second meta-photodiode 204 and the third meta-photodiode 304 may be alternately provided at each vertex of the hexagon. Two pixels PX provided adjacent to each other to share one side may share one second meta-photodiode 204 and one third meta-photodiode 304 provided at both vertices of the shared side. Accordingly, one second meta-photodiode 204 and one third meta-photodiode 304 may be shared by three surrounding pixels PX. Even in this case, the spacing S between the adjacent second meta-photodiode 204 and the third meta-photodiode 304 may satisfy the conditions described above.

Figure 23:
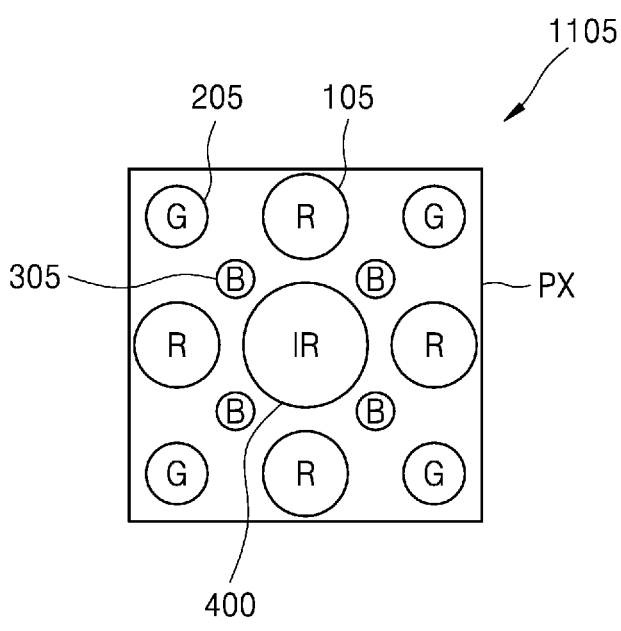

Also, referring to FIG. 23, a pixel PX of a pixel array 1105 may include a first meta-photodiode 105 that selectively absorbs red light, a second meta-photodiode 205 that selectively absorbs green light, and a third meta-photodiode 305 that selectively absorbs blue light, and additionally may further include a fourth meta-photodiode 400 that selectively absorbs light of an infrared wavelength band. One fourth meta-photodiode 400 may be provided in the center, and four first meta-photodiodes 105, four second meta-photodiodes 205, and four third meta-photodiodes 305 may be provided in the form of surrounding the fourth meta-photodiode 400. The fourth meta-photodiode 400 may have the largest diameter, for example, greater than 100 nm. The diameter of the fourth meta-photodiode 400 may be set in a range of about 100 nm to about 200 nm.

In this way, in addition to color information about an object, depth information may further be obtained from an image sensor further including a meta-photodiode that selectively absorbs infrared wavelength bands in addition to a meta-photodiode that selectively absorbs R, G, and B colors. For example, a camera module including the image sensor may further include an infrared light source irradiating infrared light to an object, and infrared information sensed by the image sensor may be utilized to obtain depth information of the object. That is, depth information of the object may be obtained based on infrared information sensed by the image sensor, and color information of the object may be obtained based on sensed visible light information. Also, 3D image information may be obtained by combining color information and depth information.

Figure 24:
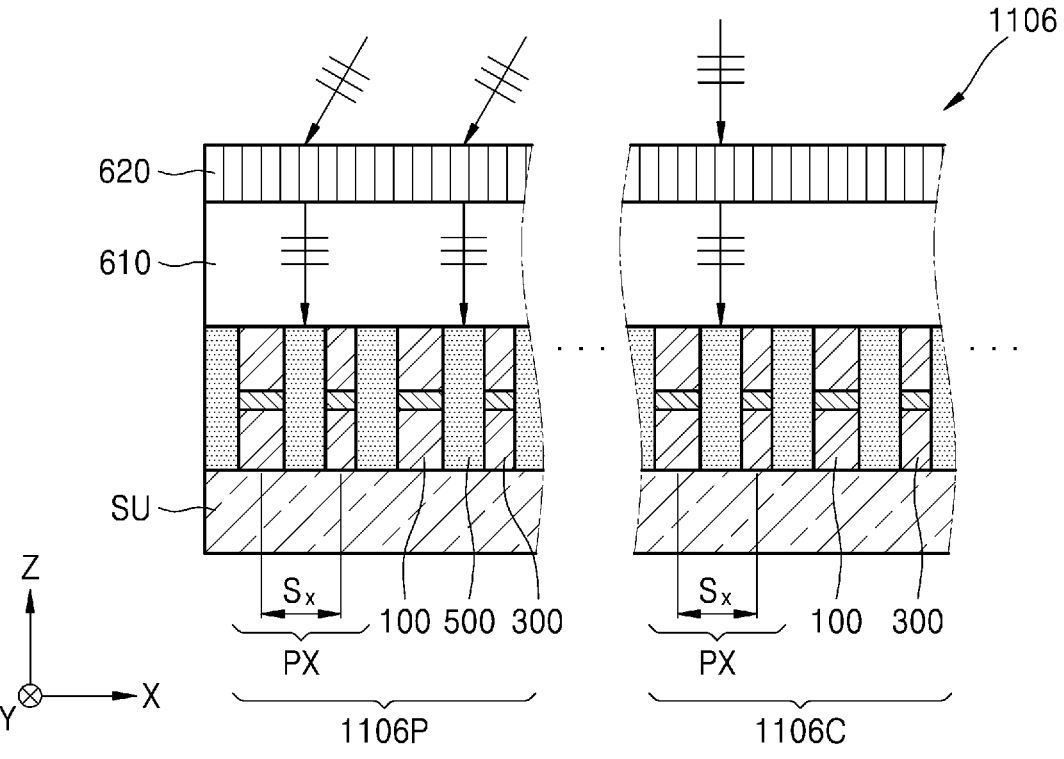
FIG. 24 is a cross-sectional view illustrating a structure of a pixel array of an image sensor according to another example embodiment.

FIG. 24 is a cross-sectional view illustrating a structure of a pixel array 1106 of the image sensor 1000 according to another example embodiment. Referring to FIG. 24, the pixel array 1106 of the image sensor 1000 may further include an optical plate 620 provided to face a light incident surface of the plurality of pixels PX. The optical plate 620 may be configured to change a traveling direction of incident light to be perpendicular to the light incident surface of the plurality of pixels PX. For example, in a central portion 1106C of the pixel array 1106 through which incident light is vertically incident, the optical plate 620 may transmit the incident light as it is without changing the traveling direction of the incident light. On the other hand, in a periphery 1106P of the pixel array 1106, where the incident light obliquely enters, the optical plate 620 may change the traveling direction of the incident light to be perpendicular to the light incident surface of the pixel PX.

Because incident light is perpendicularly incident to the pixel PX of the central portion 1106C and the periphery 1106P of the pixel array 1106 according to the example embodiment, the spacing Sx between two adjacent meta-photodiodes among the first meta-photodiode 100, the second photodiode 200, and the third meta-photodiode 300 may not satisfy the condition described above. In other words, when the optical plate 620 is used, the spacing Sx between two adjacent meta-photodiodes may be, for example, 150 nm or more. In addition, because incident light is vertically incident to the pixel PX of the central portion 1106C and the periphery 1106P of the pixel array 1106, in the central portion 1106C and the periphery 1106P of the pixel array 1106, the arrangement form of the first meta-photodiode 100, the second meta-photodiode 200, and the third meta-photodiode 300 arranged in the plurality of pixels PX may be the same.

The optical plate 620 may be, for example, a digital micro-lens array including a plurality of digital micro-lenses arranged in two dimensions. When the optical plate 620 is a digital micro-lens array, the optical plate 620 may change the traveling direction of incident light vertically while focusing the incident light to each pixel PX. To this end, the optical plate 620 may have a nano-pattern structure capable of focusing incident light. The nano-pattern structure may include a plurality of nano-structures that change a phase of incident light differently according to an incident position of the incident light in each pixel PX. The shape, size (width, height), spacing, arrangement form, and the like of the plurality of nano-structures may be determined so that light, immediately after passing through the optical plate 620, has a preset phase profile. A traveling direction and focal length of the light passing through the optical plate 620 may be determined according to the phase profile.

Figure 25:
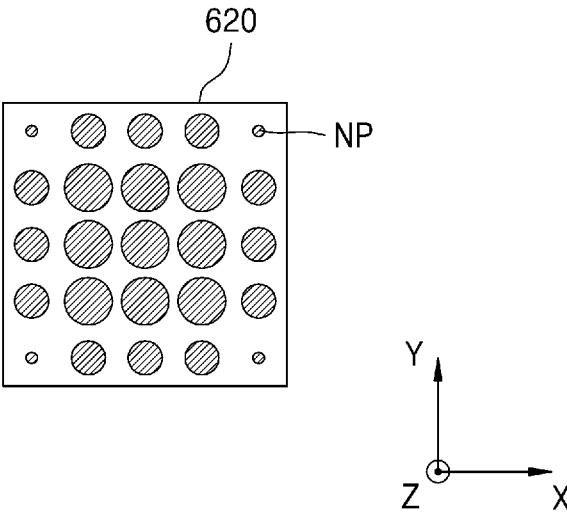
FIG. 25 is a plan view illustrating an example nano-pattern structure of an optical plate located at a central portion of a pixel array.

FIG. 25 is a plan view illustrating a nano-pattern structure of an optical plate 620 positioned in a central portion of a pixel array. Referring to FIG. 25, a nano-structure NP having a nano-pattern structure may be a nano-column having a cross-sectional diameter of a sub-wavelength dimension. When incident light is visible light, the cross-sectional diameter of the nano-structure NP may have a dimension, for example, 400 nm, 300 nm, 200 nm, or less. A height of the nano-structure NP may be in a range from about 500 nm to about 1500 nm, and the height may be greater than the cross-sectional diameter.

The nano-structure NP may include a material having a relatively high refractive index and a relatively low absorption in the visible light band compared to surrounding materials. For example, the nano-structure NP may include c-Si, p-Si, a-Si and a Group III-V compound semiconductor (GaP, GaN, GaAs, etc.), SiC, $TiO_2$, $SiN_3$, ZnS, ZnSe, $Si_3N_4$ and/or combinations thereof. The periphery of the nano-structure NP may be filled with a dielectric material having a relatively low refractive index than that of the nano-structure NP and having a relatively low absorptivity in the visible light band. For example, the periphery of the nano-structure NP may be filled with air, $SiO_2$, $Si_3N_4$, $Al_2O_3$, etc. The nano-structure NP having a refractive index difference from that of the surrounding material may change the phase of light passing through the nano-structure NP. This is due to a phase delay caused by a shape dimension of a sub-wavelength of the nano-structure NP, and the degree of the phase delay is determined by a detailed shape dimension and arrangement shape of the nano-structure NP.

The nano-pattern structure of the optical plate 620 shown in FIG. 25 may be a unit pattern forming one digital micro-lens of the digital micro-lens array. The plurality of digital micro-lenses may correspond to the plurality of pixels PX on a one-to-one basis, and may be provided to face the corresponding pixels PX. Accordingly, the plurality of nano-pattern structures shown in FIG. 25 may be two-dimensionally arranged in the optical plate 620.

Figure 26:
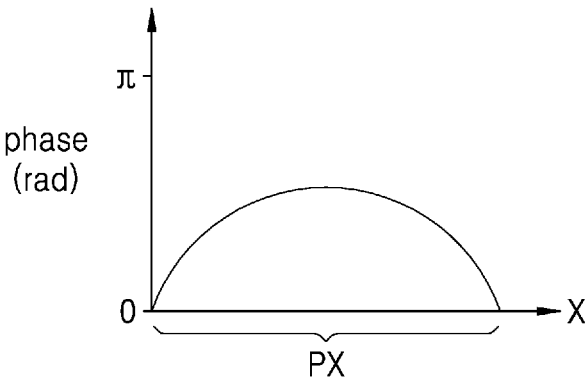
FIG. 26 shows an example phase profile of light after immediately passing through one digital micro-lens of an optical plate at a central portion of a pixel array.

FIG. 26 is a graph showing a phase profile of light immediately after passing through one digital micro-lens of the optical plate 620 in the central portion of the pixel array. Referring to FIG. 26, light immediately after passing through one digital micro-lens of the optical plate 620 may have a phase profile that is the greatest at the center of the pixel PX corresponding to the digital micro-lens and decreases as it moves away from the center of the pixel PX in the first direction (X direction). In the central portion 1106C of the pixel array 1106 where a chief ray angle of incident light is 0 degree, because the optical plate 620 does not need to change the traveling direction of the incident light, the nano-pattern structure of the optical plate 620 may be configured to implement a phase profile in the form of a symmetrical convex curved surface as shown in FIG. 26. In addition, the nano-pattern structure of the optical plate 620 may be configured to implement a phase profile in the form of a symmetrical convex curved surface not only in the first direction (X direction) but also in the second direction (Y direction).

Referring to FIG. 25, to implement the phase profile as above, the plurality of nano-structures NP in each digital micro-lens of the optical plate 620 may be arranged in a symmetrical form in the first direction and the second direction with respect to the center of each digital micro-lens. In particular, the nano-structures NPs arranged in a central region of each digital micro-lens may have the largest diameter so that the largest phase delay occurs in the central region of each digital micro-lens, and the diameter of the nano-structure NP may gradually decrease as it moves away from the central region of each digital micro-lens. For example, the nano-structures NPs provided at four vertices of each digital micro-lens may have the smallest diameter.

Figure 27:
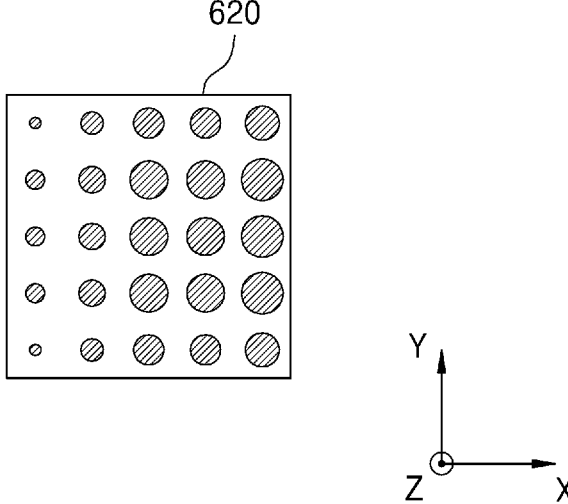
FIG. 27 is a plan view illustrating an example nano-pattern structure of an optical plate located at a periphery of a pixel array.
Figure 28:
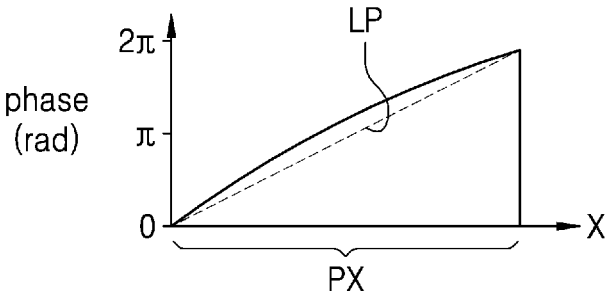
FIG. 28 is a graph showing an example phase profile of light immediately after passing through one digital micro-lens of an optical plate at a periphery of a pixel array.

FIG. 27 is a plan view illustrating a nano-pattern structure of an optical plate 620 positioned at a periphery of a pixel array. FIG. 28 is a graph showing an example phase profile of light immediately after passing through one digital micro-lens of the optical plate 620 at a periphery of a pixel array.

Referring to FIG. 27, nano-structures NPs having the largest diameter are provided away from the central portion of each digital micro-lens. For example, diameters of the nano-structures NPs may gradually increase in the first direction (X direction).

Referring to FIG. 28, light immediately after passing through one digital micro-lens of the optical plate 620 may have a phase profile in which a convex curved phase profile is added to an inclined linear phase profile LP. The convex curved phase profile may serve to focus incident light, and the inclined linear phase profile LP may serve to deflect a traveling direction of incident light. The inclined linear phase profile LP may have a shape in which a phase linearly increases toward a central portion 1106C of the pixel array 1106 or a central portion of the optical plate 620. A slope of the inclined linear phase profile LP may be determined according to a chief ray angle of incident light. The chief ray angle increases as it moves away from the central portion 1106C of the pixel array 1106 or the central portion of the optical plate 620. Accordingly, the slope of the inclined linear phase profile LP may increase as the increase in a distance from the central portion 1106C of the pixel array 1106 or the central portion of the optical plate 620. For example, the slope of the inclined linear phase profile LP may be proportional to a sine value of an angle of incidence of incident light incident to the optical plate 620, that is, a sine value sin(CRA) of the chief ray angle.

According to another example embodiment, the optical plate 620 may include, for example, a digital deflector. The digital deflector may include a plurality of deflector elements corresponding one-to-one to the plurality of pixels PX of the pixel array 1106. The digital deflector may include a plurality of nano-structures NPs as the nano-pattern structures shown in FIGS. 25 and 27. Unlike the digital micro-lens array, the digital deflector may not have a convex phase profile. For example, the digital deflector may include a nano-pattern structure configured to have only a linear phase profile while removing a convex curved phase profile from the phase profile shown in FIGS. 26 and 28.

The pixel array 1106 of the image sensor 1000 may further include a spacer layer 610 provided between the plurality of pixels PX and the optical plate 620. The spacer layer 610 may support the optical plate 620. In addition, when the optical plate 620 is a digital micro-lens array, the spacer layer 610 may provide a gap for securing a focal length of the micro-lens. The spacer layer 610 may include a low-refractive-index material having transparency with respect to incident light, for example, $SiO_2$, $Si_3N_4$, or $Al_2O_3$. However, when a focal length of the micro-lens is sufficiently short or when the optical plate 620 is a digital deflector, the spacer layer 610 may be omitted.

Figure 29:
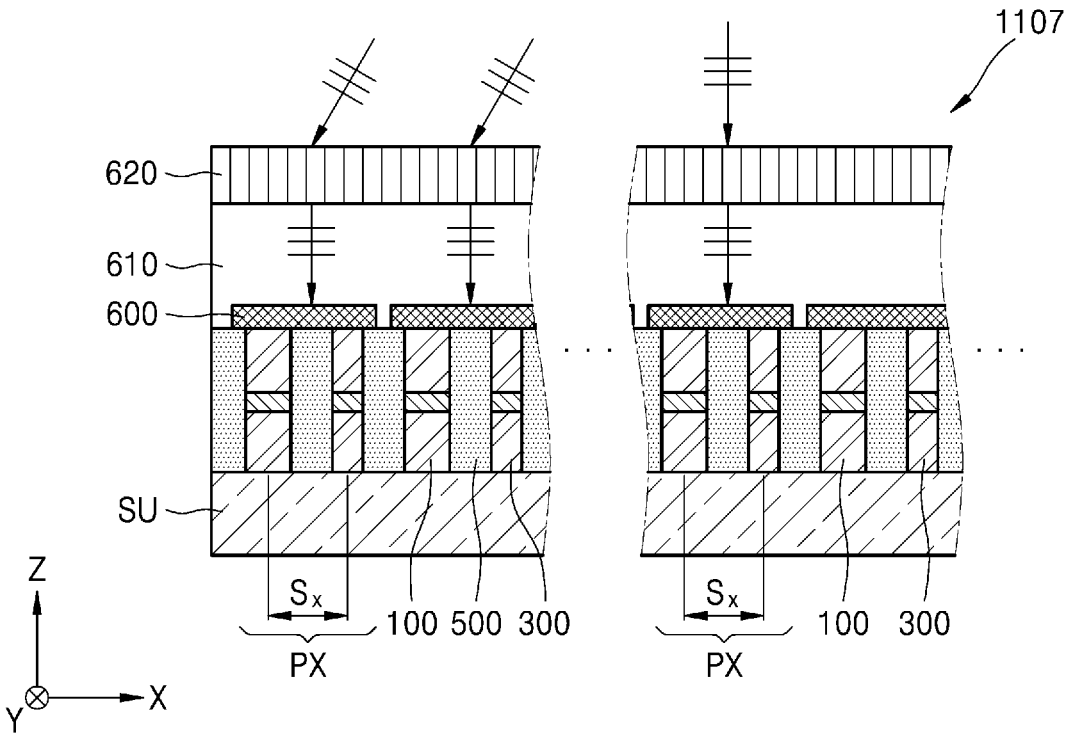
FIG. 29 is a cross-sectional view illustrating a structure of a pixel array of an image sensor according to another example embodiment.

FIG. 29 is a cross-sectional view illustrating a structure of a pixel array 1107 of an image sensor according to another example embodiment. Referring to FIG. 29, the pixel array 1107 is different from the pixel array 1106 in that the pixel array 1107 further includes a plurality of lenses 600 facing the plurality of pixels PX on a one-to-one basis. The plurality of lenses 600 may be provided between the plurality of pixels PX and the optical plate 620, in particular, between the plurality of pixels PX and the spacer layer 610.

Although it has been described that the pixels PX included in the image sensor 1000 described above sense R, G, and B colors, the pixels PX may be modified to include a meta-photodiode capable of distinguishing and detecting light of different wavelength bands. For example, in order to obtain a hyperspectral image in an ultraviolet to infrared wavelength range, a plurality of meta-photodiodes having different cross-sectional diameters, for example 4, 8, or 16 meta-photodiodes, may be included in one pixel. A width of a pixel including the meta-photodiodes may be set to be less than $\lambda_m$, which is the shortest wavelength among the wavelength bands. This is a value corresponding to a diffraction limit when the F-number of the imaging optical system is assumed to be about 1.0. A minimum value of a pixel width may be set to suit the diameter and number of meta-photodiodes included in one pixel.

In addition, the pixels PX included in the image sensor 1000 may be modified to include meta-photodiodes for sensing cyan/magenta/yellow colors, or may be configured to sense other multi-colors.

The image sensor 1000 according to the example embodiment may constitute a camera module together with module lenses having various performances, and may be utilized in various electronic apparatuses.

Figure 30:
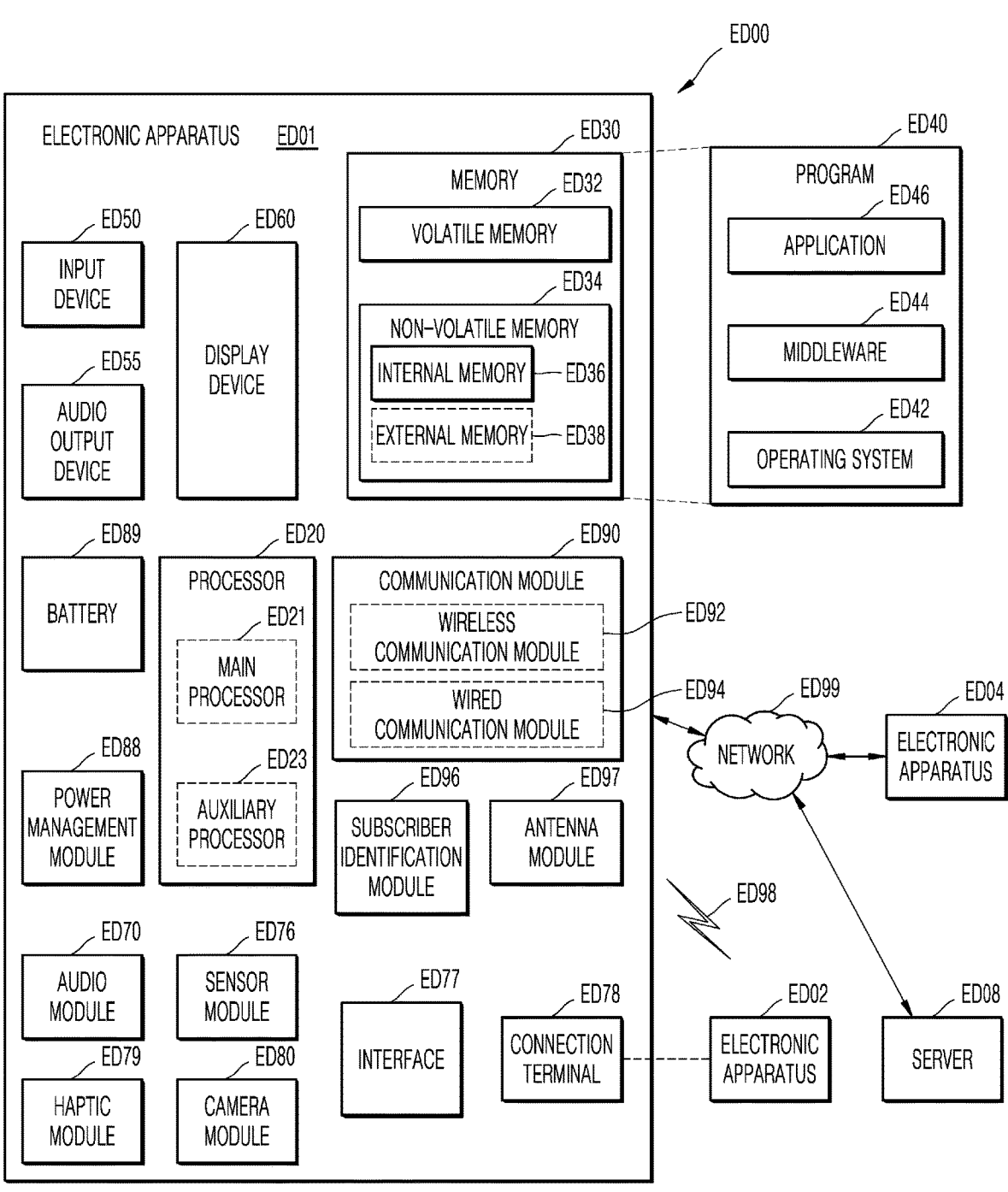
FIG. 30 is a schematic block diagram illustrating an electronic apparatus including an image sensor according to embodiments.

FIG. 30 is a block diagram illustrating an example of an electronic apparatus ED01 including the image sensor 1000. Referring to FIG. 30, in a network environment ED00, the electronic apparatus ED01 may communicate with another electronic apparatus ED02 through a first network ED98 (a short-range wireless communication network, etc.) or may communicate with another electronic apparatus ED04 and/ or a server ED08 through a second network ED99 (a remote wireless communication network, etc.). The electronic apparatus ED01 may communicate with the electronic apparatus ED04 through the server ED08. The electronic apparatus ED01 may include a processor ED20, a memory ED30, an input device ED50, an audio output device ED55, a display device ED60, an audio module ED70, a sensor module ED76, an interface ED77, a haptic module ED79, a camera module ED80, a power management module ED88, a battery ED89, a communication module ED90, a subscriber identification module ED96, and/or an antenna module ED97. In the electronic apparatus ED01, some of these components (e.g., the display device ED60) may be omitted or other components may be added. Some of these components may be implemented as one integrated circuit. For example, the sensor module ED76 (a fingerprint sensor, an iris sensor, an illuminance sensor, etc.) may be implemented by being embedded in the display device ED60 (a display, etc.).

The processor ED20 may control one or a plurality of other components (hardware, software components, etc.) of the electronic apparatus ED01 connected to the processor ED20 by executing software (e.g., a program ED40), and may perform various data processing or operations. As a part of data processing or computations, the processor ED20 may load commands and/or data received from other components (the sensor module ED76 and the communication module ED90, etc.) into a volatile memory ED32 and may process commands and/or data stored in the volatile memory ED32, and the resulting data may be stored in a non-volatile memory ED34. The processor ED20 may include a main processor ED21 (a central processing unit, an application processor, etc.) and an auxiliary processor ED23 (a graphics processing unit, an image signal processor, a sensor hub processor, a communication processor, etc.) that may be operated independently or together with the main processor ED21. The auxiliary processor ED23 may use less power than the main processor ED21 and may perform a specialized function.

The auxiliary processor ED23 is configured to replace the main processor ED21 while the main processor ED21 is in the inactive state (sleep state) or the main processor ED21 while the main processor ED21 is in the active state (the application execution state). Together with the processor ED21, functions and/or states related to some of the components of the electronic device ED01 (the display device ED60, the sensor module ED76, the communication module ED90, etc.) may be controlled. The auxiliary processor ED23 (an image signal processor, a communication processor, etc.) may be implemented as a part of other functionally related components (the camera module ED80, the communication module ED90, etc.).

The memory ED30 may store various pieces of data required by components of the electronic device ED01 (such as the processor ED20 and the sensor module ED76). The data may include, for example, input data and/or output data for software (such as the program ED40) and instructions related thereto. The memory ED30 may include the volatile memory ED32 and/or the nonvolatile memory ED34.

The program ED40 may be stored as software in the memory ED30 and may include an operating system ED42, middleware ED44, and/or an application ED46.

The input device ED50 may receive a command and/or data to be used in a component (such as, the processor ED20) of the electronic apparatus ED01 from the outside of the electronic apparatus ED01 (e.g., a user). The input device ED50 may include a microphone, a mouse, a keyboard, and/or a digital pen (such as, a stylus pen).

The audio output device ED55 may output a sound signal to the outside of the electronic apparatus ED01. The audio output device ED55 may include a speaker and/or a receiver. The speaker may be used for general purposes, such as, multimedia playback or recording playback, and the receiver may be used to receive an incoming call. The receiver may be incorporated as a part of the speaker or may be implemented as an independent separate device.

The display device ED60 may visually provide information to the outside of the electronic apparatus ED01. The display device ED60 may include a control circuit for controlling a display, a hologram device, or a projector, and a corresponding device. The display device ED60 may include touch circuitry configured to sense a touch, and/or sensor circuitry configured to measure the intensity of force generated by the touch (a pressure sensor, etc.).

The audio module ED70 may convert sound into an electric signal or, conversely, convert an electric signal into sound. The audio module ED70 may obtain sound through the input device ED50 or output sound through a speaker and/or headphones of the audio output device ED55 and/or another electronic apparatus (the electronic apparatus ED02, etc.) directly or wirelessly connected to the electronic apparatus ED01.

The sensor module ED76 may detect an operating state (power, temperature, etc.) of the electronic apparatus ED01 or an external environmental state (a user state, etc.), and generate an electrical signal and/or data value corresponding to the sensed state. The sensor module ED76 may include a gesture sensor, a gyro sensor, a barometric pressure sensor, a magnetic sensor, an acceleration sensor, a grip sensor, a proximity sensor, a color sensor, an infrared (IR) sensor, a biometric sensor, a temperature sensor, a humidity sensor, and/or an illuminance sensor.

The interface ED77 may support one or more designated protocols that may be used by the electronic apparatus ED01 to directly or wirelessly connect with another electronic apparatus (the electronic apparatus ED02, etc.). The interface ED77 may include a High Definition Multimedia Interface (HDMI), a Universal Serial Bus (USB) interface, an SD card interface, and/or an audio interface.

A connection terminal ED78 may include a connector through which the electronic apparatus ED01 may be physically connected to another electronic apparatus (the electronic apparatus ED02, etc.). The connection terminal ED78 may include an HDMI connector, a USB connector, an SD card connector, and/or an audio connector (a headphones connector, etc.).

The haptic module ED79 may convert an electrical signal into a mechanical stimulus (vibration, movement, etc.) or an electrical stimulus that may be perceived by the user through tactile or kinesthetic sense. The haptic module ED79 may include a motor, a piezoelectric element, and/or an electrical stimulation device.

The camera module ED80 may capture still images and moving images. The camera module ED80 may include a lens assembly including one or more lenses, the image sensor 1000 of FIG. 1, image signal processors, and/or flashes. The lens assembly included in the camera module ED80 may collect light emitted from an object, an image of which is to be captured.

The power management module ED88 may manage power supplied to the electronic apparatus ED01. The power management module ED88 may be implemented as part of a Power Management Integrated Circuit (PMIC).

The battery ED89 may supply power to components of the electronic apparatus ED01. The battery ED89 may include a non-rechargeable primary cell, a rechargeable secondary cell, and/or a fuel cell.

The communication module ED90 may support the establishment of a direct (wired) communication channel and/or a wireless communication channel between the electronic apparatus ED01 and other electronic apparatuses (the electronic device ED02, the electronic device ED04, the server ED08, etc.) and performance of communications through the established communication channel. The communication module ED90 may include one or a plurality of communication processors that operate independently from the processor ED20 (an application processor, etc.) and support direct communication and/or wireless communication. The communication module ED90 may include a wireless communication module ED92 (a cellular communication module, a short-range wireless communication module, and a Global Navigation Satellite System (GNSS) communication module, etc.) and/or a wired communication module ED94 (a Local Area Network (LAN) communication module, a power line communication module, etc.). Among these communication modules, a corresponding communication module may communicate with other electronic apparatuses through the first network ED98 (a short-range communication network, such as Bluetooth, WiFi Direct, or Infrared Data Association (IrDA)) or the second network ED99 (a telecommunication network, such as a cellular network, the Internet, or a computer network, such as a LAN, a wide area network (WAN), etc.). The various types of communication modules may be integrated into one component (a single chip, etc.) or implemented as a plurality of components (plural chips) separate from each other. The wireless communication module ED92 may identify and authenticate the electronic apparatus ED01 within a communication network, such as the first network ED98 and/or the second network ED99, by using subscriber information (such as, an International Mobile Subscriber Identifier (IMSI)) stored in a subscriber identification module ED96.

The antenna module ED97 may transmit or receive signals and/or power to and from the outside (other electronic devices, etc.). An antenna may include a radiator having a conductive pattern formed on a substrate (a printed circuit board (PCB), etc.). The antenna module ED97 may include one or a plurality of antennas. When a plurality of antennas are included in the antenna module ED97, an antenna suitable for a communication method used in a communication network, such as the first network ED98 and/or the second network ED99, from among the plurality of antennas may be selected by the communication module ED90. Signals and/or power may be transmitted or received between the communication module ED90 and another electronic apparatus through the selected antenna. In addition to the antenna, other components (a radio-frequency integrated circuit (RFIC), etc.) may be included as part of the antenna module ED97.

Some of the components, between peripheral devices, may be connected to each other through communication methods (a bus, General Purpose Input and Output (GPIO), Serial Peripheral Interface (SPI), Mobile Industry Processor Interface (MIPI), etc.) and signals (commands, data, etc.) may be interchangeable.

Commands or data may be transmitted or received between the electronic apparatus ED01 and an external electronic apparatus (the electronic apparatus ED04) through the server ED08 connected to the second network ED99. The electronic apparatuses ED02 and ED04 may be the same type as or different types from the electronic apparatus ED01. All or part of the operations executed by the electronic apparatus ED01 may be executed by one or more of the electronic apparatuses ED02 and ED04 and the server ED08. For example, when the electronic apparatus ED01 needs to perform a function or service, the electronic apparatus ED01 may request one or more other electronic devices to perform part or all of the function or service instead of executing the function or service itself. One or more other electronic apparatuses receiving the request may execute an additional function or service related to the request, and transmit a result of the execution to the electronic apparatus ED01. To this end, cloud computing, distributed computing, and/or client-server computing technologies may be used.

Figure 31:
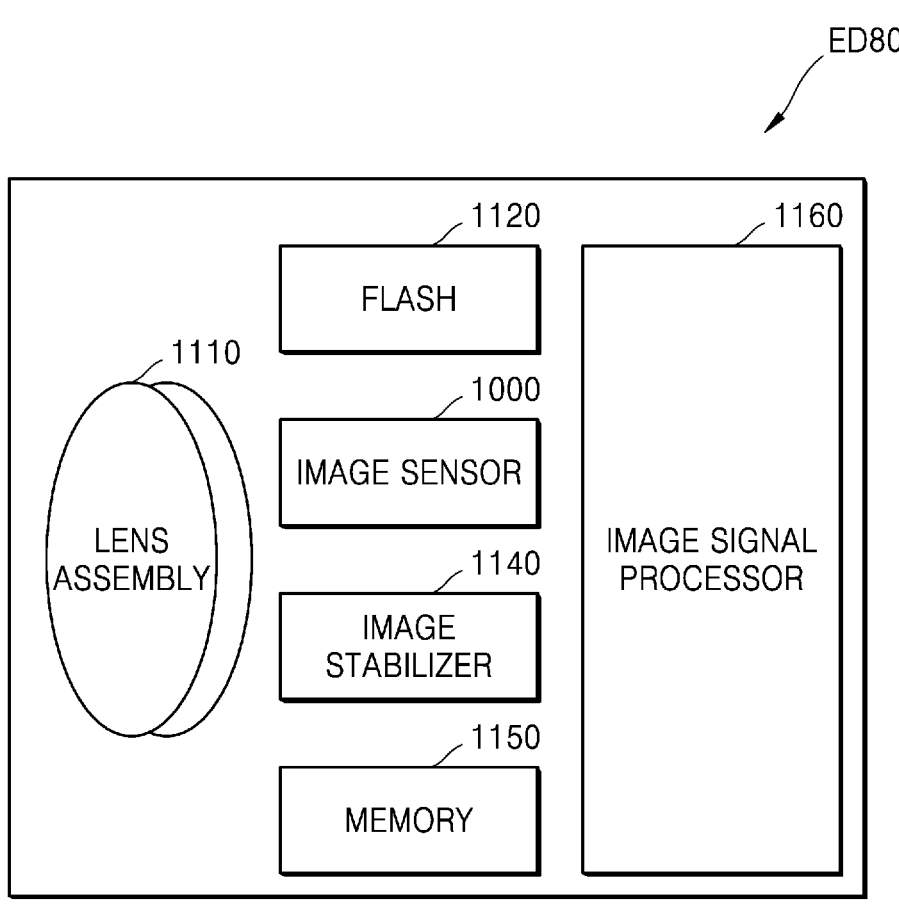
FIG. 31 is a schematic block diagram illustrating a camera module of FIG. 30.

FIG. 31 is a block diagram illustrating a camera module ED80 included in the electronic apparatus ED01 of FIG. 30. Referring to FIG. 31, the camera module ED80 may include a lens assembly 1110, a flash 1120, an image sensor 1000, an image stabilizer 1140, a memory 1150 (a buffer memory, etc.), and/or an image signal processor 1160. The lens assembly 1110 may collect light emitted from an object to be imaged. The camera module ED80 may include a plurality of lens assemblies 1110, and, in this case, the camera module ED80 may be a dual camera, a 360° camera, or a spherical camera. Some of the plurality of lens assemblies 1110 may have the same lens property (an angle of view, a focal length, an auto focus, an F-number, an optical zoom, etc.) or may have different lens properties. The lens assembly 1110 may include a wide-angle lens or a telephoto lens.

The flash 1120 may emit light to be used to enhance light emitted or reflected from an object. The flash 1120 may emit visible light or infrared light. The flash 1120 may include one or a plurality of light-emitting diodes (a Red-Green-Blue (RGB) LED, a White LED, an Infrared LED, an Ultraviolet LED, etc.), and/or a Xenon Lamp. The image sensor 1000 may be the image sensor 1000 described with reference to FIG. 1, and may obtain an image corresponding to the object by converting light emitted or reflected from the object and transmitted through the lens assembly 1110 into an electrical signal.

The image sensor 1000 may be the image sensor 1000 of FIG. 1 described above, and the type and arrangement of meta-photodiodes included in the pixel PX provided in the image sensor 1000 may have the form described with reference to FIGS. 5 and 20 to 23, or a combination or modified form thereof. A plurality of pixels included in the image sensor 1000 may have a small pixel width, for example, a width less than the diffraction limit. The width p of each of the plurality of pixels provided in the image sensor 1000 may satisfy the following condition:

$$p < \lambda \cdot F.$$

Here, F is the F-number of the lens assembly 1110, and λ is the center wavelength of a blue wavelength band.

The image stabilizer 1140 may move one or a plurality of lenses or the image sensor 1000 included in the lens assembly 1110 in a specific direction in response to the movement of the camera module ED80 or the electronic apparatus ED01 including the camera module ED80, or may compensate for a negative influence due to movement by controlling (adjustment of read-out timing, etc.) operating characteristics of the image sensor 1000. The image stabilizer 1140 may detect the movement of the camera module ED80 or the electronic apparatus ED01 by using a gyro sensor (not shown) or an acceleration sensor (not shown) provided inside or outside the camera module ED80. The image stabilizer 1140 may be optically implemented.

The memory 1150 may store some or all of image data acquired by the image sensor 1000 for the next image processing operation. For example, when a plurality of images are acquired at a high speed, the acquired original data (Bayer-Patterned data, high-resolution data, etc.) is stored in the memory 1150, and only a low-resolution image is displayed, and then, may be used to transmit the original data of the selected (user selection, etc.) image to the image signal processor 1160. The memory 1150 may be integrated into the memory ED30 of the electronic apparatus ED01 or may be configured as a separate memory operated independently.

The image signal processor 1160 may perform image processing on images acquired by the image sensor 1000 or image data stored in the memory 1150. Image processing may include depth map generation, three dimensional (3D) modeling, panorama generation, feature point extraction, image synthesis, and/or image compensation (noise reduction, resolution adjustment, brightness adjustment, blurring, sharpening, softening, etc.). The image signal processor 1160 may perform control (exposure time control, readout timing control, etc.) on components (the image sensor 1000, etc.) included in the camera module ED80. The image processed by the image signal processor 1160 may be stored back in the memory 1150 for further processing or provided to external components of the camera module ED80 (the memory ED30, the display device ED60, the electronic apparatus ED02, the electronic apparatus ED04, the server ED08, etc.). The image signal processor 1160 may be integrated into the processor ED20 or configured as a separate processor operated independently from the processor ED20. When the image signal processor 1160 is configured as a processor separate from the processor ED20, an image processed by the image signal processor 1160 may be displayed on the display device ED60 after additional image processing by the processor ED20.

As illustrated in FIG. 13, when the image sensor 1000 includes a meta-photodiode that selectively absorbs infrared wavelength band and meta-photodiodes that selectively absorb red light, green light, and blue light separately, the image signal processor 1160 may process an infrared signal and a visible light signal acquired from the image sensor 1000 together. The image signal processor 1160 may obtain a depth image of an object by processing an infrared signal, obtain a color image of the object from a visible light signal, and provide a three-dimensional image of the object by combining the depth image with the color image. The image signal processor 1160 may also compute information on temperature or moisture of an object from the infrared signal, and provide a temperature distribution and moisture distribution image that is combined with a two-dimensional image (color image) of the object.

The electronic apparatus ED01 may further include one or more additional camera modules each having different properties or functions. Such a camera module may also include a configuration similar to that of the camera module ED80 of FIG. 31, and an image sensor provided therein may include one or a plurality of sensors selected from image sensors having different properties, such as a Charged Coupled Device (CCD) sensor and/or a Complementary Metal Oxide Semiconductor (CMOS) sensor, an RGB sensor, a black and white (BW) sensor, an IR sensor, or a UV sensor. In this case, one of the plurality of camera modules ED80 may be a wide-angle camera and the other may be a telephoto camera. Similarly, one of the plurality of camera modules ED80 may be a front camera and the other may be a rear camera.

Figure 32:
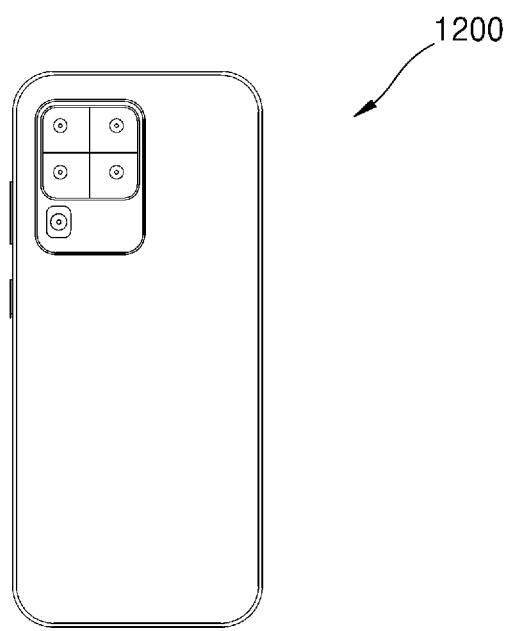
FIGS. 32 to 41 are views illustrating various examples of electronic apparatuses to which image sensors according to embodiments are applied.
Figure 33:
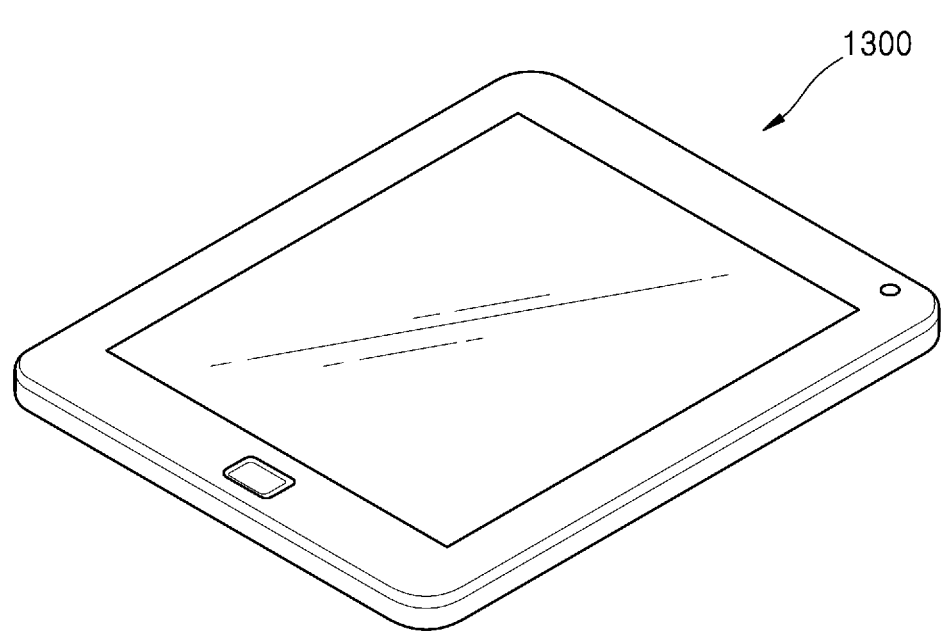
Figure 34:
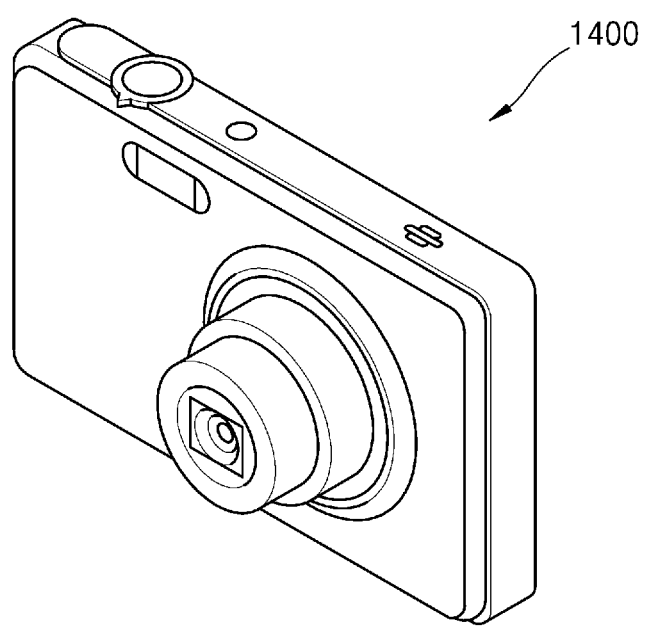
Figure 35:
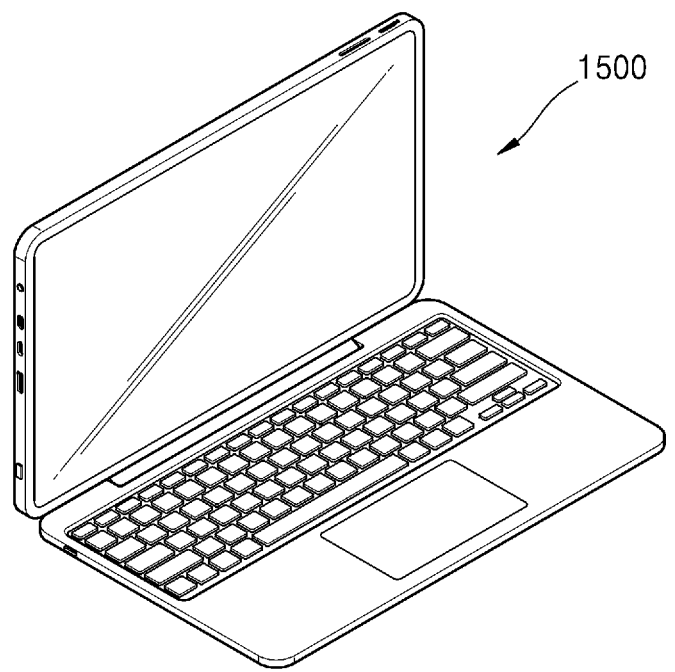
Figure 36:
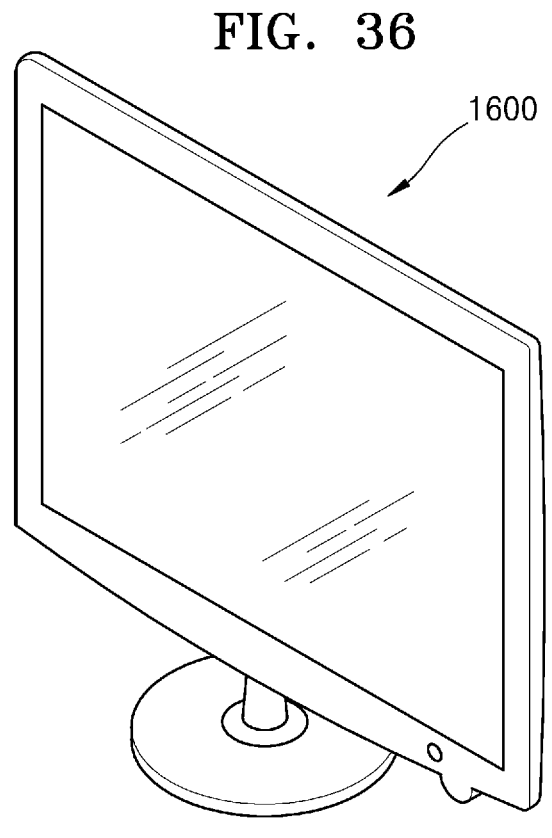

The image sensor 1000 according to embodiments may be applied to a mobile phone or smart phone 1200 shown in FIG. 32, a tablet or smart tablet 1300 shown in FIG. 33, and a digital camera or camcorder 1400 shown in FIG. 34, a notebook computer 1500 shown in FIG. 35, or a television or smart television 1600 shown in FIG. 36. For example, the smart phone 1200 or the smart tablet 1300 may include a plurality of high-resolution cameras each having a high-resolution image sensor mounted thereon. The high-resolution cameras may be used to extract depth information of objects in an image, adjust out-focusing of an image, or automatically identify objects in an image.

Figure 37:
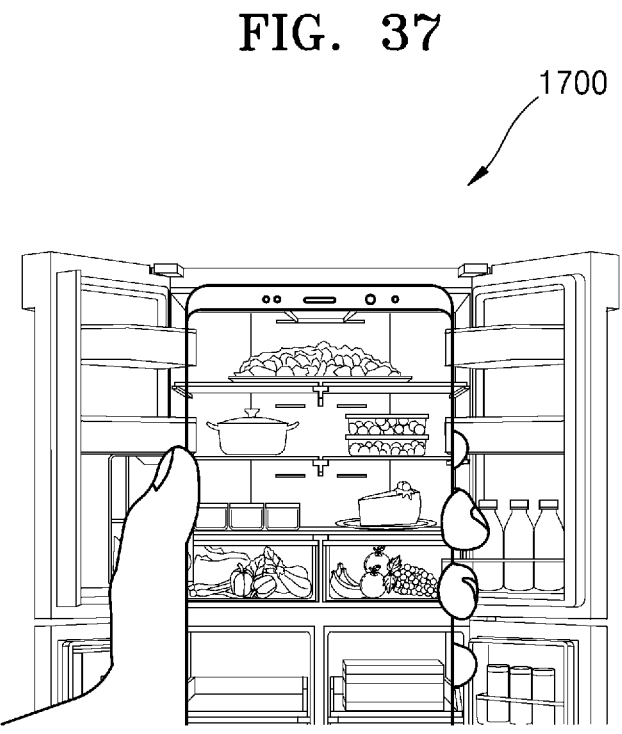
Figure 38:
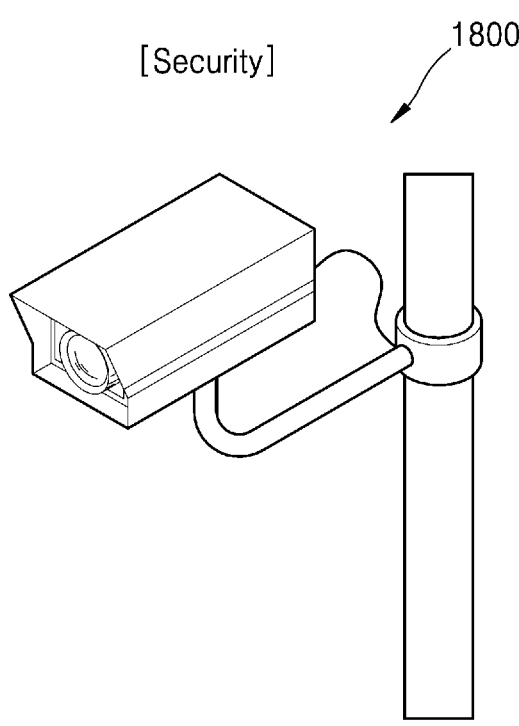
Figure 39:
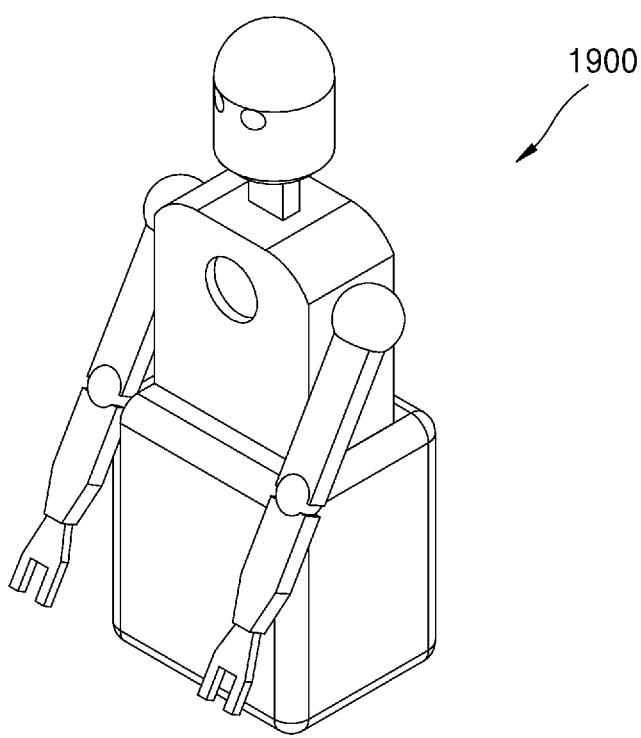
Figure 40:
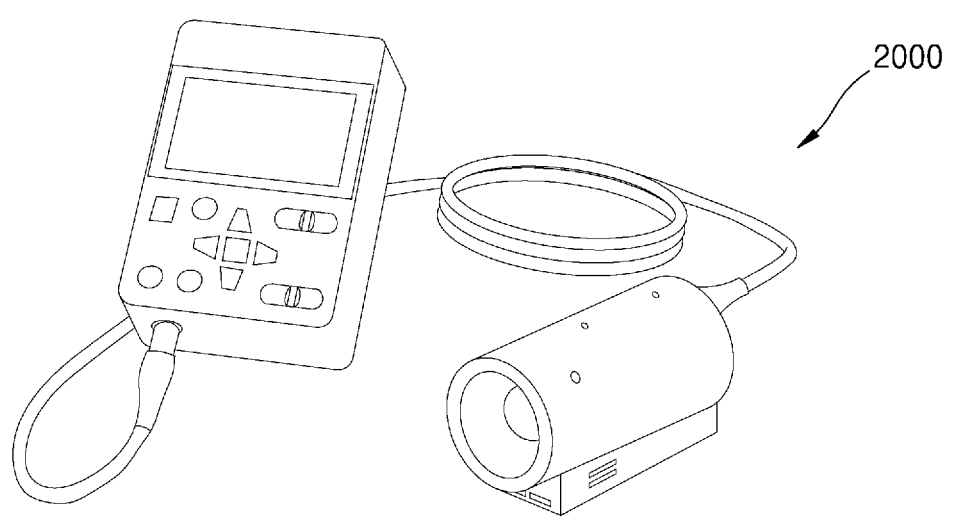

In addition, the image sensor 1000 may be applied to a smart refrigerator 1700 shown in FIG. 37, a security camera 1800 shown in FIG. 38, a robot 1900 shown in FIG. 39, a medical camera 2000 shown in FIG. 40, etc. For example, the smart refrigerator 1700 may automatically recognize food in the refrigerator by using an image sensor, and inform the user of the presence of specific food, the type of food put in or take out, and the like through a smartphone. The security camera 1800 may provide an ultra-high-resolution image and may recognize an object or a person in an image even in a dark environment by using high sensitivity. The robot 1900 may provide a high-resolution image by being input at a disaster or industrial site that cannot be directly accessed by a person. The medical camera 2000 may provide a high-resolution image for diagnosis or surgery, and may dynamically adjust a field of view.

Figure 41:
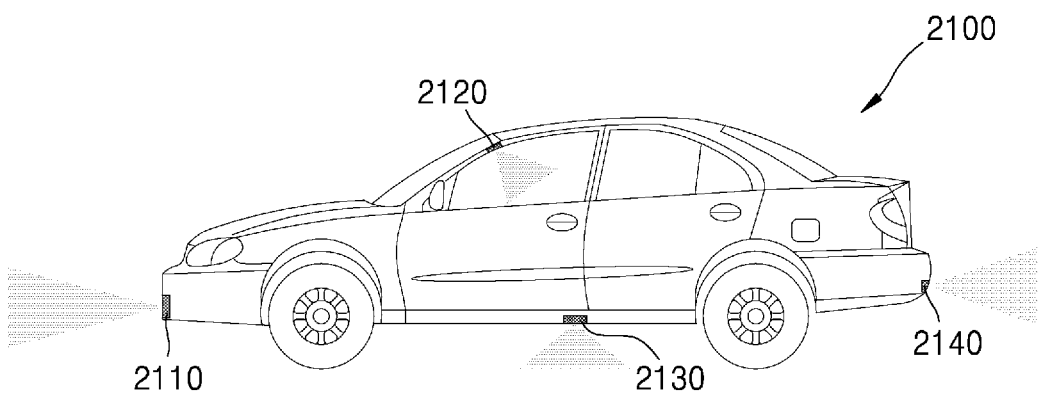

Also, the image sensor 1000 may be applied to a vehicle 2100 as shown in FIG. 41. The vehicle 2100 may include a plurality of vehicle cameras 2110, 2120, 2130, and 2140 provided in various positions. Each of the vehicle cameras 2110, 2120, 2130, and 2140 may include an image sensor according to an example embodiment. The vehicle 2100 may provide a driver with various information about an interior or surroundings of the vehicle 2100 by using the plurality of vehicle cameras 2110, 2120, 2130, and 2140, and provide information necessary for autonomous driving by automatically recognizing objects or people in the image.

In the image sensor according to the example embodiment, each pixel having a small width less than a diffraction limit may detect light of a plurality of types of wavelength bands separately. The image sensor according to the example embodiment may exhibit high luminous efficiency by not using components such as a color separation element and a color filter.

Pixels of the image sensor according to the example embodiment may have substantially uniform absorption spectra in a central portion and a periphery at which a chief ray angers of incident light are different. Accordingly, in the image sensor according to the example embodiment, the pixel structure may be the same in the central portion and the periphery.

The image sensor according to the example embodiment may be used as a multi-color sensor, a multi-wavelength sensor, a hyper-spectral sensor, and may be used as a 3D image sensor that provides both a color image and a depth image. The image sensor according to the example embodiment may be may be applied as a high resolution camera module to be utilized in various electronic devices.

It should be understood that embodiments described herein should be considered in a descriptive sense only and not for purposes of limitation. Descriptions of features or aspects within each embodiment should typically be considered as available for other similar features or aspects in other example embodiments. While one or more embodiments have been described with reference to the figures, it will be understood by those of ordinary skill in the art that various changes in form and details may be made therein without departing from the spirit and scope as defined by the following claims.

What is claimed is:

1. An image sensor comprising:
a pixel array comprising a plurality of two-dimensionally arranged pixels,
wherein each of the plurality of pixels comprises:
a first meta-photodiode configured to selectively absorb light of a first wavelength band;
a second meta-photodiode configured to selectively absorb light of a second wavelength band different from the first wavelength band; and
a third meta-photodiode configured to selectively absorb light of a third wavelength band different from the first wavelength band and second wavelength band,
wherein, the first meta-photodiode, the second meta-photodiode, and the third meta-photodiode are arranged in an area having dimensions equal to or less than 450 nm×450 nm,
wherein the first meta-photodiode, the second meta-photodiode, and the third meta-photodiode of one or more first pixels in a central portion of the pixel array, among the plurality of pixels, are arranged in a same form as the first meta-photodiode, the second meta-photodiode, and the third meta-photodiode of one or more second pixels in a periphery of the pixel array, among the plurality of pixels, wherein each of the plurality of pixels comprises one of the first meta-photodiode, one of the second meta-photodiode, and two of the third meta-photodiode, and wherein the first meta-photodiode and the second meta-photodiode are provided in a first diagonal direction, and the two third meta-photodiodes are provided in a second diagonal direction crossing the first diagonal direction.

2. The image sensor of claim 1, wherein, in the central portion and the periphery of the pixel array, the first meta-photodiodes arranged in the plurality of pixels have a same first structure, the second meta-photodiodes have a same second structure, and the third meta-photodiodes have a same third structure.

3. The image sensor of claim 1, wherein, in each of the plurality of pixels, the following condition is satisfied: $W/2+40$ nm$>S$, where $S$ is a spacing between two meta-photodiodes adjacent in a first direction among the first meta-photodiode, the second meta-photodiode, and the third meta-photodiode and $W$ is a sum of widths of the two adjacent meta-photodiodes.

4. The image sensor of claim 1, wherein, in each of the plurality of pixels, a spacing between two meta-photodiodes adjacent in a first direction among the first meta-photodiode, the second meta-photodiode, and the third meta-photodiode is about 150 nm or less, and is at least ½ of a sum of widths of the two adjacent meta-photodiodes.

5. The image sensor of claim 1, wherein, in each of the plurality of pixels, a spacing between two meta-photodiodes adjacent in a first direction among the first meta-photodiode, the second meta-photodiode, and the third meta-photodiode is one third or less of 450 nm×450 nm.

6. The image sensor of claim 1, wherein the central portion of the pixel array is a first area in which incident light is vertically incident, and the periphery of the pixel array surrounds the central portion and is a second area in which incident light is obliquely incident.

7. The image sensor of claim 1, wherein the pixel array further comprises:

an optical plate arranged to face light incident surfaces of the plurality of pixels and configured to change a traveling direction of incident light to be perpendicular to the light incident surfaces of the plurality of pixels.

8. The image sensor of claim 7, wherein the optical plate comprises a digital micro-lens array or a digital deflector.

9. The image sensor of claim 1, wherein each of the first meta-photodiode, the second meta-photodiode, and the third meta-photodiode has a rod-shape comprising:

a first conductivity-type semiconductor layer, an intrinsic semiconductor layer stacked on the first conductivity-type semiconductor layer, and a second conductivity-type semiconductor layer stacked on the intrinsic semiconductor layer, and wherein the first meta-photodiode, the second meta-photodiode, and the third meta-photodiode respectively have a first width, a second width, and a third width different from each other in a direction perpendicular to a stacking direction.

10. The image sensor of claim 9, wherein the first width, the second width, and the third width are about 50 nm to about 200 nm.

11. The image sensor of claim 9, wherein the first wavelength band is greater than the second wavelength band, and the second wavelength band is greater than the third wavelength band, and wherein the first width is greater than the second width, and the second width is greater than the third width.

12. The image sensor of claim 9, wherein heights of the first meta-photodiode, the second meta-photodiode, and the third meta-photodiode in the stacking direction are about 500 nm or more.

13. The image sensor of claim 12, wherein the heights of the first meta-photodiode, the second meta-photodiode, and the third meta-photodiode in the stacking direction are same as each other.

14. The image sensor of claim 1, wherein each of the plurality of pixels has a width of about 250 nm to about 450 nm.

15. The image sensor of claim 1, wherein a sum of the number of the first meta-photodiodes, the second meta-photodiodes, and the third meta-photodiodes arranged in each of the plurality of pixels is nine, and the nine meta-photodiodes are arranged in the form of a 3×3 array.

16. The image sensor of claim 1, wherein each of the plurality of pixels comprises one of the first meta-photodiodes, a plurality of the second meta-photodiodes, and a plurality of the third meta-photodiodes, and wherein the first meta-photodiode is located at the center of each of the plurality of pixels.

17. An image sensor comprising:

a pixel array comprising a plurality of two-dimensionally arranged pixels, wherein each of the plurality of pixels comprises:

a first meta-photodiode configured to selectively absorb light of a first wavelength band;

a second meta-photodiode configured to selectively absorb light in a second wavelength band different from the first wavelength band; and a third meta-photodiode configured to selectively absorb light of a third wavelength band different from the first wavelength band and second wavelength band, wherein the first meta-photodiode, the second meta-photodiode, and the third meta-photodiode are arranged in an area having dimensions less than 450 nm×450 nm, and wherein a spacing between two meta-photodiodes adjacent in a first direction among the first meta-photodiode, the second meta-photodiode, and the third meta-photodiode is about 150 nm or less, and the spacing is at least ½ of a sum of widths of the two adjacent meta-photodiodes, wherein each of the plurality of pixels comprises one of the first meta-photodiode, one of the second meta-photodiode, and two of the third meta-photodiode, and wherein the first meta-photodiode and the second meta-photodiode are provided in a first diagonal direction, and the two third meta-photodiodes are provided in a second diagonal direction crossing the first diagonal direction.

18. The image sensor of claim 17, wherein, in an entire area of the pixel array, the first meta-photodiode, the second meta-photodiode, and the third meta-photodiode arranged in each of the plurality of pixels have a same arrangement form.

31

32

19. An electronic apparatus comprising:

a lens assembly configured to form an optical image of an object;

an image sensor configured to convert the optical image formed by the lens assembly into an electrical signal; and a processor configured to process a signal generated by the image sensor, wherein the image sensor comprises a pixel array including a plurality of two-dimensionally arranged pixels, and each of the plurality of pixels comprises:

a first meta-photodiode configured to selectively absorb light of a first wavelength band;

a second meta-photodiode configured to selectively absorb light of a second wavelength band different from the first wavelength band; and a third meta-photodiode configured to selectively absorb light of a third wavelength band different from the first wavelength band and second wavelength band, wherein, the first meta-photodiode, the second meta-photodiode, and the third meta-photodiode are arranged in an area having dimensions less than 450 nm×450 nm, and wherein the first meta-photodiode, the second meta-photodiode, and the third meta-photodiode of one or more first pixels in a central portion of the pixel array, among the plurality of pixels, are arranged in a same form as the first meta-photodiode, the second meta-photodiode, and the third meta-photodiode of one or more of second pixels in a periphery of the pixel array, among the plurality of pixels, wherein each of the plurality of pixels comprises one of the first meta-photodiode, one of the second meta-photodiode, and two of the third meta-photodiode, and wherein the first meta-photodiode and the second meta-photodiode are provided in a first diagonal direction, and the two third meta-photodiodes are provided in a second diagonal direction crossing the first diagonal direction.

* * * * *